US012656894B2

(12) United States Patent
Kim et al.

(10) Patent No.: US 12,656,894 B2
(45) Date of Patent: Jun. 16, 2026

(54) TOUCH SENSOR AND DISPLAY DEVICE INCLUDING THE SAME

(71) Applicant: SAMSUNG DISPLAY CO., LTD., Yongin-si (KR)

(72) Inventors: Do Ik Kim, Yongin-si (KR); Ga Young Kim, Yongin-si (KR); Sang Hyun Lim, Yongin-si (KR); Young Sik Kim, Yongin-si (KR); Sang Chul Lee, Yongin-si (KR); Hwan Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/893,943

(22) Filed: Sep. 23, 2024

(65) Prior Publication Data

US 2025/0013327 A1    Jan. 9, 2025

Related U.S. Application Data

(63) Continuation of application No. 18/209,444, filed on Jun. 13, 2023, now Pat. No. 12,099,671, which is a
(Continued)

(30) Foreign Application Priority Data

May 15, 2017    (KR) ........................ 10-2017-0060138

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0418* (2013.01); *G06F 3/04182* (2019.05);
(Continued)

(58) Field of Classification Search
None
See application file for complete search history.

(56) References Cited

U.S. PATENT DOCUMENTS 5,159,159 A    10/1992 Asher
5,861,875 A     1/1999 Gerpheide
(Continued)

FOREIGN PATENT DOCUMENTS

CN    102043512      5/2011
CN    102736291 A   10/2012
(Continued)

OTHER PUBLICATIONS

Search Report dated May 8, 2018, in Korean Patent Application No. 10-2017-0060138.
(Continued)

*Primary Examiner* — Dorothy Harris
(74) *Attorney, Agent, or Firm* — Womble Bond Dickinson (US) LLP

(57) ABSTRACT

A touch sensor includes a first electrode, a second electrode, and a sensing channel. The first electrode includes first electrode cells arranged in a first direction, a first connection portion connecting the first electrode cells in the first direction and a first opening disposed in at least one of the first electrode cells. The second electrode includes an electrode portion disposed in the first opening. The electrode portion is disposed on a same layer as the first electrode cells and separated from the first electrode. The sensing channel includes a first terminal and a second terminal. The first terminal is connected to the first electrode. The second terminal is connected to the second electrode.

17 Claims, 32 Drawing Sheets

Related U.S. Application Data continuation of application No. 17/532,918, filed on Nov. 22, 2021, now Pat. No. 11,714,503, which is a continuation of application No. 16/945,086, filed on Jul. 31, 2020, now Pat. No. 11,182,005, which is a continuation of application No. 15/978,355, filed on May 14, 2018, now Pat. No. 10,732,746.

(51) Int. Cl.
*G06F 3/047* (2006.01)
*G09G 3/3208* (2016.01)
*H10K 59/40* (2023.01)

(52) U.S. Cl.
CPC ............ *G06F 3/044* (2013.01); *G06F 3/0443* (2019.05); *G06F 3/0446* (2019.05); *G06F 3/047* (2013.01); *G09G 3/3208* (2013.01); *H10K 59/40* (2023.02); *G06F 2203/04111* (2013.01); *G06F 2203/04112* (2013.01)

(56) References Cited

U.S. PATENT DOCUMENTS

| | | | |
|---|---|---|---|
| 7,880,479 B2 | 2/2011 | Liao et al. | |
| 8,269,743 B2 | 9/2012 | Kuo et al. | |
| 8,711,120 B2 | 4/2014 | Hargreaves et al. | |
| 8,933,898 B2 | 1/2015 | Lee et al. | |
| 9,182,432 B2 | 11/2015 | Shahrokhi et al. | |
| 9,195,271 B2 | 11/2015 | Kang et al. | |
| 9,244,573 B2 | 1/2016 | Ryu et al. | |
| 9,262,018 B2 | 2/2016 | Kim et al. | |
| 9,377,905 B1 | 6/2016 | Grivna et al. | |
| 9,575,585 B2 | 2/2017 | Kim | |
| 9,632,643 B2 | 4/2017 | Cho | |
| 9,671,909 B2 | 6/2017 | Xu | |
| 9,733,761 B2 | 8/2017 | Ku et al. | |
| 9,817,532 B2 | 11/2017 | Zhang et al. | |
| 9,841,834 B2 | 12/2017 | Xie et al. | |
| 9,927,939 B2 | 3/2018 | Na et al. | |
| 9,965,108 B2 | 5/2018 | Li et al. | |
| 10,001,870 B2 | 6/2018 | Li | |
| 10,001,877 B2 | 6/2018 | Noto | |
| 10,338,747 B2 | 7/2019 | Kim et al. | |
| 10,656,742 B2 | 5/2020 | Kim et al. | |
| 10,732,746 B2 * | 8/2020 | Kim .................... | G06F 3/0443 |
| 11,182,005 B2 * | 11/2021 | Kim .................... | G06F 3/0418 |
| 11,714,503 B2 | 8/2023 | Kim et al. | |
| 2007/0058438 A1 | 3/2007 | Saito | |
| 2009/0213090 A1 | 8/2009 | Mamba et al. | |
| 2009/0315859 A1 | 12/2009 | Chien et al. | |
| 2010/0045614 A1 | 2/2010 | Gray et al. | |
| 2010/0220075 A1 | 9/2010 | Kuo et al. | |
| 2010/0245269 A1 | 9/2010 | Jeong et al. | |
| 2011/0007030 A1 | 1/2011 | Mo et al. | |
| 2011/0084929 A1 | 4/2011 | Chang et al. | |
| 2011/0187676 A1 | 8/2011 | Chang et al. | |
| 2011/0234509 A1 | 9/2011 | Lee et al. | |
| 2011/0242058 A1 | 10/2011 | Lee et al. | |
| 2011/0254804 A1 | 10/2011 | Kuo et al. | |
| 2011/0310033 A1 | 12/2011 | Liu et al. | |
| 2012/0056820 A1 | 3/2012 | Corbridge | |
| 2012/0075243 A1 * | 3/2012 | Doi .................... | G06F 3/04166 |
| | | | 345/174 |
| 2012/0169651 A1 | 7/2012 | Chang | |
| 2012/0169655 A1 | 7/2012 | Chang | |
| 2012/0169656 A1 * | 7/2012 | Chang .................. | G06F 3/0447 |
| | | | 345/174 |
| 2013/0106752 A1 | 5/2013 | Lin et al. | |
| 2013/0154996 A1 * | 6/2013 | Trend .................... | G06F 3/0445 |
| | | | 345/174 |
| 2013/0181942 A1 | 7/2013 | Bulea et al. | |
| 2013/0194213 A1 | 8/2013 | Chou et al. | |
| 2013/0207924 A1 | 8/2013 | Mohindra et al. | |
| 2013/0241845 A1 | 9/2013 | Hsu et al. | |

| | | | |
|---|---|---|---|
| 2013/0257785 A1 * | 10/2013 | Brown ................ | G06F 3/04182 |
| | | | 345/174 |
| 2013/0257786 A1 | 10/2013 | Brown et al. | |
| 2013/0328830 A1 | 12/2013 | Han et al. | |
| 2013/0335365 A1 | 12/2013 | Kim et al. | |
| 2014/0009428 A1 * | 1/2014 | Coulson ............. | G06F 3/04166 |
| | | | 345/174 |
| 2014/0015796 A1 | 1/2014 | Philipp | |
| 2014/0062934 A1 * | 3/2014 | Coulson ................ | G06F 3/0445 |
| | | | 345/174 |
| 2014/0062951 A1 | 3/2014 | Chang et al. | |
| 2014/0111707 A1 | 4/2014 | Song et al. | |
| 2014/0253499 A1 * | 9/2014 | Lee ........................ | G06F 3/0448 |
| | | | 345/174 |
| 2014/0367644 A1 | 12/2014 | Song et al. | |
| 2015/0075959 A1 | 3/2015 | Lu et al. | |
| 2015/0145802 A1 | 5/2015 | Yao et al. | |
| 2015/0179122 A1 * | 6/2015 | Brown .................. | G06F 3/0443 |
| | | | 345/174 |
| 2015/0287381 A1 | 10/2015 | Kim et al. | |
| 2016/0048248 A1 * | 2/2016 | Na .......................... | G06F 3/047 |
| | | | 345/174 |
| 2016/0188082 A1 | 6/2016 | Ham et al. | |
| 2016/0195981 A1 | 7/2016 | Shin et al. | |
| 2016/0291780 A1 | 10/2016 | Namkung | |
| 2016/0342265 A1 | 11/2016 | Geaghan | |
| 2017/0068363 A1 * | 3/2017 | Lo ........................ | G06F 3/04164 |
| 2017/0091508 A1 | 3/2017 | Han et al. | |
| 2017/0115805 A1 | 4/2017 | Chiang et al. | |
| 2018/0004317 A1 | 1/2018 | Bohannon et al. | |
| 2018/0059869 A1 | 3/2018 | Ma | |
| 2018/0088708 A1 | 3/2018 | Naganuma et al. | |
| 2018/0129352 A1 | 5/2018 | Kim et al. | |
| 2018/0136761 A1 | 5/2018 | Jiang | |
| 2018/0157355 A1 | 6/2018 | Kim | |
| 2018/0188887 A1 | 7/2018 | Anno | |
| 2018/0224984 A1 | 8/2018 | Kim et al. | |
| 2018/0300012 A1 | 10/2018 | Lu et al. | |
| 2018/0321793 A1 * | 11/2018 | Kim ...................... | G06F 3/0446 |
| 2018/0329555 A1 | 11/2018 | Kim et al. | |
| 2018/0329576 A1 | 11/2018 | Kim et al. | |
| 2019/0102017 A1 | 4/2019 | Kim et al. | |
| 2019/0235678 A1 | 8/2019 | Kim et al. | |

FOREIGN PATENT DOCUMENTS

| | | |
|---|---|---|
| CN | 102736777 A | 10/2012 |
| CN | 104205025 | 12/2014 |
| CN | 104428741 | 3/2015 |
| CN | 105760009 A | 7/2016 |
| EP | 0 883 931 | 12/1998 |
| EP | 2 985 684 A2 | 2/2016 |
| JP | 5154316 | 2/2013 |
| KR | 10-2010-0095886 | 9/2010 |
| KR | 10-2011-0095669 | 8/2011 |
| KR | 10-2012-0133474 | 12/2012 |
| KR | 10-2013-0031024 | 3/2013 |
| KR | 10-2014-0053628 | 5/2014 |
| KR | 10-2015-0117622 | 10/2015 |
| KR | 10-2016-0020987 | 2/2016 |
| KR | 10-1620463 | 5/2016 |
| KR | 10-2016-0070265 | 6/2016 |
| KR | 10-2016-0084941 | 7/2016 |
| KR | 10-2016-0099791 | 8/2016 |
| KR | 10-2016-0119294 | 10/2016 |
| KR | 10-2018-0064625 | 6/2018 |
| KR | 10-2018-0074880 | 7/2018 |
| KR | 10-2018-0090936 | 8/2018 |
| KR | 10-2018-0122761 | 11/2018 |
| KR | 10-2018-0125671 | 11/2018 |
| KR | 10-2018-0125672 | 11/2018 |
| KR | 10-2019-0093236 | 8/2019 |

OTHER PUBLICATIONS

Office Action dated Aug. 14, 2018, in Korean Patent Application No. 10-2017-0060138.

(56) References Cited

OTHER PUBLICATIONS

Search Report dated Sep. 7, 2018, in Korean Patent Application No. 10-2018-0102228.
Non-Final Office Action dated Oct. 25, 2018, in U.S. Appl. No. 15/841,214.
Extended European Search Report dated Oct. 26, 2018, in European Patent Application No. 18172474.1.
Decision to Grant a Patent dated Nov. 16, 2018, in Korean Patent Application No. 10-2017-0060138.
Final Office Action dated Mar. 15, 2019, in U.S. Appl. No. 15/841,214.
Non-Final Office Action dated May 13, 2019, in U.S. Appl. No. 15/978,355.
Office Action dated Jun. 14, 2019, in Chinese Patent Application No. 201810455871.0.
Non-Final Office Action dated Aug. 12, 2019, in U.S. Appl. No. 15/841,214.
Final Office Action dated Aug. 28, 2019, in U.S. Appl. No. 15/978,355.
Chinese Office Action dated Dec. 2, 2019, in Chinese Patent Application No. 201810455871.0.
Non-Final Office Action dated Dec. 11, 2019, in U.S. Appl. No. 15/978,355.
Notice of Allowance dated Jan. 14, 2020, in U.S. Appl. No. 15/841,214.
Corrected Notice of Allowance dated Feb. 5, 2020, in U.S. Appl. No. 15/841,214.
Notice of Allowance dated Mar. 25, 2020, in U.S. Appl. No. 15/978,355.
Notice of Allowance dated Apr. 29, 2020, issued to U.S. Appl. No. 16/870,443.
Non-Final Office Action dated Apr. 15, 2021, in U.S. Appl. No. 16/945,086.
Office Action dated Apr. 19, 2021, in European Patent Application No. 18172474.1.
Notice of Allowance dated Jul. 21, 2021, in U.S. Appl. No. 16/945,086.
Non-Final Office Action dated Jul. 15, 2022, in U.S. Appl. No. 17/532,918.
Final Office Action dated Nov. 28, 2022, in U.S. Appl. No. 17/532,918.
Notice of Allowance dated Mar. 15, 2023, issued to U.S. Appl. No. 17/532,918.
Office Action dated May 19, 2023 from the Korean Patent Office for Korean Patent Application No. 10-2023-0046219.
Notice of Allowance dated Jun. 7, 2023, issued to U.S. Appl. No. 17/532,918.

* cited by examiner

FIG. 30

TOUCH SENSOR AND DISPLAY DEVICE INCLUDING THE SAME

CROSS-REFERENCE TO RELATED APPLICATIONS

This application is a continuation of U.S. patent application Ser. No. 18/209,444, filed Jun. 13, 2023, which is a continuation of U.S. patent application Ser. No. 17/532,918, filed Nov. 22, 2021, now U.S. Pat. No. 11,714,503, which is a continuation of U.S. patent application Ser. No. 16/945,086, filed Jul. 31, 2020, now U.S. Pat. No. 11,182,005, which is a continuation of U.S. patent application Ser. No. 15/978,355, filed May 14, 2018, now U.S. Pat. No. 10,732,746, which claims priority to and the benefit of Korean Patent Application No. 10-2017-0060138, filed May 15, 2017, the entire content of all of which is incorporated herein by reference

BACKGROUND

Field

Exemplary embodiments relate to a touch sensor and a display device including the same.

Discussion

A touch sensor is a type of an information input device and may be used for a display device. For example, the touch sensor may be attached to one side of a display panel or may be manufactured integrally with the display panel. A user can input information by pressing or touching the touch sensor while viewing an image displayed on a screen of the display device.

The above information disclosed in this section is only for understanding the background of the inventive concepts, and, therefore, may contain information that does not form prior art.

SUMMARY

Exemplary embodiments provide a high sensitivity touch sensor and a display device including the touch sensor.

Additional aspects will be set forth in the detailed description which follows, and, in part, will be apparent from the disclosure, or may be learned by practice of the inventive concepts.

According to some exemplary embodiments, a touch sensor includes a first electrode, a second electrode, and a sensing channel. The first electrode includes first electrode cells arranged in a first direction, a first connection portion connecting the first electrode cells in the first direction and a first opening disposed in at least one of the first electrode cells. The second electrode includes an electrode portion disposed in the first opening. The electrode portion is disposed on a same layer as the first electrode cells and separated from the first electrode. The sensing channel includes a first terminal and a second terminal. The first terminal is connected to the first electrode. The second terminal is connected to the second electrode.

In some exemplary embodiments, the first opening may be one of a plurality of first openings; the electrode portion may be one of a plurality of electrode portions; each of the first electrode cells may include a corresponding first opening among the plurality of first openings; and the second electrode may include the plurality of electrode portions disposed in the plurality of first openings, and a connection pattern connecting the plurality of electrode portions in the first direction.

In some exemplary embodiments, each of the plurality of first openings may overlap a corresponding electrode portion among the plurality of electrode portions and a region of the connection pattern connected to the corresponding electrode portion.

In some exemplary embodiments, a region of the connection pattern overlapping a corresponding first electrode cell among the plurality of first electrode cells and the first electrode cells may be disposed in different layers, and an insulating layer may be disposed between the different layers.

In some exemplary embodiments, another region of the connection pattern may be disposed in a corresponding first opening in which the corresponding first electrode cell is disposed. The corresponding first opening may be disposed in any one of the first electrode cells. The another region may be integrally connected to the corresponding first electrode cell.

In some exemplary embodiments, each of the first electrode cells may include fine lines that cross the corresponding first opening. The second electrode may include: sub-electrode portions disposed in regions between the fine lines and separated from each other, the sub-electrode portions configuring each of the plurality of electrode portions; and sub-electrode lines disposed in a different layer than the same layer such that the sub-electrode lines are separated from the sub-electrode portions via an insulating layer, the sub-electrode lines electrically connecting the sub-electrode portions to each other.

In some exemplary embodiments, only a first electrode cell disposed at one end among the first electrode cells arranged in the first direction may include the first opening, or the first opening may be one of a plurality of first openings, and only each of two first electrode cells disposed at different ends among the first electrode cells arranged in the first direction may include a corresponding first opening among the plurality of first openings. The electrode portion may be disposed in the first opening, or a plurality of electrode portions comprising the electrode 70 portion may be disposed in the plurality of first openings.

In some exemplary embodiments, the touch sensor may further include a third electrode separated from the first electrode and the second electrode, and a driving circuit configured to supply a driving signal to the third electrode.

In some exemplary embodiments, the third electrode may include a second opening.

In some exemplary embodiments, the touch sensor may further include a fourth electrode disposed in the second opening and separated from the third electrode.

In some exemplary embodiments, the touch sensor may further include: a plurality of first electrodes including the first electrode; a plurality of second electrodes including the second electrode; a plurality of sensing channels including the sensing channel; and a processor configured to: receive output signals from the plurality of sensing channels, and detect a touch input on the basis of the output signals. A first terminal of each of the plurality of sensing channels may be connected to a corresponding first electrode among the plurality of first electrodes. A second terminal of each of the plurality of sensing channels may be connected to a corresponding second electrode among the plurality of second electrodes. Each of the plurality of sensing channels is configured to generate an output signal corresponding to a voltage difference between the first terminal and the second terminal.

In some exemplary embodiments, the plurality of second electrodes may be electrically connected to each other.

In some exemplary embodiments, the touch sensor may further include a wire commonly connected to one end of each of the plurality of second electrodes.

In some exemplary embodiments, the touch sensor may further include another wire commonly connected to another end of each of the plurality of second electrodes.

In some exemplary embodiments, the first opening may be one of a plurality of first openings. The first connection portion may be one of a plurality of first connection portions. Each of the plurality of first electrodes may include: the first electrode cells, each of the first electrode cells including a corresponding first opening among the plurality of first openings; and a corresponding first connection portion among the plurality of first connection portions, the first connection portion connecting the first electrode cells included in a corresponding first electrode in the first direction. Each of the plurality of second electrodes may overlap a corresponding first electrode among the plurality of first electrodes. Each of the plurality of second electrodes may include: electrode portions disposed in respective first openings in the corresponding first electrode; and a connection pattern connecting the electrode portions in the first direction. The touch sensor may further include a cross-connection wire extending in a second direction intersecting the first direction. The cross-connection wire may intersect the second electrodes and connect the second electrodes to each other.

In some exemplary embodiments, each of the plurality of first openings may overlap: a corresponding electrode portion among the electrode portions, a region of the connection pattern connected to the corresponding electrode portion, and a region of the cross-connection wire.

In some exemplary embodiments, the touch sensor may further include an amplification circuit connected between the plurality of second electrodes and second terminals of the plurality of sensing channels. The amplification circuit may include an amplifier commonly connected to the plurality of second electrodes.

In some exemplary embodiments, the amplification circuit may further include resistors connected in series to each other between an output terminal of the amplifier and a reference power supply. Each of the plurality of sensing channels may be connected to a different node among nodes between the output terminal of the amplifier and the reference power supply.

In some exemplary embodiments, the amplification circuit may further include variable resistors connected in parallel to the output terminal of the amplifier. Each of the plurality of sensing channels may be connected to a different variable resistor among the variable resistors.

In some exemplary embodiments, the amplification circuit may further include: resistor groups connected in parallel to the output terminal of the amplifier, and a first switching unit including switches connected between the output terminal of the amplifier and each of the resistor groups.

In some exemplary embodiments, each of the resistor groups may include resistors connected to a different sensing channel among the plurality of sensing channels, and the resistors may be connected in parallel with each other.

In some exemplary embodiments, the amplification circuit may further include a second switching unit, the second switching unit may include switches connected between each of the plurality of sensing channels and the resistor groups.

According to some exemplary embodiments, a display device includes a display panel and a touch sensor. The display panel includes a display region. The display region includes pixels. The touch sensor includes an active region overlapping the display region. The touch sensor includes first electrodes, second electrodes, sensing channels, and a processor. The first electrodes are disposed in the active region. Each of the first electrodes includes a first opening. The second electrodes are separated from the first electrodes. Each second electrode among the second electrodes includes an electrode portion disposed in a corresponding first opening among first openings of the first electrodes. Each sensing channel among the sensing channels includes a first terminal and a second terminal. The first terminal is connected to a first electrode among the first electrodes. The second terminal is connected to a second electrode among the second electrodes. Each sensing channel among the sensing channels being configured to generate an output signal corresponding to a voltage difference between a corresponding first terminal among first terminals of the sensing channels and a corresponding second terminal among second terminals of the sensing channels. The processor is configured to receive output signals from the sensing channels, and to detect a touch input on the basis of the output signals.

In some exemplary embodiments, the touch sensor may further include: third electrodes separated from the first electrodes and the second electrodes; and a driving circuit configured to sequentially supply driving signals to the third electrodes.

In some exemplary embodiments, the touch sensor may further include fourth electrodes separated from the third electrodes. The fourth electrodes overlap a region of each of the third electrodes, or the fourth electrodes are disposed in second openings in the third electrodes.

In some exemplary embodiments, the second electrodes may be electrically connected to each other.

In some exemplary embodiments, the display device may further include: an amplification circuit commonly connected between the second electrodes and second terminals of the sensing channels. The amplification circuit may include an amplifier commonly connected to the second electrodes.

In some exemplary embodiments, the amplification circuit may further include variable resistors connected in parallel to an output terminal of the amplifier, and each of the sensing channels may be connected to a different variable resistor among the variable resistors.

In some exemplary embodiments, the display panel may further include: a first substrate, a light emitting element disposed on a first surface of the first substrate, and a thin film sealing layer disposed on and at least covering the light emitting element. The first electrodes and the second electrodes may be disposed on the thin film sealing layer.

According to various exemplary embodiments, a touch sensor (which may be included in or as part of a display device) is capable of effectively canceling (or at least reducing) a noise signal input to a sensing unit of the touch sensor from a display panel or the like. Accordingly, it is possible to minimize (or at least reduce) a malfunction of the touch sensor due to the noise signal, and to improve sensing sensitivity.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 30 illustrates an embodiment relating to the sensing unit illustrated in FIG. 29 according to some exemplary embodiments.

DETAILED DESCRIPTION OF THE ILLUSTRATED EMBODIMENTS

Figure 1:
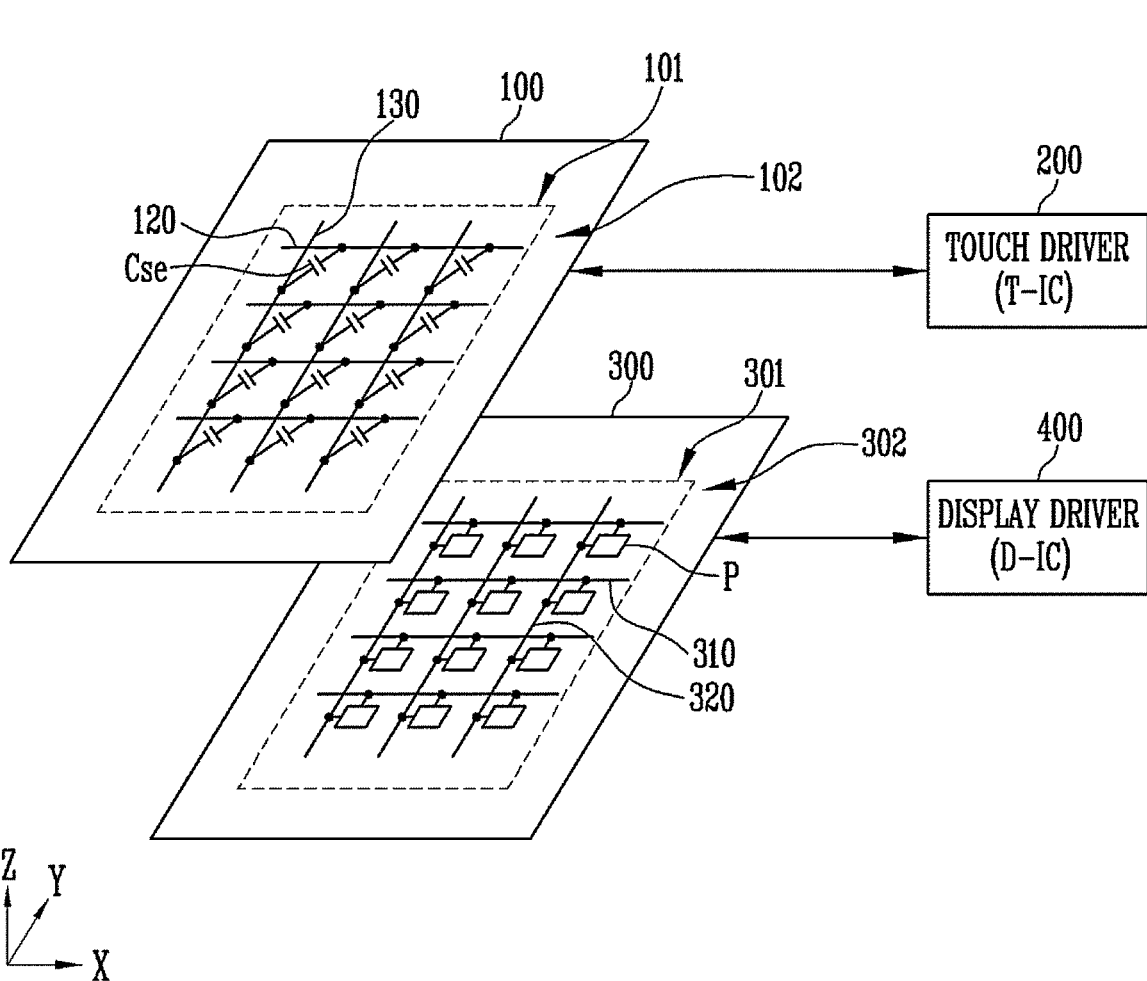
FIG. 1 schematically illustrates a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the spirit and scope of the inventive concepts. Further, the blocks, units, and/or modules of some exemplary embodiments may be physically combined into more complex blocks, units, and/or modules without departing from the spirit and scope of the inventive concepts.

Figure 2:
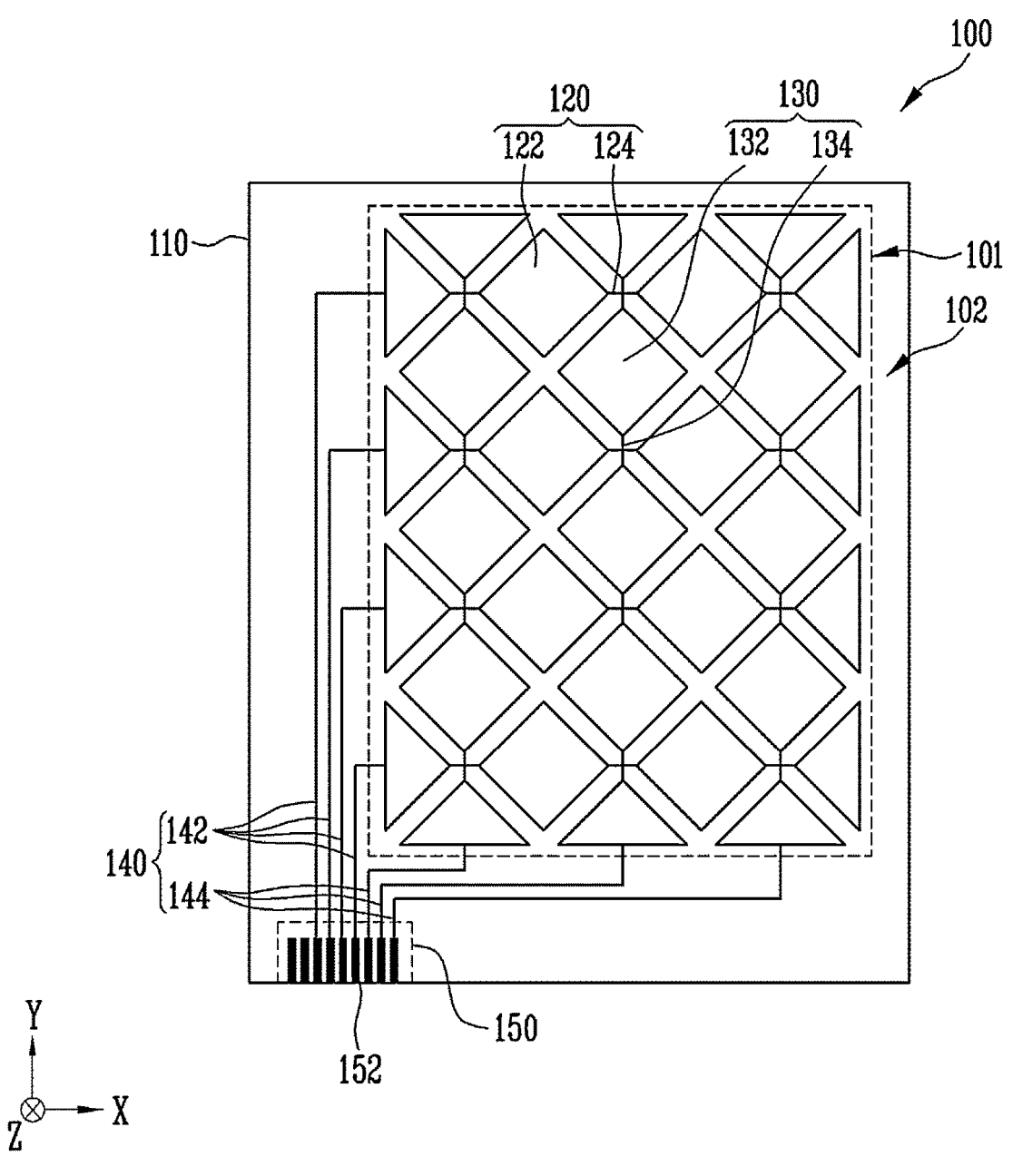
FIG. 2 illustrates a sensing unit of a touch sensor according to some exemplary embodiments.

FIG. 1 schematically illustrates a display device according to some exemplary embodiments. FIG. 2 illustrates a sensing unit of a touch sensor according to some exemplary embodiments.

Referring to FIG. 1, the display device includes a sensing unit (or structure) 100, a touch driver 200, a display panel 300, and a display driver 400. The sensing unit 100 and the touch driver 200 configure a touch sensor. Although the sensing unit 100 and the display panel 300 are separately illustrated in FIG. 1, embodiments are not limited thereto. For example, the sensing unit 100 and the display panel 300 may be integrally manufactured.

According to some embodiments, the sensing unit 100 may be provided in at least one region of the display panel 300. For example, the sensing unit 100 may be provided to overlap the display panel 300 on at least one surface of the display panel 300. For example, the sensing unit 100 may be disposed on one surface (for example, an upper surface) of two surfaces of the display panel 300 in a direction in which images are emitted, e.g., a third direction, such as a Z direction. In some embodiments, the sensing unit 100 may be directly formed on at least one surface of the two surfaces of the display panel 300, or may be formed inside the display panel 300. For example, the sensing unit 100 may be directly formed on the upper surface (or seal layer) of the display panel 300, or may be directly formed on the inner surface of an upper substrate or a lower substrate (for example, a lower surface of the upper substrate or the upper surface of the lower substrate).

The sensing unit 100 includes an active region 101 capable of sensing a touch input and an non-active region 102 outside the active region 101, e.g., surrounding at least a part of the active region 101. According to some embodiments, the active region 101 may be disposed to correspond to a display region 301 of the display panel 300, and the non-active region 102 may be disposed to correspond to a non-display region 302 of the display panel 300. For example, the active region 101 of the sensing unit 100 may overlap the display region 301 of the display panel 300, and the non-active region 102 of the sensing unit 100 may overlap the non-display region 302 of the display panel 300.

According to some embodiments, the active region 101 may be provided with at least one electrode for detecting a touch input, for example, a plurality of sensing electrodes 120 and driving electrodes 130. The sensing electrodes 120 and the driving electrodes 130 may be disposed in or overlap the display region 301 of the display panel 300. In this case, the sensing electrodes 120 and the driving electrodes 130 may overlap at least one electrode of the display panel 300. For example, when the display panel 300 is an organic light emitting display panel or a liquid crystal display panel, the sensing electrodes 120 and the driving electrodes 130 may overlap at least a cathode electrode or a common electrode of the display panel 300.

More specifically, the sensing unit 100 may include a plurality of sensing electrodes 120 and driving electrodes 130 provided to intersect each other in the active region 101. For example, the active region 101 may be provided with the plurality of sensing electrodes 120 extending in a first direction (for example, an X direction) and the plurality of driving electrodes 130 extending in a second direction (for example, an Y direction) so as to intersect the plurality of sensing electrodes 120. Although not illustrated, according to some embodiments, the sensing electrodes 120 and the driving electrodes 130 may be insulated by at least one insulating layer or at least one insulating film.

Capacitances Cse are formed between the sensing electrodes 120 and the driving electrodes 130, particularly at their intersections. The capacitance Cse changes when a touch input (or interaction) occurs at or around a corresponding point. Therefore, the touch input may be detected by detecting a change of the capacitance Cse.

Shape, sizes, and/or disposition directions of the sensing electrodes 120 and the driving electrodes 130 are not limited in particular. The sensing electrodes 120 and the driving electrodes 130 may be configured as illustrated in FIG. 2, as a non-limiting embodiment relating to the arrangement and configuration of the sensing electrodes 120 and the driving electrodes 130. In FIGS. 1 and 2, a mutual capacitance type touch sensor is disclosed as an exemplary touch sensor, but the touch sensor according to some embodiments is not limited to a mutual capacitance type touch sensor.

Referring to FIG. 2, the sensing unit 100 includes a base substrate 110 including the active region 101 and the non-active region 102, the plurality of sensing electrodes 120 and driving electrodes 130 provided in the active region 101, and a plurality of wires 140 and a pad portion 150 provided in the non-active region 102 on the base substrate 110. Meanwhile, in some embodiments, the touch sensor may be a self-capacitance type touch sensor, and a plurality of sensing electrodes that receives a driving signal during one period of a touch driving period and outputs a sensing signal during another period may be disposed in the active region 101.

The base substrate 110 is a base of the sensing unit 100 and may be a rigid substrate or a soft (or pliable) substrate. For example, the base substrate 110 may be a rigid substrate formed of glass or tempered glass, or a soft substrate formed of at least one thin film of flexible plastic material. Meanwhile, according to some embodiments, the base substrate 110 may be one of the substrates configuring the display panel 300. For example, in some embodiments in which the sensing unit 100 and the display panel 300 are integrally formed, the base substrate 110 may be at least one substrate (for example, an upper substrate) configuring the display panel 300, or a thin film sealing layer (or a thin film encapsulation layer).

The sensing electrodes 120 may extend along a first direction, for example, an X direction. According to some embodiments, each of the sensing electrodes 120 disposed in each row may include a plurality of first electrode cells 122 arranged in the first direction and at least one first connection portion 124 connecting the first electrode cells 122 in each row in the first direction. As used herein, the term "connection" may comprehensively mean physical and/or electrical "connection." According to some embodiments, if each of the sensing electrodes 120 includes three or more first electrode cells 122, each of the sensing electrodes 120 may include a plurality of first connection portions 124. According to some embodiments, the first connection portions 124 may be integrally configured with the first electrode cells 122, or may be configured by a bridge-type connection pattern.

Although an embodiment in which the first connection portions 124 are disposed in the first direction is illustrated in FIG. 2, embodiments are not limited thereto. For example, in at least one other embodiment, the first connection portions 124 may be disposed in an oblique direction inclined with respect to the first direction. In addition, although an embodiment in which the first connection portions 124 have a straight line shape (or a bar shape) is illustrated in FIG. 2, embodiments are not limited thereto. For example, in at least one other embodiment, the first connection portions 124 may have a bent or curved shape in at least one region. In addition, although an embodiment in which adjacent two first electrode cells 122 are connected to each other through one first connection portion 124 disposed therebetween is illustrated in FIG. 2, embodiments are not limited thereto. For example, in at least one other embodiment, the adjacent two first electrode cells 122 may be connected to each other through a plurality of first connection portions 124 disposed therebetween.

According to some embodiments, the first electrode cell 122 and/or the first connection portion 124 may have conductivity by including at least one of a metal material, a transparent conductive material, and various other conductive materials. For example, the first electrode cell 122 and/or the first connection portion 124 may be formed of at least one metal of various metal materials, such as at least one of gold (Au), silver (Ag), aluminum (Al), molybdenum (Mo), chromium (Cr), titanium (Ti), Nickel (Ni), neodymium (Nd), copper (Cu), and platinum (Pt), and/or an alloy thereof. Additionally or alternatively, the first electrode cell 122 and/or the first connection portion 124 may be formed of at least one of various transparent conductive materials, such as at least one of a silver nano wire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nano tube, and graphene. Additionally or alternatively, the first electrode cell 122 and/or the first connection portion 124 may include at least one of various conductive materials which may provide conductivity, such as a conductive polymer. According to some embodiments, the first electrode cell 122 and/or the first connection portion 124 may be configured with a single layer, a single composite layer of multiple materials, or multiple layers.

According to some embodiments, when the touch sensor is a mutual capacitance type touch sensor, the sensing electrodes 120 may sense a sensing signal corresponding to a driving signal input to the driving electrodes 130. For example, the sensing electrodes 120 may be Rx electrodes that output the sensing signals corresponding to touch inputs.

The driving electrodes 130 may extend in a second direction, for example, the Y direction. According to some embodiments, each of the driving electrodes 130 disposed in each column may include a plurality of second electrode cells 132 arranged in the second direction and at least one second connection portion 134 connecting the second electrode cells 132 in each column in the second direction. According to some embodiments, if each of the driving electrodes 130 includes three or more second electrode cells 132, each of the driving electrodes 130 may include a plurality of second connection portions 134. According to some embodiments, the second connection portions 134 may be integrally formed with the second electrode cells 132, or may be formed of a bridge-type connection pattern. When the touch sensor is a mutual capacitance type touch sensor, the driving electrodes 130 may be Tx electrodes that receive driving signals during a period in which the touch sensor is activated.

Although the first and second electrode cells 122 and 132 are illustrated in a diamond shape in FIG. 2 for the sake of convenience, and the shapes, sizes, and the like of the first and second electrode cells 122 and 132 may be variously changed. For example, the first and second electrode cells 122 and 132 may have other shapes, such as a circular shape, a hexagonal shape, or any other suitable polygonal shape or amorphous shape.

In addition, although an embodiment in which the second connection portions 134 are disposed in the second direction is illustrated in FIG. 2, embodiments are not limited thereto. For example, in at least one other embodiment, the second connection portions 134 may be disposed in oblique directions inclined with respect to the second direction. In addition, although an embodiment in which the second connection portions 134 have a straight line shape (or a bar shape) is illustrated in FIG. 2, embodiments are not limited thereto. For example, in at least one other embodiment, the second connection portions 134 may have a bent or curved shape in at least one region. In addition, although an embodiment in which the adjacent two second electrode cells 132 are connected to each other through one second connection portion 134 disposed therebetween is illustrated in FIG. 2, embodiments are not limited thereto. For example, in at least one other embodiment, adjacent two second electrode cells 132 may be connected to each other through a plurality of second connection portions 134 disposed therebetween.

According to some embodiments, the second electrode cells 132 and/or the second connection portions 134 may have conductivity by including at least one of a metal material, a transparent conductive material, and various other conductive materials. For example, the second electrode cells 132 and/or the second connection portions 134 may include at least one of the conductive materials described as configuration materials of the first electrode cells 122 and/or the first connection portions 124 described above. In addition, the second electrode cells 132 and/or the second connection portions 134 may be formed of the same material as the conductive material forming the first electrode cells 122 and/or the first connection portions 124, or may be formed of different materials. In addition, the second electrode cells 132 and/or the second connection portions 134 may be formed of a single layer, a single composite layer of multiple materials, or multiple layers.

According to some embodiments, wires 140 for electrically connecting the sensing electrodes 120 and the driving electrodes 130 provided in the active region 101 to the touch driver 200 may be disposed in the non-active region 102. According to some embodiments, the wires 140 may include first wires 142 for electrically connecting each of the sensing electrodes 120 to the pad portion 150, and second wires 144 for electrically connecting each of the driving electrodes 130 to the pad portion 150. For example, each of the wires 140 may electrically connect one of the sensing electrodes 120 and the driving electrodes 130 to a predetermined pad 152 included in the pad portion 150. Meanwhile, although FIG. 2 illustrates that the first wires 142 and the second wires 144 are connected to one terminal of each of the sensing electrodes 120 and the driving electrodes 130 for the sake of convenience, a connection structure between the sensing electrodes 120, the driving electrodes 130 and the first and second wires 142 and 144 may be variously changed. For example, in at least one other embodiment, at least one of the first wires 142 and the second wires 144 may be connected to both terminals of the sensing electrodes 120 or the driving electrodes 130.

The pad portion 150 may include a plurality of pads 152 for electrically connecting the sensing electrodes 120 and the driving electrodes 130 to an external driving circuit, for example, the touch driver 200. The sensing unit 100 and the touch driver 200 may communicate with each other through the pad portion 150.

Referring to FIG. 1 again, the touch driver 200 is electrically connected to the sensing unit 100 to transmit and receive a signal for driving the sensing unit 100. For example, the touch driver 200 may detect a touch input by receiving a sensing signal corresponding to a driving signal from the sensing unit 100 after supplying the driving signal to the sensing unit 100. To this end, the touch driver 200 may include a driving circuit and a sensing circuit. In some embodiments, the driving circuit and the sensing circuit may be integrated in one touch integrated circuit (IC) (T-IC), but embodiments are not limited thereto.

According to some embodiments, the driving circuit may be electrically connected to the driving electrodes 130 of the sensing unit 100 to sequentially supply the driving signals to the driving electrodes 130. According to some embodiments, the sensing circuit may be electrically connected to the sensing electrodes 120 of the sensing unit 100 to receive the sensing signals from the sensing electrodes 120 and perform signal processing of the sensed signals to detect a touch input.

The display panel 300 includes a display region 301 and a non-display region 302 surrounding at least one region of the display region 301. The display region 301 is provided with a plurality of scan lines 310, a plurality of data lines 320, and a plurality of pixels P connected to the scan lines 310 and the data lines 320. The non-display region 302 may be provided with wires, such as power wires, etc., for supplying various driving signals and/or driving power for driving the pixels P.

A type of the display panel 300 is not limited. For example, the display panel 300 may be a self-luminous display panel, such as an organic light emitting display panel (OLED panel), etc. Additionally or alternatively, the display panel 300 may be a non-luminous display panel, such as a liquid crystal display panel (LCD panel), an electro-phoretic display panel (EPD panel), an electro-wetting display panel (EWD panel), etc. If the display panel 300 is a non-luminous display panel, the display device may further include a light source, e.g., a backlight unit, for supplying light to the display panel 300. The light source may provide one or more of edge and back light.

The display driver 400 is electrically connected to the display panel 300 to supply signals for driving the display panel 300. For example, the display driver 400 may include at least one of a scan driver for supplying scan signals to scan lines 310, a data driver for supplying data signals to data lines 320, and a timing control unit (or timing controller) for driving the scan driver and the data driver. According to some embodiments, the scan driver, the data driver, and/or the timing control unit may be integrated in one display IC (D-IC), but embodiments are not limited thereto. For example, in at least one other embodiment, at least one of the scan driver, the data driver, and the timing control unit may be integrated or mounted on the display panel 300.

Figure 3:
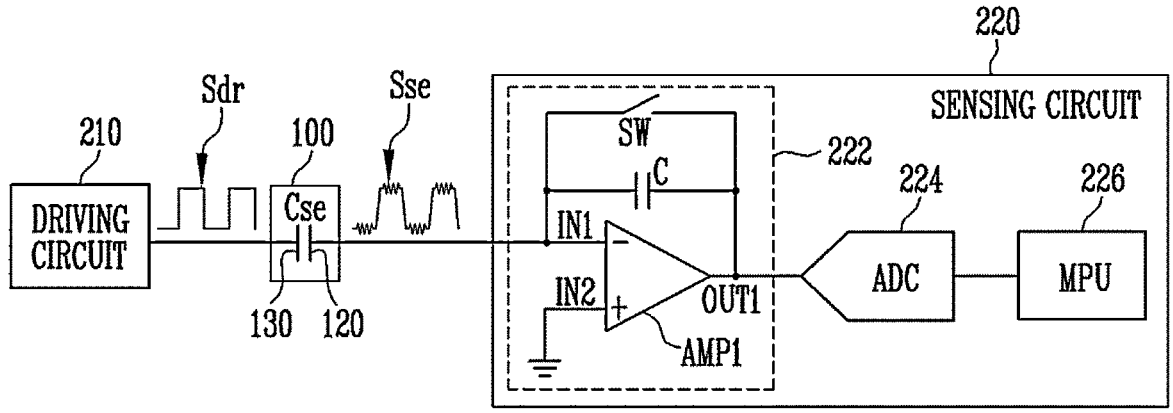
FIG. 3 illustrates a touch sensor according to some exemplary embodiments.

FIG. 3 illustrates a touch sensor according to some exemplary embodiments. For the sake of convenience, FIG. 3 illustrates each of the sensing electrodes 120 and the driving electrodes 130 provided in the sensing unit 100, and a capacitance Cse formed at an intersection therebetween. FIG. 3 illustrates the driving circuit 210 and the sensing circuit 220 around the sensing electrode 120 and the driving electrode 130 that form the capacitance Cse.

Referring to FIG. 3, the sensing unit 100 includes at least a pair of the sensing electrode 120 and the driving electrode 130 forming the capacitance Cse. The driving electrode 130 is electrically connected to the driving circuit 210 of the touch driver 200 and the sensing electrode 120 is electrically connected to the sensing circuit 220 of the touch driver 200. Meanwhile, although FIG. 3 illustrates the driving circuit 210 and the sensing circuit 220 that are separated from each other, embodiments are not limited thereto. For example, according to some embodiments, the driving circuit 210 and the sensing circuit 220 may be separately provided, or at least a part of the driving circuit 210 and the sensing circuit 220 may be integrally integrated.

A method of driving the touch sensor, according to some embodiments, will be described. First, a driving signal Sdr is supplied from the driving circuit 210 to the driving electrode 130. If the sensing unit 100 includes the plurality of driving electrodes 130 as illustrated in FIGS. 1 and 2, the driving circuit 210 may sequentially supply the driving signal Sdr to the driving electrodes 130. Then, the sensing signal Sse corresponding to the driving signal Sdr applied to each of the driving electrodes 130 is output from each of the sensing electrodes 120 by a coupling action of the capacitance Cse. The sensing signal Sse is input to the sensing circuit 220 of the touch driver 200.

According to some embodiments, if the sensing unit 100 includes the plurality of sensing electrodes 120 as illustrated in FIGS. 1 and 2, the sensing circuit 220 may include a plurality of sensing channels (Rx channels) 222 electrically connected to each of the sensing electrodes 120, and may receive the sensing signals Sse output from the plurality of sensing electrodes 120 through the sensing channels 222. The sensing circuit 220 amplifies, converts, and processes the sensing signal Sse input from each sensing electrode 120, and detects a touch input in accordance with the results. To this end, the sensing circuit 220 may include a plurality of sensing channels 222 corresponding to each sensing electrode 120, at least one analog-to-digital converter (hereinafter, referred to as an ADC) 224 connected to the sensing channels 222, and a processor 226. For the sake of convenience, the sensing channel 222 and the ADC 224 will be described, hereinafter, as separate configuration elements, but the ADC 224 may be configured within each sensing channel 222 in some embodiments.

According to some embodiments, each of the sensing channels 222 may include at least an analog front end (hereinafter referred to as "AFE"). In addition, according to some embodiments, if the sensing circuit 220 includes the ADC 224 connected 1:1 to each AFE, each sensing channel 222 may include a pair of AFE and ADC 224 connected to each other. However, in at least one other embodiment, a plurality of AFEs may share one ADC 224. For the sake of convenience, an exemplary embodiment will be described by defining the AFE connected to each sensing electrode 120 as each sensing channel 222 and regarding the ADC 224 as a separate configuration element from the sensing channel 222.

The sensing channel 222 may receive the sensing signal Sse from each of the sensing electrodes 120 and amplify the received signal to output to the ADC 224. According to some embodiments, each sensing channel 222 may be configured as an AFE including at least one first amplifier AMP1, such as an operational amplifier. According to some embodiments, a first input terminal (also referred to as first terminal (s)) IN1 of the sensing channel 222, for example, an inverting input terminal of the operational amplifier AMP1 may be connected to one of the sensing electrodes 120. That is, the sensing signal Sse from any one of the sensing electrodes 120 may be input to the first input terminal IN1. In addition, a second input terminal (also referred to as second terminal (s)) IN2 of the sensing channel 222, for example, a non-inverting input terminal of the operational amplifier AMP1 may be connected to a reference power supply, such as a ground (GND). Meanwhile, a capacitor C and a reset switch SW may be connected in parallel between the first input terminal IN1 and an output terminal OUT1 of the operational amplifier AMP1.

The ADC 224 converts an analog signal input from the sensing channel 222 into a digital signal. According to some embodiments, the ADC 224 may be provided as many as the number of the sensing electrodes 120 to correspond to each sensing channel 222 corresponding to each sensing electrode 120 at a ratio of 1:1. Alternatively, in at least one other embodiment, the plurality of sensing channels 222 may be configured to share one ADC 224. In this case, a switching circuit for selecting the channel may additionally be provided between the sensing channels 222 and the ADC 224.

The processor 226 processes the converted signal (digital signal) from the ADC 224 and detects a touch input in accordance with the signal processing results. For example, the processor 226 may collectively analyze a signal (e.g., an amplified and converted sensing signal Sse) input from the plurality of sensing electrodes 120 through each sensing channel 222 and each ADC 224 to detect whether or not the touch input occurs and a position thereof. According to some embodiments, the processor 226 may be configured as a microprocessor (MPU). In this case, a memory (not shown) for driving (e.g., providing one or more sequences of one or more instructions, e.g., programming code, to) the processor 226 may be additionally provided inside (or connected to) the sensing circuit 220; however, a configuration of the processor 226 is not limited thereto. According to some embodiments, the processor 226 may be configured as a microcontroller (MCU), or the like.

As described above, the touch sensor may be combined with the display panel 300 or the like. For example, the sensing unit 100 of the touch sensor may be integrally manufactured with the display panel 300 or may be attached to at least one surface of the display panel 300 after being separately manufactured from the display panel 300.

If the sensing unit 100 is coupled to the display panel 300, a parasitic capacitance may be generated between the sensing unit 100 and the display panel 300. A noise signal from the display panel 300 may be transmitted to the touch sensor, for instance, the sensing unit 100 by a coupling action of the parasitic capacitance. For example, a noise signal caused, at least in part, by a display driving signal used for driving the display panel 300 may be input to the sensing unit 100. For example, the sensing electrode 120 and the driving electrode 130 of the 650 sensing unit 100 may be disposed so as to overlap a cathode electrode or a common electrode of the display panel 300, and in this case, a common mode noise caused, at least in part, by the display driving signal applied to the display panel 300 may be input to the sensing unit 100. For example, in the display device according to some embodiments, the display panel 300 may be an organic light emitting display panel having a thin film sealing layer (TFE), and may be realized by an on-cell type sensor in which the sensing electrode 120 and the driving electrode 130 are directly formed on one surface (for example, an upper surface) of the TFE. In this case, at least one electrode, for example, a cathode electrode provided in the organic light emitting display panel is positioned close to the sensing electrode 120 and the driving electrode 130. Accordingly, a relatively large noise signal caused, at least in part, by the display driving may be input to the sensing unit 100. The noise signal input to the sensing unit 100 may cause a ripple of (or in) the sensing signal Sse. Due to this, sensitivity of the touch sensor may decrease. Accordingly, the inventive concepts provide various embodiments capable of improving the sensitivity of the touch sensor, and a detailed description thereof will be described below.

Figure 4:
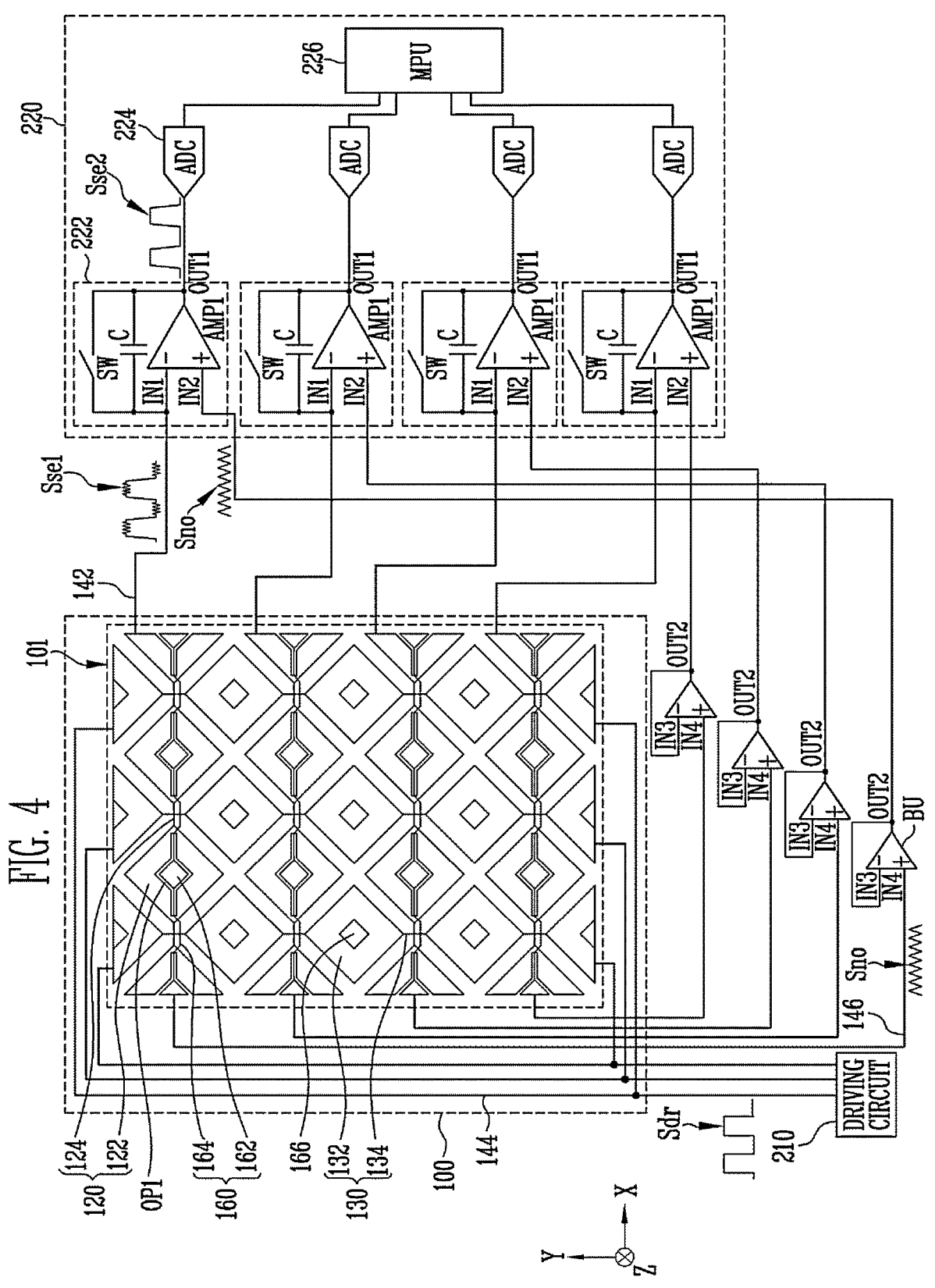
FIG. 4 illustrates a touch sensor according to some exemplary embodiments.

FIG. 4 illustrates a touch sensor according to some exemplary embodiments. For the sake of convenience, the base substrate 110 and the pad portion 150 illustrated in FIG. 2 are not illustrated in FIG. 4, but the sensing unit 100 of FIG. 4 may be formed on the base substrate 110. In FIG. 4, the configuration elements similar to or the same as those in FIGS. 1 to 3 are denoted by the same reference numerals or symbols, and a detailed description thereof will be omitted.

Referring to FIG. 4, the touch sensor includes the sensing unit 100, the driving circuit 210 electrically connected to the sensing unit 100, and the sensing circuit 220 electrically connected to the sensing unit 100. The sensing unit 100 further includes at least one noise detecting electrode 160 provided in the active region 101.

According to some embodiments, a plurality of noise detecting electrodes 160 separated from each other may be provided in the active region 101 of the sensing unit 100, and the noise detecting electrodes 160 may form a pair with any one of the sensing electrodes 120. That is, according to some embodiments, the sensing unit 100 includes an electrode pair configured with the sensing electrode 120 and the noise detecting electrode 160, which correspond to each other. However, embodiments are not limited thereto. For example, in a touch sensor according to at least one other embodiment, a plurality of noise detecting electrodes 160 among the noise detecting electrodes 160 provided in the active region 101 may be electrically connected to each other. As an example, all the noise detecting electrodes 160 provided in the active region 101 may be electrically connected to each other to be realized as substantially one noise detecting electrode 160.

For instance, the sensing unit 100 includes at least a pair of a sensing electrode (first electrode) 120 and a noise detecting electrode (second electrode) 160. In addition, according to some embodiments, the sensing unit 100 may further include at least one driving electrode (third electrode) 130 intersecting the pair of the sensing electrode 120 and noise detecting electrode 160. For example, the sensing unit 100 may include a plurality of noise detecting electrodes (second electrodes) 160 that are paired with each of the sensing electrodes (first electrodes) 120 and are separated from the sensing electrodes 120, and a plurality of driving electrodes (third electrodes) 130 that intersect each other and are separated from the sensing electrodes 120 and the noise detecting electrodes 160.

According to some embodiments, the sensing electrodes 120, the noise detecting electrodes 160, and the driving electrodes 130 may be physically and/or electrically separated from each other. For example, at least a part of the sensing electrodes 120, the driving electrodes 130, and the noise detecting electrodes 160 may overlap and/or intersect each other, and may be separated from each other in at least an overlapped region by one or more insulating layers or patterns (not illustrated). That is, the sensing electrodes 120, the driving electrodes 130, and the noise detecting electrodes 160 may be separated from each other to be electrically isolated, and capacitances may be formed therebetween.

According to some embodiments, the sensing electrodes 120 may extend in the first direction (for example, the X direction) in the active region 101, and the driving electrodes 130 may extend in the second direction (for example, the Y direction) in the active region 101 so as to intersect the sensing electrodes 120. In addition, the noise detecting electrodes 160 may extend in the first direction in the active region 101 like the sensing electrodes 120, and one region thereof may overlap the sensing electrodes 120.

According to some embodiments, each of the sensing electrodes 120 may include a plurality of first electrode cells 122 arranged in the first direction, and at least one first connection portion 124 connecting the first electrode cells 122 in the first direction. According to some embodiments, if each of the sensing electrodes 120 includes three or more first electrode cells 122, each of the sensing electrodes 120 may include a plurality of first connection portions 124. According to some embodiments, the first electrode cells 122 and/or the first connection portions 124 may have conductivity by including at least one of various transparent conductive materials, including ITO and IZO, various metal materials, including Ag, and other various conductive materials. Meanwhile, shapes of the sensing electrodes 120 are not limited to the illustrated shapes. For example, in at least one other embodiment, each of the sensing electrodes 120 may be formed of an integral bar type electrode.

According to some embodiments, each of the sensing electrodes 120 may include at least one first opening (or hole) OP1 therein. For example, at least the center of each of the first electrode cells 122 may be open.

According to some embodiments, each of the noise detecting electrodes 160 may include at least one electrode portion 162 positioned inside the first opening OP1 included in any one of the sensing electrodes 120. That is, the at least one electrode portion 162 may overlap the first opening OP1. For example, if each of the first electrode cells 122 includes at least one first opening OP1, each of the noise detecting electrodes 160 may include a plurality of electrode portions 162 disposed inside (or, overlapped with) the first openings OP1 in the first electrode cells 122 configuring any one first electrode 120 paring with the respective one of the noise detecting electrodes 160. Any one of first electrodes 120 and any one of the noise detecting electrodes 160 configuring a pair may be positioned so as to corresponding to each other so that at least one region may overlap each other. In addition, each of the noise detecting electrodes 160 may include at least one connection line (also referred to as connection pattern(s)) 164 connecting the electrode portions 162 in the first direction. According to some embodiments, if each of the noise detecting electrodes 160 includes three or more electrode portions 162, each of the noise detecting electrodes 160 may include a plurality of connection lines 164.

According to some embodiments, the electrode portions 162 and/or the connection lines 164 may have conductivity by including at least one of a metal material, a transparent conductive material, and various other conductive materials. For example, the electrode portions 162 and/or the connection lines 164 may include at least one of the conductive materials described as materials forming the first electrode cells 122, the first connection portions 124, the second electrode cells 132, and/or the second connection portions 134. In addition, the electrode portions 162 and/or the connection lines 164 may be formed of the same material as the conductive materials forming the first electrode cells 122, the first connection portions 124, the second electrode cells 132, and/or the second connection portions 134, or may be formed of different materials. In addition, each of the electrode portions 162 and/or the connection lines 164 may be configured with a single layer, a single composite layer of multiple materials, or multiple layers.

According to some embodiments, each of the first openings OP1 may overlap any one electrode portion 162 of the electrode portions 162, and at least one region of the connection lines 164 connected to any one electrode portion 162. For example, each of the first openings OP1 may overlap any one electrode portion 162 positioned in the first opening OP1, and may overlap one region of at least one connection line 164 connected to at least one end of any one electrode portion 162.

According to some embodiments, each of the sensing electrodes 120 may be connected to different sensing channels 222 through the different first wires 142. Each of the noise detecting electrodes 160 may be connected to the different sensing channels 222 through the different third wires 146. According to some embodiments, the pair of sensing electrode 120 and noise detecting electrode 160 may be connected to the same sensing channel 222. For example, the pair of sensing electrode 120 and noise detecting electrode 160 may be connected to the same sensing channel 222 of the plurality of sensing channels 222, and may be connected to different input terminals of any one sensing channel 222, for example, a first input terminal IN1 and a second input terminal IN2, respectively.

According to some embodiments, at least one buffer BU may be provided between each of the noise detecting electrodes 160 and the sensing channel 222 corresponding thereto. According to some embodiments, each buffer BU is connected between the noise detecting electrode 160 and the sensing channel 222 corresponding to each other, and buffers a signal (for example, a noise signal Sno) input from the noise detecting electrode 160 to output the buffered signal. According to some embodiments, the buffer BU may include a third input terminal IN3 electrically connected to the output terminal OUT2 and a fourth input terminal IN4 electrically connected to the corresponding noise detecting electrode 160 to receive the noise signal Sno. According to some embodiments, the third input terminal IN3 and the fourth input terminal IN4 may be an inverting input terminal and a non-inverting input terminal, respectively, but embodiments are not limited thereto. That is, a connection structure of the buffer BU may be variously changed.

According to some embodiments, each of the driving electrodes 130 may include a plurality of second electrode cells 132 arranged in the second direction and at least one second connection portion 134 connecting adjacent second electrode cells 132 in the second direction. According to some embodiments, if each of the driving electrodes 130 includes three or more second electrode cells 132, each of the driving electrodes 130 may include a plurality of second connection portions 134. According to some embodiments, the second electrode cells 132 and/or the second connection portions 134 may have conductivity by including at least one of various transparent conductive materials, including ITO and IZO, various metal materials, including Ag, and other various conductive materials.

Shapes of the driving electrodes 130 are not limited to the illustrated examples. For instance, in at least one other embodiment, each of the driving electrodes 130 may be formed of an integral bar type electrode. According to some embodiments, each of the driving electrodes 130 may be connected to the driving circuit 210 through different second wires 144.

According to some embodiments, the sensing unit 100 may further include at least one first dummy pattern (also referred to as fourth electrode(s)) 166 overlapping at least one driving electrode 130. For example, the sensing unit 100 may include a plurality of first dummy patterns 166 overlapping one region of each of the second electrode cells 132. According to some embodiments, at least one insulating layer (not shown) may be interposed between the first dummy patterns 166 and the driving electrodes 130. For example, each of the first dummy patterns 166 may be separated from the driving electrodes 130 by the at least one insulating layer, and may be realized as an electrically floating island pattern. According to some embodiments, each of the first dummy patterns 166 may be provided to be separated from the electrode portion 162 in the same layer as the electrode portion 162. According to some embodiments, the first dummy patterns 166 may be formed of the same material as the electrode portions 162, but embodiments are not limited thereto.

According to some embodiments, the first dummy patterns 166 and the electrode portions 162 may have the same (or substantially the same) shape and size as each other. In this case, the active region 101 has an overall uniform pattern. Accordingly, it is possible to secure uniform visibility characteristics in the entire active region 101. Embodiments, however, are not limited thereto. For instance, the first dummy patterns 166 may not necessarily be provided, the first dummy patterns 166 may be selectively provided, etc. For example, in at least one other embodiment, the first dummy patterns 166 may not be provided.

Although FIG. 4 illustrates an embodiment in which each of the sensing electrodes 120, the driving electrodes 130, and the noise detecting electrodes 160 includes plate-like electrode cells 122 and 132 or electrode portions 162, embodiments are not limited thereto. For example, in at least one other embodiment, at least one of the sensing electrodes 120, the driving electrodes 130, and the noise detecting electrodes 160 may be formed of a mesh-shaped electrode.

The driving circuit 210 is electrically connected to the driving electrodes 130 to supply the driving signals Sdr to the driving electrodes 130. For example, the driving circuit 210 may sequentially supply the driving signals Sdr to the driving electrodes 130 during a period in which the touch sensor is activated. According to some embodiments, the driving signal Sdr may be an alternating current (AC) signal having a predetermined cycle, such as a pulse wave.

The sensing circuit 220 may include the plurality of sensing channels 222 receiving sense signals Sse1 from each of the sensing electrodes 120, the plurality of ADCs 224 electrically connected to the output terminals OUT1 of each of the sensing channels 222, and a processor 226 receiving converted signals (digital signals) from the ADCs 224 to detect a touch input.

According to some embodiments, each of the sensing channels 222 may include the first input terminal IN1 connected to any one the sensing electrodes 120, and the second input terminal IN2 connected to at least one noise detecting electrode 160. For example, the first input terminals IN1 of each of the sensing channels 222 may be connected to a different sensing electrode 120 among the sensing electrodes 120, and the second input terminals IN2 of each of the sensing channels 222 may be connected to at least one noise detecting electrode 160.

For example, the first and second input terminals IN1 and IN2 of each of the sensing channels 222 may be respectively connected to a pair of sensing electrode 120 and noise detecting electrode 160 corresponding to each other. For instance, the first input terminal IN1 of the first sensing channel 222 receiving the sensing signal Sse1 from the sensing electrode 120 positioned in the first row of the active region 101 may be connected to the sensing electrode 120 in the first row, and the second input terminal IN2 of the first sensing channel 222 may be electrically connected to the noise detecting electrode 160 in the first row. Each of the sensing channels 222 generates an output signal Sse2 corresponding to a voltage difference between the first and second input terminals IN1 and IN2. For example, each of the sensing channels 222 may amplify the sensing signal Sse1 input from the first input terminal IN1 using a potential of the noise signal Sno input to the second input terminal IN2, and may output an amplified signal as the output signal Sse2. That is, the sensing channels 222 may operate using the potential of the noise signal Sno as a reference, instead of operating using a predetermined reference potential (for example, a ground potential) that is a fixed reference.

Signals output, e.g., output signal Sse2, from the sensing channels 222 are input to at least one ADC 224 to be converted into digital signals, and then, are input to the processor 226. The processor 226 receives the output signals Sse2 of the sensing channels 222 through the ADC 224 and detects a touch input on the basis of the output signals Sse2.

As described above, the noise detecting electrodes 160 are additionally provided in addition to the electrodes for detecting the touch input, for example, the sensing electrodes 120 and the driving electrodes 130. The noise detecting electrodes 160 are isolated from the sensing electrodes 120 and the driving electrodes 130. Therefore, capacitances may be formed between the sensing electrodes 120, the driving electrodes 130, and/or the noise detecting electrodes 160.

According to some embodiments, the noise detecting electrodes 160 are electrically connected to the second input terminal IN2 (reference terminal) of each of the sensing channels 222. Accordingly, the reference voltages of each of the noise detecting electrodes 160 change together depending on voltage variations of each of the noise detecting electrodes 160. That is, the reference potentials of the sensing channels 222 may vary depending on the potentials (voltage levels) of the noise detecting electrodes 160. Potentials of the noise detecting electrodes 160 may change in accordance with the noise signals Sno input to the sensing unit 100 from the display panel 300 or the like. For example, the potentials of the noise detecting electrodes 160 may vary in correspondence with common mode noise input to the sensing unit 100 from the display panel 300 or the like.

Therefore, as previously described, as the noise detecting electrodes 160 are further provided in the active region 101, and a reference potential of the sensing channels 222 varies using output signals (for example, the noise signals Sno) from the noise detection electrodes 160, the common mode noise input to the sensing unit 100 may be canceled (or removed). For example, the pair of sensing electrode 120 and noise detecting electrode 160 have ripples corresponding to each other in correspondence with the common mode noise. That is, the pair of sensing electrode 120 and noise detecting electrode 160 extend in the same direction in the active region 101 and are disposed at positions corresponding to each other, and, thereby, receiving the noise signal Sno having very similar shape and/or size. In addition, each of the noise detecting electrodes 160 is electrically connected to different sensing channels 222 through different third wires 146. For example, the second input terminal IN2 of the sensing channel 222 in which the first input terminal IN1 is connected to a predetermined sensing electrode 120 is electrically connected to the noise detecting electrode 160 that is paired with the predetermined sensing electrode 120 through the predetermined third wire 146.

As such, if the first and second input terminals IN1 and IN2 of each sensing channel 222 are electrically connected to the sensing electrode 120 and the noise detecting electrode 160 corresponding to each other, respectively, noise components (e.g., ripples) contained in the sensing signals Sse1 from the sensing unit 100 may be effectively canceled in the sensing channel 222. Accordingly, each of the sensing channels 222 may output a sensing signal (or an output signal) Sse2 whose noise is removed (or reduced).

In addition, according to some embodiments, the electrode portion 162 of each of the noise detecting electrodes 160 is disposed inside each of the sensing electrodes 120, e.g., inside the first openings OP1. Thereby, it possible to secure a sufficient separation distance between the driving electrode 130 for receiving the driving signal Sdr and the noise detecting electrode 160 for receiving the noise signal Sno. Accordingly, it is possible to effectively detect the noise signal Sno by reducing or preventing voltage variation of the noise detecting electrode 160 caused by the driving signal Sdr.

In addition, in some embodiments, at least one first opening OP1 is formed in each of the sensing electrodes 120, and the electrode portions 162 of the noise detecting electrodes 160 are disposed inside the first openings OP1. In addition, according to some embodiments, the first opening OP1 may overlap with at least one electrode portion 162, as well as one region of at least one connection line 164 connected to the electrode portion 162. That is, according to some embodiments, the region where the sensing electrodes 120 and the noise detecting electrodes 160 overlap each other may be reduced or minimized. According to some embodiments, the parasitic capacitances between the sensing electrodes 120 and the noise detecting electrodes 160 may be reduced or minimized.

As previously described, according to some embodiments, it is possible to effectively cancel the noise signal Sno input to the sensing unit 100 of the touch sensor from the display panel 300 or the like, and to increase the signal-to-noise ratio (SNR). Accordingly, malfunction of the touch sensor due to the noise signal Sno may be minimized (or at least reduced), and the sensing sensitivity may be improved. That is, according to some embodiments, it is possible to provide a touch sensor with high sensitivity and a display device including the touch sensor. This may be usefully applied to a display device having a short distance between the sensing unit 100 and the display panel 300. For example, this may be usefully applied to increase touch sensitivity of an on-cell type display device that is sensitive to noise by directly forming the sensing electrodes 120 and the driving electrodes 130 on an upper substrate or a thin film sealing layer of the display panel 300. An application range is not limited thereto, and it is needless to say that the inventive concepts may be applied to various display devices and/or electronic devices.

Figure 5:
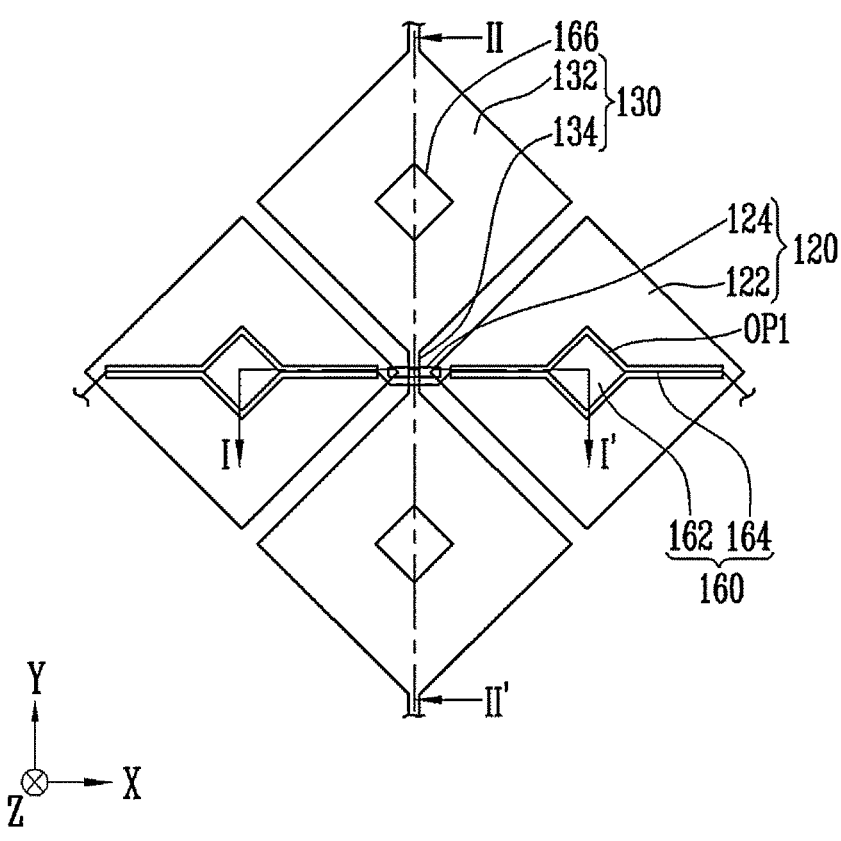
FIG. 5 illustrates an embodiment relating to the sensing unit illustrated in FIG. 4 according to some exemplary embodiments.
Figure 6A:
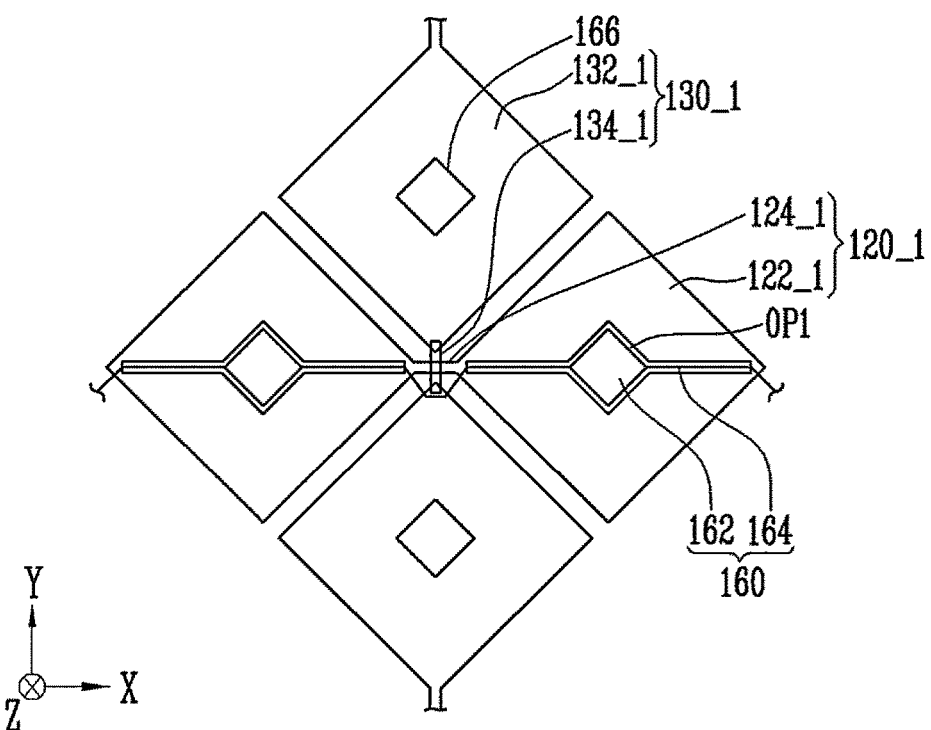
FIGS. 6A and 6B illustrate modified embodiments of the sensing unit illustrated in FIG. 5 according to some exemplary embodiments.
Figure 6B:
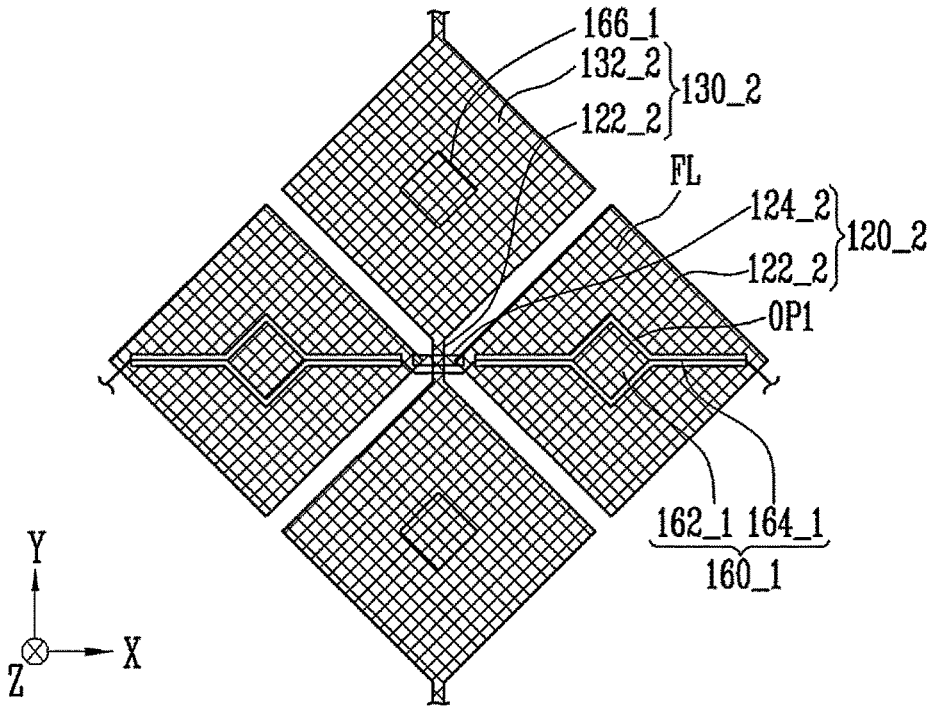
Figure 7A:
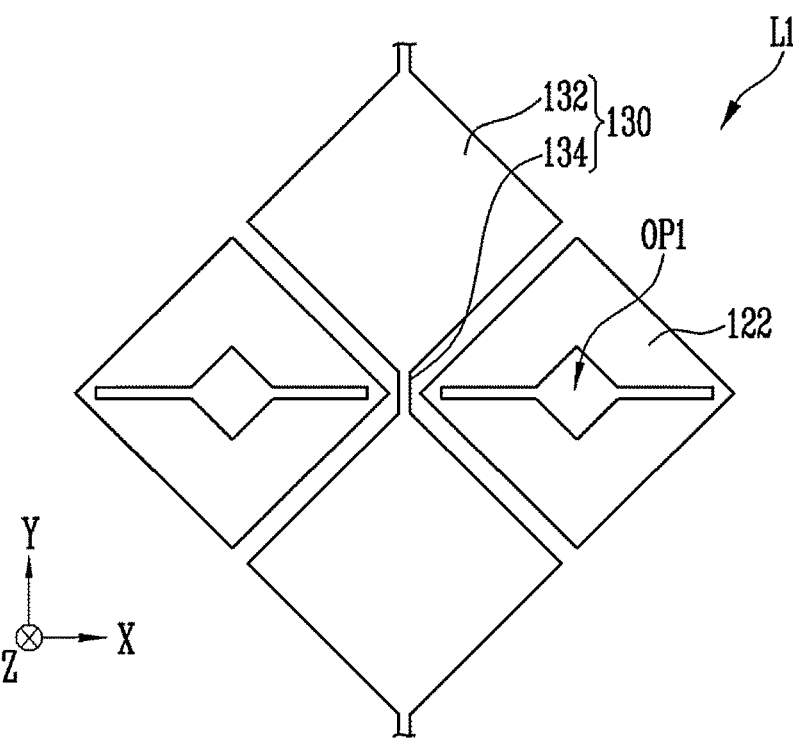
FIG. 7A illustrates a first layer of the sensing unit illustrated in FIG. 5 according to some exemplary embodiments.
Figure 7B:
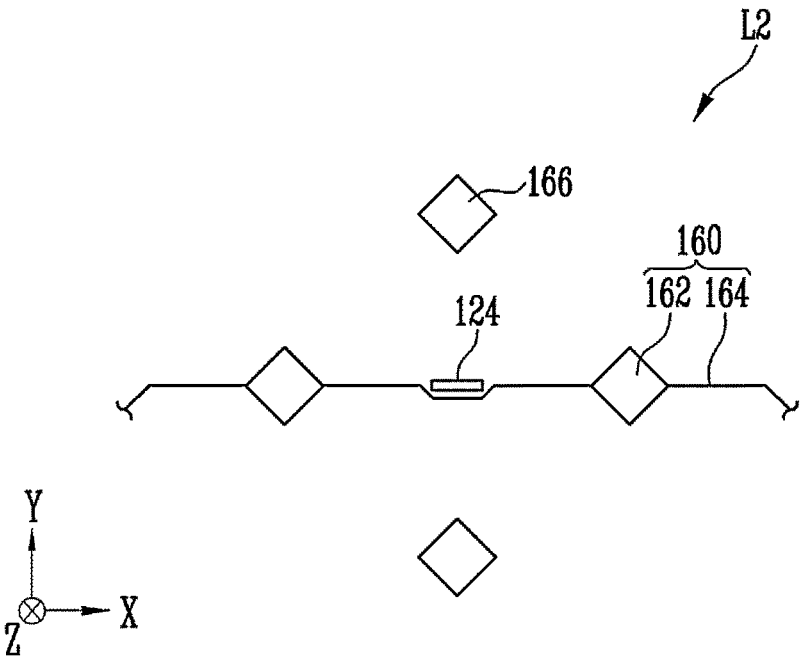
FIG. 7B illustrates a second layer of the sensing unit illustrated in FIG. 5 according to some exemplary embodiments.
Figure 8A:
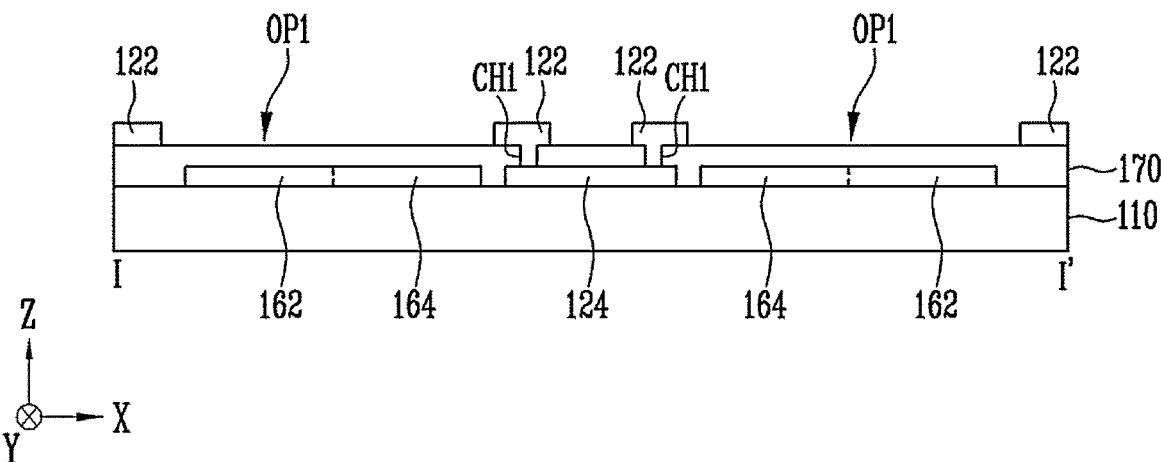
FIG. 8A illustrates an example of a cross-section taken along sectional line I-I' in FIG. 5 according to some exemplary embodiments.
Figure 8B:
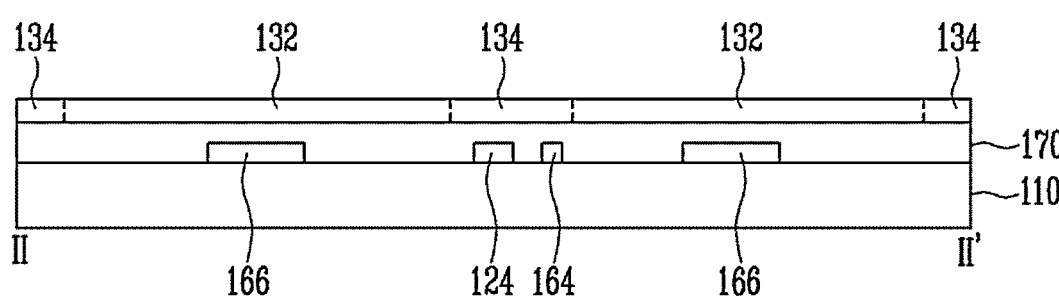
FIG. 8B illustrates an example of a cross-section taken along sectional line II-II' in FIG. 5 according to some exemplary embodiments.
Figure 8B:
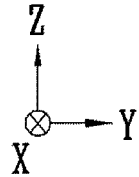
Figures 8C, 9:
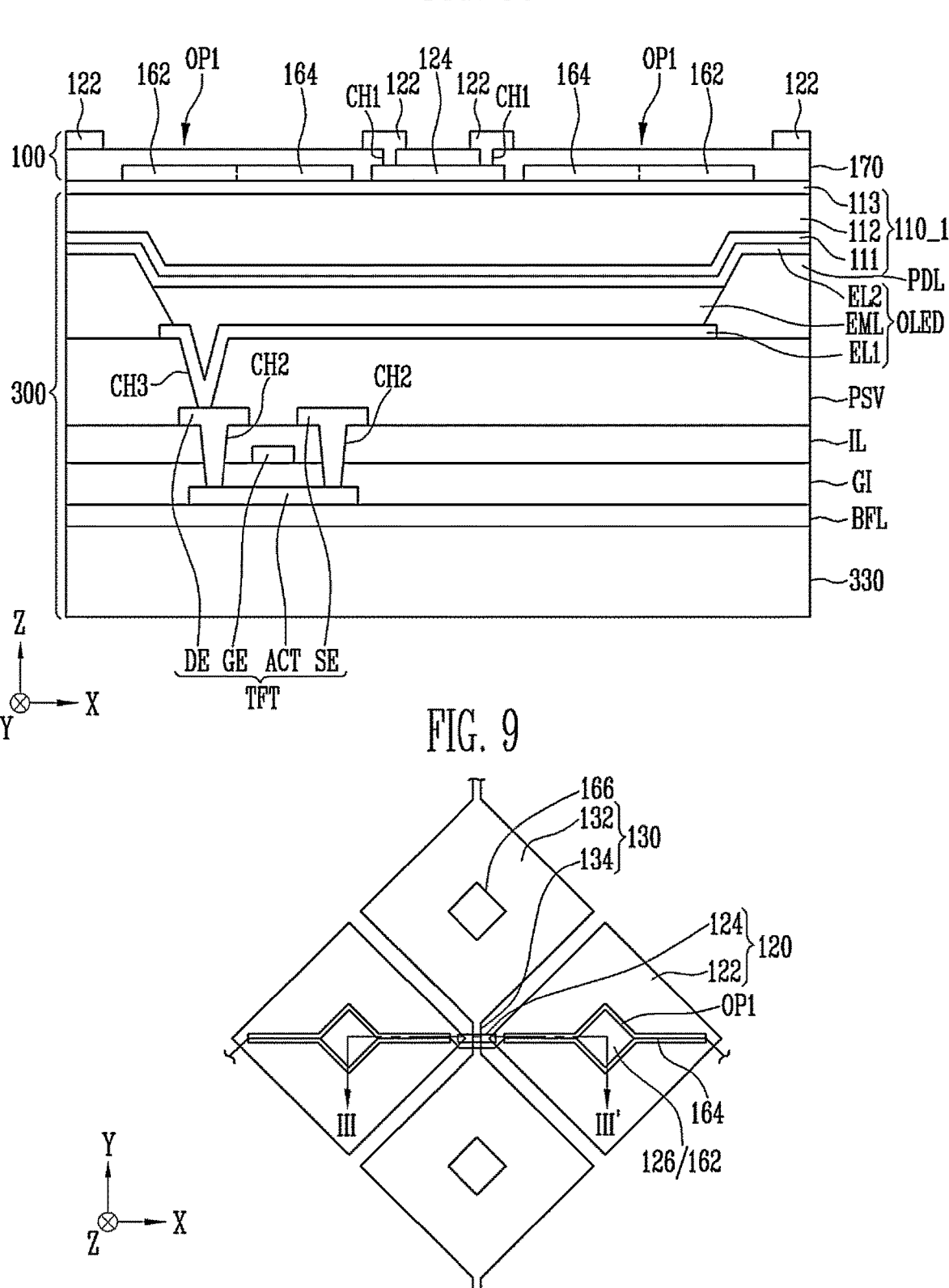
FIG. 8C illustrates an example of a cross-section of one region of a display device according to some exemplary embodiments.
FIG. 9 illustrates an embodiment relating to the sensing unit illustrated in FIG. 4 according to some exemplary embodiments.

FIG. 5 illustrates one embodiment relating to the sensing unit illustrated in FIG. 4 according to some exemplary embodiments, and FIGS. 6A and 6B respectively illustrate differently modified embodiments of the sensing unit illustrated in FIG. 5 according to various exemplary embodiments. FIG. 7A illustrates a first layer of the sensing unit illustrated in FIG. 5 according to some exemplary embodiments, and FIG. 7B illustrates a second layer of the sensing unit illustrated in FIG. 5 according to some exemplary embodiments. FIG. 8A illustrates an example of a cross-section taken along sectional line I-I' in FIG. 5 according to some exemplary embodiments, and FIG. 8B illustrates an example of a cross-section taken along sectional line II-II' in FIG. 5 according to some exemplary embodiments. FIG. 8C illustrates an example of a cross-section of one region of a display device according to some exemplary embodiments. That is, FIG. 8C shows an embodiment of an arrangement structure of the sensing unit 100 and the display panel 300 that are overlapped with each other in the display device. In FIGS. 5, 6A, 6B, 7A, 7B, and 8A to 8C, the configuration elements similar to or the same as those in FIG. 4 are denoted by the same (or similar) reference numerals or symbols, and a detailed description thereof will be omitted.

First, referring to FIGS. 5, 6A, 6B, 7A, 7B, 8A, and 8B, the first electrode cells 122, 122_1, or 122_2 and the second electrode cells 132, 132_1, or 132_2 may be disposed on the same layer. For example, the first electrode cells 122, 122_1, or 122_2 and the second electrode cells 132, 132_1, or 132_2 may be provided on a first layer L1 on the base substrate 110.

According to some embodiments, one of the first connection portions 124, 124_1, or 124_2 and the second connection portions 134, 134_1, or 134_2 may be disposed on the first layer L1 together with the first and second electrode cells 122, 122_1, or 122_2 and 132, 132_1, or 132_2. For example, as illustrated in FIGS. 5, 7A, 7B, 8A, and 8B, the second connection portions 134 are integrally connected to the second electrode cells 132 and are provided in the first layer L1, and the first connection portions 124 may be formed in a bridge-like connection pattern and provided in a second layer L2 different from the first layer L1. According to some embodiments, the first opening OP1 may be formed in an inner side of each of the first electrode cells 122, 122_1, or 122_2, for example, in at least the central region.

According to some embodiments, the first layer L1 and the second layer L2 may be separated from each other by interposing at least one insulating layer, for example, a first insulating layer 170 therebetween. The first connection portions 124, 124_1, or 124_2 may be connected to the first electrode cells 122, 122_1, or 122_2 by first contact holes CH1 passing through the first insulating layer 170. According to some embodiments, the second layer L2 may be positioned between the substrate 110 and the first layer L1. That is, the first connection portions 124, 124_1, or 124_2 may be formed as a lower bridge as illustrated in FIGS. 8A and 8B in association with first connection portion 124. However, embodiments are not limited thereto. For example, in at least one other embodiment, the positions of the first layer L1 and the second layer L2 may be reversed. That is, according to some embodiments, the first layer L1 may be disposed between the substrate 110 and the second layer L2, and the first connection portions 124, 124_1, or 124_2 may be formed as an upper bridge.

Alternatively, as illustrated in FIG. 6A, the first connection portions 124_1 may be integrally connected to the first electrode cells 122_1 and may be provided in the first layer L1. In this case, the second connection portions 134_1 may be formed in a bridge-like connection pattern, and may be provided in the second layer L2 as an example.

However, the inventive concepts are not limited to the embodiments illustrated in FIGS. 5, 6A, 6B, 7A, 7B, 8A, and 8B. For example, in at least one other embodiment, both the first and second connection portions 124, 124_1, or 124_2 and 134, 134_1, or 134_2 may be disposed in different layers from the first and second electrode cells 122, 122_1, or 122_2 and 132, 132_1, or 132_2, or may be disposed in different layers separated from each other. For example, in at least one other embodiment, the first electrode cells 122, 122_1, or 122_2 and the first connection portions 124, 124_1, or 124_2 configuring each sensing electrode 120, 120_1, or 120_2 may be integrally formed and provided in the first layer L1, and the second electrode cells 132, 132_1, or 132_2 and the second connection portions 134, 134_1, or 134_2 configuring each driving electrode 130, 130_1, or 130_2 may be integrally formed and provided in the second layer L2.

According to some embodiments, each of the electrode portions 162 or 162_1 may be disposed inside the first opening OP1 provided in any one of the first electrode cells 122, 122_1, or 122_2 and may be provided in a different layer from the first electrode cells 122, 122_1, or 122_2. For example, the electrode portions 162 or 162_1 may be provided in a layer different from the first electrode cells 122, 122_1, or 122_2 by interposing the first insulating layer 170 therebetween, and may be separated from the first electrode cells 122, 122_1, or 122_2. For example, the first electrode cells 122, 122_1, or 122_2 may be provided in the first layer L1 on the base substrate 110, and the electrode portions 162 or 162_1 may be provided in the second layer L2.

According to some embodiments, the connection lines 164 may be provided in the same layer as the electrode portions 162 or 162_1, for example, the second layer L2. In this case, the electrode portion 162 or 162_1 and the connection line 164 or 164_1 that configure each of the noise detecting electrodes 160 or 160_1 may be integrally connected.

In addition, according to some embodiments, the electrode portions 162 or 162_1 and the connection lines 164 or 164_1 may be disposed on the same layer as the first connection portions 124, 124_1, or 124_2. In this case, the electrode portions 162 or 162_1 and the connection lines 164 or 164_1 may be provided so as not to overlap the first connection portions 124, 124_1, or 124_2. For example, the connection lines 164 or 164_1 may bypass so as not to pass through a region where the first connection portions 124, 124_1, or 124_2 are provided, thereby, connecting adjacent two electrode portions 162 or 162_1. Thereby, the sensing electrodes 120, 120_1, or 120_2 and the noise detecting electrodes 160 or 160_1 may be kept insulated from each other.

According to some embodiments, the first dummy patterns 166 or 166_1 may be provided in the same layer as the electrode portions 162 or 162_1, for example, the second layer L2. In addition, the first dummy patterns 166 or 166_1 may have substantially the same shape and size as the electrode portions 162 or 162_1. In this case, the active region 101 may be viewed uniformly throughout.

Meanwhile, FIGS. 5 and 6A illustrate the first electrode cells 122 and 122_1, the second electrode cells 132 and 132_1, the first connection portions 124 and 124_1, the second connection portions 134 and 134_1, the electrode portions 162, and the first dummy patterns 166, each having a pattern of a plate shape or a bar shape, but the inventive concepts are not limited thereto. For example, at least one of the first electrode cells 122 and 122_1, the second 1000 electrode cells 132 and 132_1, the first connection portions 124 and 124_1, the second connection portions 134 and 134_1, the electrode portions 162, and the first dummy patterns 166 may be an electrode or a pattern of a mesh shape. That is, in at least one other embodiment, at least one of the sensing electrodes 120 and 120_1, the driving electrodes 130 and 130_1, the noise detecting electrodes 160, and the first dummy patterns 166 may be formed in a mesh shape.

1005 For example, as illustrated in FIG. 6B, each of the first and second electrode cells 122_2 and 132_2, the first and second connection portions 124_2 and 134_2, the electrode portions 162_1, and the first dummy patterns 166_1 may be an electrode or a pattern of a mesh shape, which includes a plurality of conductive fine lines FL. In addition, FIG. 6B illustrates each of the connection lines 164_1 in a shape of a single line, but, in some embodiments, each of the connection lines 164_1 may also be formed in a mesh shape including a plurality of conductive fine lines FL. In addition, FIG. 6B illustrates an embodiment in which the conductive fine lines FL are disposed in an oblique direction as an example, but a disposition direction and/or a shape of the conductive fine lines FL may be variously changed. In addition, if the first electrode cells 122_2 and the first connection portions 124_2 are disposed on different layers, according to some embodiments, the first electrode cell 122_2 and the connection portions 124_2 that configure each of the sensing electrodes 120_2 may be physically and/or electrically connected to each other through a contact hole (not illustrated).

Meanwhile, in at least one other embodiment, a part of the first electrode cells 122 or 122_1, the second electrode cells 132 or 132_1, the first connection portions 124 or 124_1, the second connection portions 134 or 134_1, the electrode portions 162, and the first dummy patterns 166 may be formed as an electrode or a pattern of a plate shape or a bar shape, and the rest may be formed in a mesh shape. That is, shapes and structures of the sensing electrodes 120, 120_1, and 120_2, the driving electrodes 130, 130_1, and 130_2, the noise detecting electrodes 160 and 160_1, and the first dummy patterns 166 and 166_1 may be modified in various forms.

In the embodiments of FIGS. 5, 6A, 6B, 7A, 7B, 8A, and 8B, each of the first openings OP1 overlaps at least one electrode portion 162 or 162_1 disposed inside each first electrode cell 122, 122_1, or 122_2. In addition, each of the first openings OP1 overlaps one region of at least one connection line 164 or 164_1 connected to at least one end (for example, both ends) of any one electrode portion 162 or 162_1. Meanwhile, one region of the first electrode cell 122, 122_1, or 122_2 may overlap one region of the noise detecting electrode 160 or 160_1 so as to prevent each of the first electrode cell 122, 122_1, or 122_2 from being separated from the noise detecting electrode 160 or 160_1. For example, each of the first electrode cells 122, 122_1, or 122_2 may overlap one region of the connection line 164 or 164_1 at both ends adjacent to the first connection portions 124, 124_1, or 124_2 and the second connection portions 134, 134_1, or 134_2, thereby, preventing an upper portion and a lower portion of the first electrode cell 122, 122_1, or 122_2 from being separated from each other.

According to various embodiments, it is possible to decrease or minimize parasitic capacitances that may be formed between the noise detecting electrodes 160 or 160_1, the sensing electrodes 120, 120_1, or 120_2, and/or the driving electrodes 130, 130_1, or 130_2. Accordingly, it is possible to prevent a touch sensor from malfunctioning and to effectively detect the noise signal Sno.

Meanwhile, according to some embodiments, the base substrate 110 serving as a base of the sensing unit 100 may be a thin film sealing layer of an organic light emitting display panel. In this case, the base substrate 110 may be formed as multiple layers including at least one organic layer and at least one inorganic layer, or may be configured with a single layer including a combination of organic materials. For example, the base substrate 110 may be configured with multiple layers including at least two inorganic layers and at least one organic layer interposed between the at least two inorganic layers. As such, in a display device in which the base substrate 110 is configured with a thin film sealing layer of the organic light emitting display panel, sensor patterns configuring the sensing unit 100 and display patterns configuring the display panel 300 may be disposed on different surfaces of the base substrate 110.

Hereinafter, an embodiment of a disposition structure of sensor patterns provided in the sensing unit 100 and the display patterns provided in the display panel 300 will be described with reference to FIG. 8C. For the sake of convenience, a structure of the sensing unit 100 is illustrated in FIG. 8C in the same manner as illustrated in FIG. 8A, but the structure of the sensing unit 100 is not limited thereto. In order to avoid redundant description, detailed description of the structure of the sensing unit 100 will be omitted in describing FIG. 8C.

Referring to FIG. 8C, the sensing unit 100 may be formed and/or provided directly on the thin film sealing layer 110_1 of the display panel (particularly, an organic light emitting display panel) 300. Accordingly, a sensor-display integrated organic light emitting display panel may be provided. That is, according to some embodiments, the base substrate 110 of the sensing unit 100 described above may be the thin film sealing layer 110_1 of the display panel 300, and thus, similar reference numerals or symbols will be given thereto. For the sake of convenience, FIG. 8C illustrates only one light emitting element (for example, organic light emitting diode) OLED and one thin film transistor TFT connected thereto, among pixel patterns provided in each pixel region of the display panel 300.

According to some embodiments, the display panel 300 includes a first substrate 330, a light emitting element OLED provided on one surface of the first substrate 330, and a thin-film sealing layer 110_1 that is provided on the light emitting element OLED and covers at least the light emitting element OLED. In addition, according to some embodiments, the display panel 300 may further include at least one thin film transistor TFT connected to the light emitting element OLED. According to some embodiments, the thin film transistor TFT may be positioned between the first substrate 330 and the light emitting element OLED. In addition, the display panel 300 may further include at least one power supply line, a signal line, and/or a capacitor, none of which are not illustrated in FIG. 8C.

According to some embodiments, the first substrate 330 may be a rigid substrate and/or a soft (or pliable) substrate, and a material thereof is not limited in particular. For example, the first substrate 330 may be a thin film substrate with flexible characteristics. A buffer layer BFL is provided on one surface of the first substrate 330. The buffer layer BFL may prevent impurities from diffusing from the first substrate 330 and improve flatness of the first substrate 330. According to some embodiments, the buffer layer BFL may be provided as a single layer, but may also be provided as at least two or more layers, or a composite layer of two or more materials. According to some embodiments, the buffer layer BFL may be an inorganic insulating layer formed of an inorganic material. For example, the buffer layer BFL may be formed of at least one of silicon nitride, silicon oxide, silicon oxynitride, and the like. If the buffer layer BFL is provided as multiple layers, each layer may be formed of the same material or different materials. Meanwhile, in at least one other embodiment, the buffer layer BFL may be omitted.

The thin film transistor TFT is provided on the buffer layer BFL. The thin film transistor TFT includes an active layer ACT, a gate electrode GE, a source electrode SE, and a drain electrode DE. According to some embodiments, the active layer ACT may be provided on the buffer layer BFL and may be formed of a semiconductor material. For example, the active layer ACT may be a semiconductor pattern formed of polysilicon, amorphous silicon, an oxide semiconductor, or the like, and may be formed of a semiconductor layer doped with impurities or undoped. Alternatively, one region (for example, a region overlapping the gate electrode GE) of the active layer ACT may not be doped with impurities, and the remaining regions may be doped with impurities.

According to some embodiments, a gate insulating layer GI may be provided on the active layer ACT, and the gate electrode GE may be provided on the gate insulating layer GI. In addition, an interlayer insulating layer IL may be provided on the gate electrode GE and the gate insulating layer GI, and the source electrode SE and the drain electrode DE may be provided on the interlayer insulating layer IL. The source electrode SE and the drain electrode DE may be connected to different ends of the active layer ACT by the respective second contact holes CH2 passing through the gate insulating layer GI and the interlayer insulating layer IL.

According to some embodiments, a passivation layer PSV is provided on the source electrode SE and the drain electrode DE. The passivation layer PSV may cover the thin film transistor TFT, and an upper surface of the passivation layer PSV may be planarized.

According to some embodiments, the light emitting element OLED is provided on the passivation layer PSV. The light emitting element OLED may include a first electrode EL1, a second electrode EL2, and a light emitting layer EML interposed between the first and second electrodes EL1 and EL2. According to some embodiments, the first electrode EL1 of the light emitting element OLED may be an anode electrode, but is not limited thereto. The first electrode EL1 of the light emitting element OLED is connected to one electrode of the thin film transistor TFT, for example, the drain electrode DE, through a third contact hole CH3 passing through the passivation layer PSV.

A pixel defining layer PDL for partitioning each pixel region (or light emitting regions of each pixel) is provided on one surface of the first substrate 330 in which the first electrode EL1 of the light emitting element OLED is formed. According to some embodiments, the pixel defining layer PDL may expose an upper surface (or a portion of the upper surface) of the first electrode EL1, and may protrude from the first substrate 330 along the periphery of each pixel region. In this manner, the pixel defining layer PDL may cover edge portions of the first electrode EL1.

The light emitting layer EML is provided in a pixel region surrounded by the pixel defining layer PDL. For example, the light emitting layer EML may be disposed on an exposed surface of the first electrode EL1. According to some embodiments, the light emitting layer EML may have a multilayer thin film structure including at least a light generation layer. For example, the light emitting layer EML may include at least some of a hole injection layer (HIL), a hole transport layer (HTL), a light generation layer, a hole blocking layer (HBL), an electron transport layer (ETL), and an electron injection layer (EIL). According to some embodiments, the color of light generated in the light emitting layer EML may be one of red, green, blue, and white, but the inventive concepts are not limited thereto. For example, the color of light generated in the light emitting layer EML may be one of magenta, cyan, and yellow.

According to some embodiments, the second electrode EL2 of the light emitting element OLED may be disposed on the light emitting layer EML. According to some embodiments, the second electrode EL2 of the light emitting element OLED may be a cathode electrode, but is not limited thereto.

According to some embodiments, the thin film sealing layer 110_1 covering the second electrode EL2 of the light emitting element OLED may be provided on the second electrode EL2 of the light emitting element OLED. If the pixel region of the display panel 300 is sealed with the thin film sealing layer 110_1, a thickness of the display device may be reduced and flexible characteristics may be secured.

According to some embodiments, the thin film sealing layer 110_1 may have a multilayer or single layer structure. For example, the thin film sealing layer 110_1 may include a first inorganic layer 111 and a second inorganic layer 113 that overlap each other, and an organic layer 112 interposed between the first and second inorganic layers 111 and 113. Alternatively, in at least one other embodiment, the thin film sealing layer 110_1 may be a single layer including an organic or inorganic material.

According to some embodiments, the organic layer 112 may have a greater thickness than the first and second inorganic layers 111 and 113. For example, the organic layer 112 may have a thickness of approximately 4 μm to 10 μm, and each of the first and second inorganic layers 111 and 113 may have a thickness of 8000 Å to 10000 Å.

According to various embodiments, the display panel 300 may be realized as an organic light emitting display panel having the thin film sealing layer 110_1, and sensor patterns of the sensing unit 100 may be directly formed on the thin film sealing layer 110_1. For example, the sensing electrodes 120, the driving electrodes 130, the noise detecting electrodes 160, and/or the first dummy patterns 166 may be directly provided on the thin-film sealing layer 110_1.

In this case, the sensor patterns are positioned close to the display patterns provided in the display panel 300, particularly, the second electrode EL2 of the light emitting element OLED. Accordingly, a noise signal from the second electrode EL2 of the light emitting element OLED may be input to the sensor patterns. However, in various embodiments, the noise signal is effectively canceled using the noise detecting electrodes 160 as described above. As such, although the sensor-dispcv d xzlay integrated panel is formed as illustrated in FIG. 8C and the organic layer 112 of the thin film sealing layer 110_1 is formed to a thickness of less than or equal to 10 μm, sensitivity of the touch sensor can be sufficiently secured. For example, if a noise reduction/canceling structure according to some embodiments is applied, the sensitivity of the touch sensor can be sufficiently secured although the entire thickness of the thin film sealing layer 110_1 is designed to be less than or equal to 10 μm.

Figure 10A:
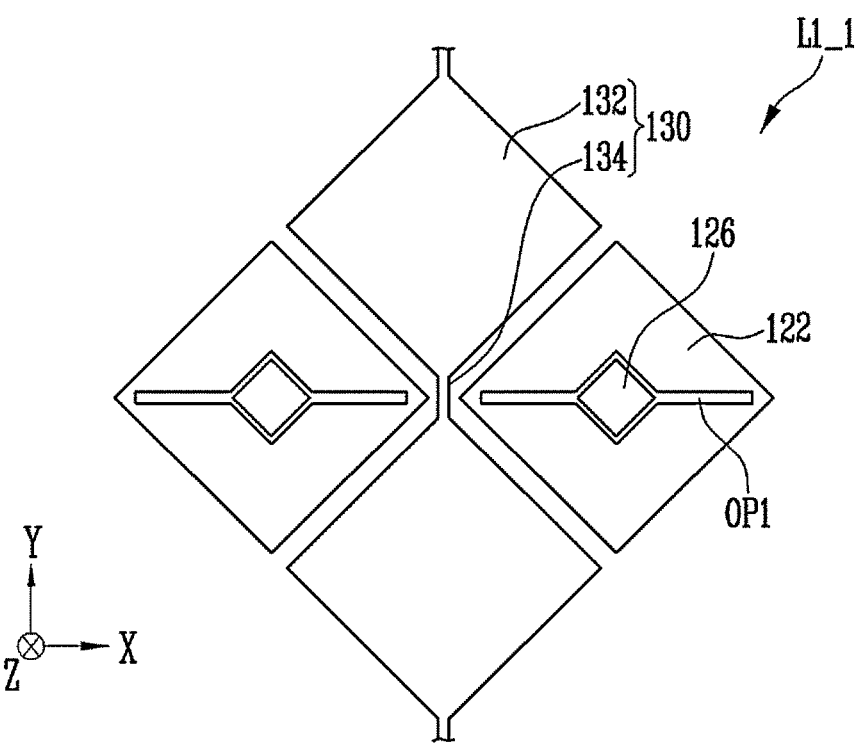
FIG. 10A illustrates a first layer of the sensing unit illustrated in FIG. 9 according to some exemplary embodiments.
Figure 10B:
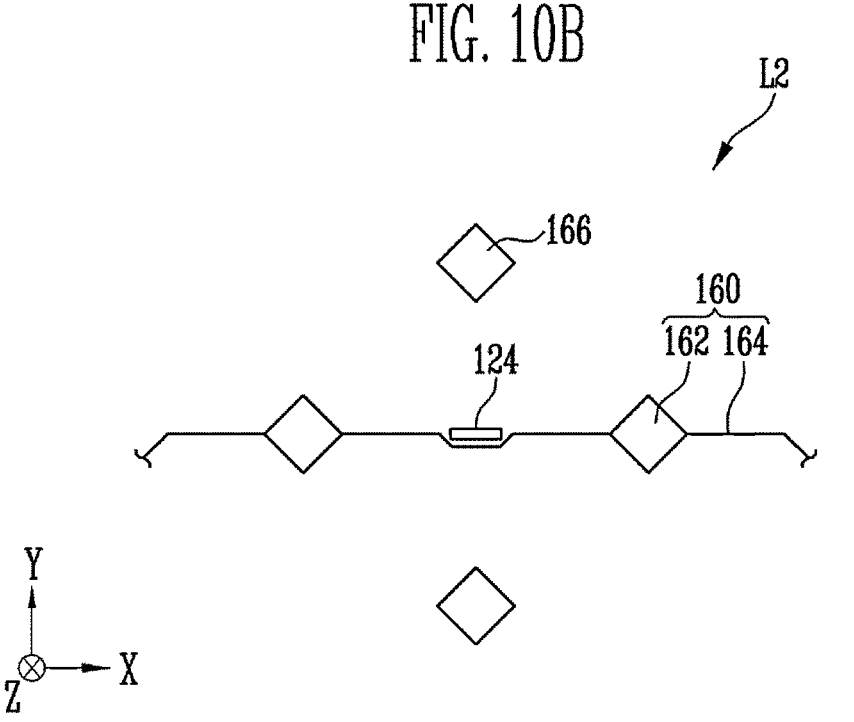
FIG. 10B illustrates a second layer of the sensing unit illustrated in FIG. 9 according to some exemplary embodiments.
Figure 11:
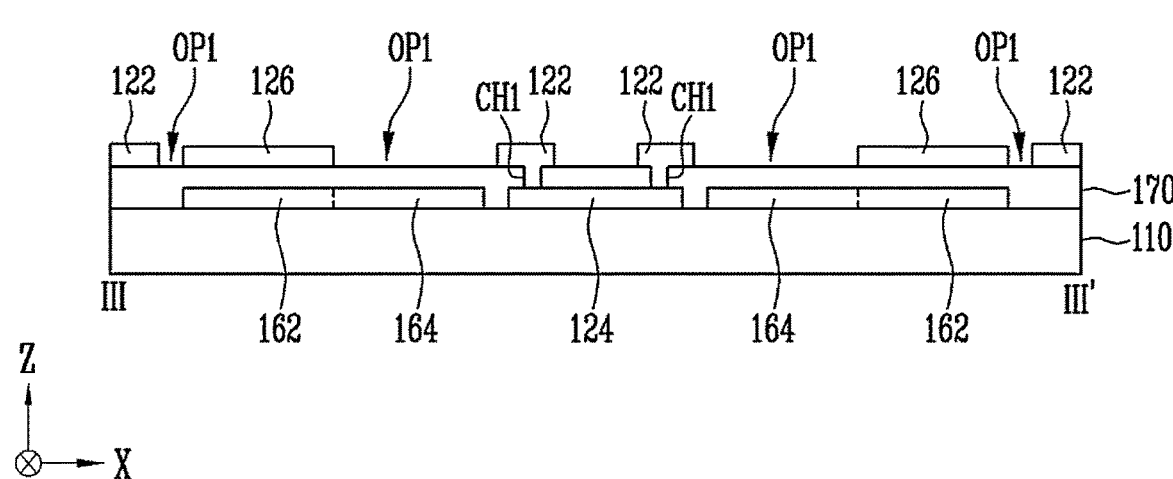
FIG. 11 illustrates an example of a cross-section taken along sectional line III-III' in FIG. 9 according to some exemplary embodiments.

FIG. 9 illustrates an embodiment relating to the sensing unit illustrated in FIG. 4 according to some exemplary embodiments. FIG. 10A illustrates a first layer of the sensing unit illustrated in FIG. 9 according to some exemplary embodiments, and FIG. 10B illustrates a second layer of the sensing unit illustrated in FIG. 9 according to some exemplary embodiments. FIG. 11 illustrates an example of a cross-section taken along sectional line III-III' of FIG. 9 according to some exemplary embodiments. In FIGS. 9, 10A, 10B, and 11, configuration elements similar to or the same as those in FIGS. 4, 5, 6A, 6B, 7A, 7B, 8A, and 8B are denoted by the same or similar reference numerals or symbols, and duplicative detailed descriptions will be omitted.

Referring to FIGS. 9, 10A, 10B, and 11, the touch sensor may further include a plurality of second dummy patterns 126 provided in the sensing unit 100 so as to overlap the electrode portions 162. According to some embodiments, the second dummy patterns 126 are provided to overlap the electrode portions 162 in the first openings OP1 of each of the first electrode cells 122, and may be provided to be separated from the first electrode cells 122 and the electrodes portions 162. For example, the second dummy patterns 126 may be provided in the same layer (for example, the first layer L1_1) as the first electrode cells 122 as a pattern of a floating island shape in a state of being separated from the first electrode cells 122. According to some embodiments, the second dummy patterns 126 may be formed of the same material as the first electrode cells 122, but the inventive concepts are not limited thereto. Accordingly, the active region 101 may be viewed uniformly throughout while the parasitic capacitance that may be formed between the noise detecting electrodes 160, the sensing electrodes 120, and/or the driving electrodes 130 is reduced.

Figure 12:
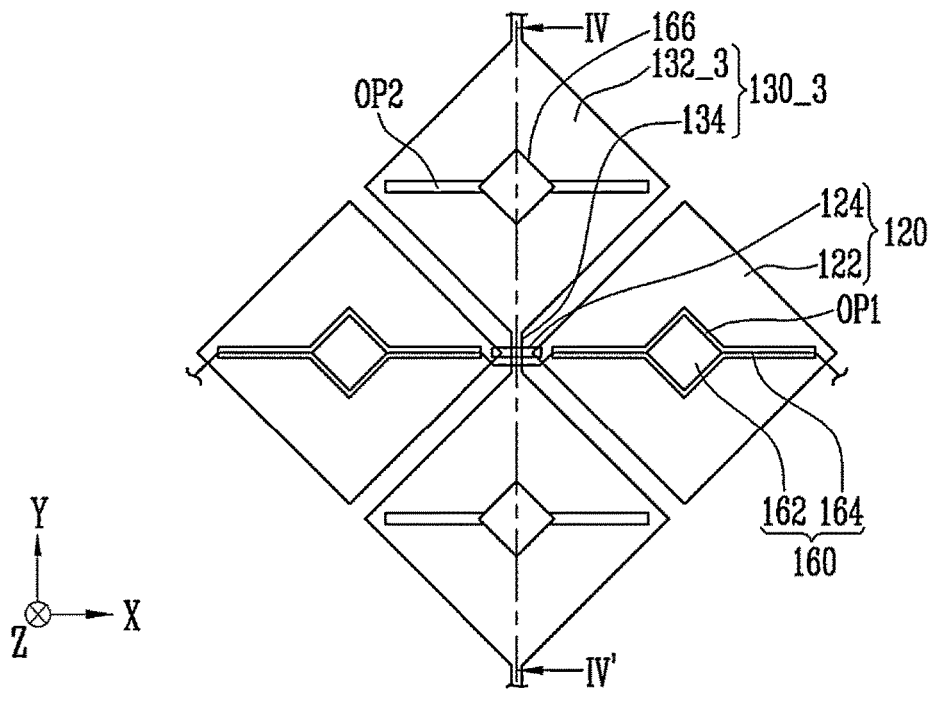
FIG. 12 illustrates an embodiment relating to the sensing unit illustrated in FIG. 4 according to some exemplary embodiments.
Figure 13A:
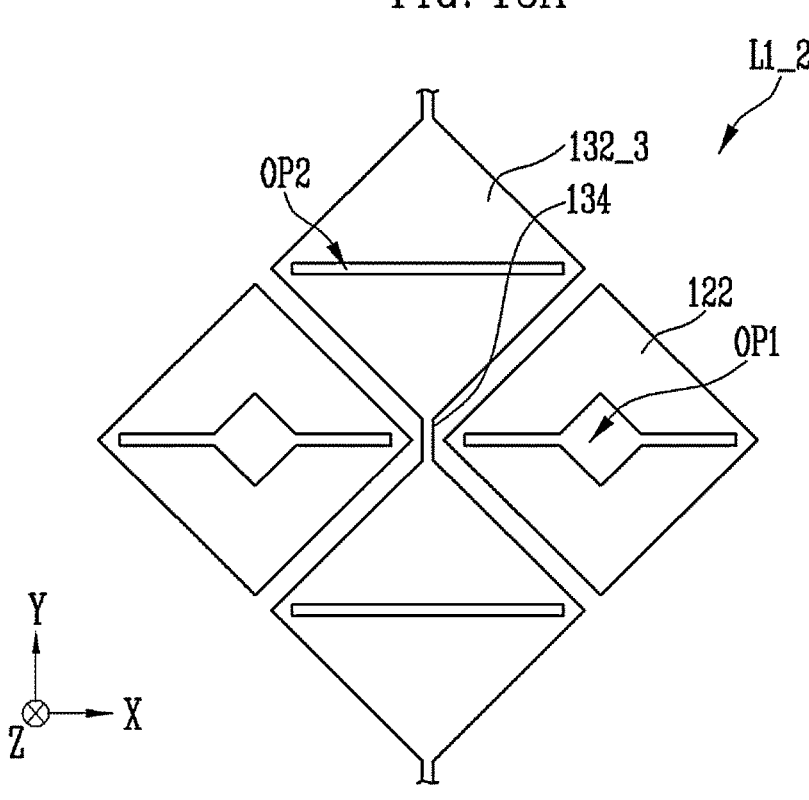
FIG. 13A illustrates a first layer of the sensing unit illustrated in FIG. 12 according to some exemplary embodiments.
Figure 13B:
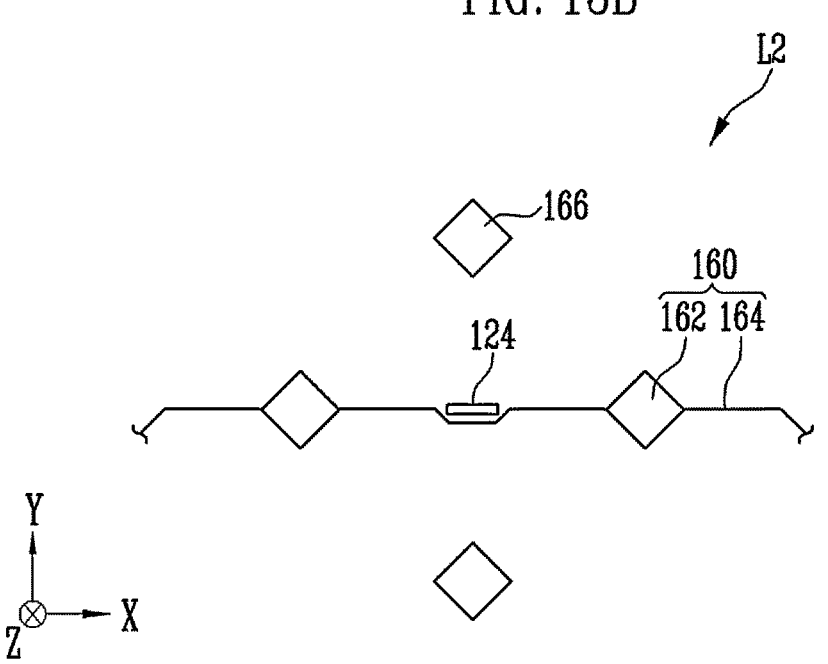
FIG. 13B illustrates a second layer of the sensing unit illustrated in FIG. 12 according to some exemplary embodiments.
Figure 14:
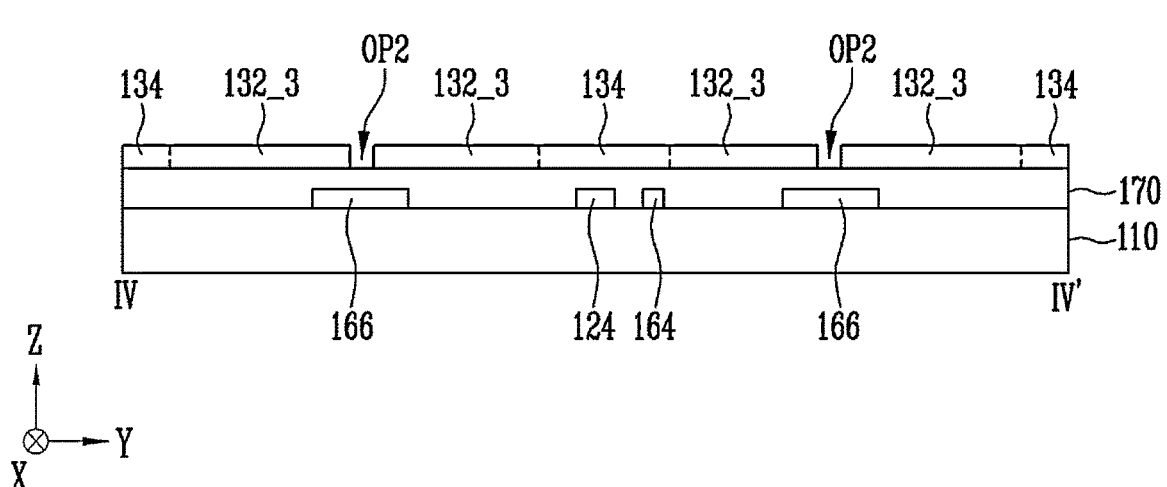
FIG. 14 illustrates an example of a cross-section taken along sectional line IV-IV' in FIG. 12 according to some exemplary embodiments.

FIG. 12 illustrates an embodiment relating to the sensing unit illustrated in FIG. 4 according to some exemplary embodiments. FIG. 13A illustrates the first layer of the sensing unit illustrated in FIG. 12 according to some exemplary embodiments, and FIG. 13B illustrates the second layer of the sensing unit illustrated in FIG. 12 according to some exemplary embodiments. FIG. 14 illustrates an example of a cross-section taken along sectional line IV-IV' of FIG. 12 according to some exemplary embodiments. In FIGS. 12 to 14, configuration elements similar to or the same as those in FIGS. 4, 5, 6A, 6B, 7A, 7B, 8A, and 8B are denoted by the same or similar reference numerals or symbols, and duplicative detailed descriptions will be omitted.

Referring to FIGS. 12, 13A, 13B, and 14, each of the driving electrodes 130_3 may include at least one second opening OP2, and may be disposed in the first layer L1_2. For example, each of the second electrode cells 132_3 may include at least one second opening OP2.

According to some embodiments, each second opening OP2 may have a shape and/or a size similar to each of the first openings OP1. For example, each of the second openings OP2 may extend in the same direction as the longitudinal direction (for example, the X direction) of each of the first openings OP1. However, the shape and/or size of the second opening OP2 may ne variously changed depending on considerations of visible characteristics of the active region 101. Accordingly, the active region 101 can be viewed uniformly throughout, while the parasitic capacitance that may be formed between the noise detecting electrodes 160, the sensing electrodes 120, and/or the driving electrodes 130_3 is reduced.

Figure 15:
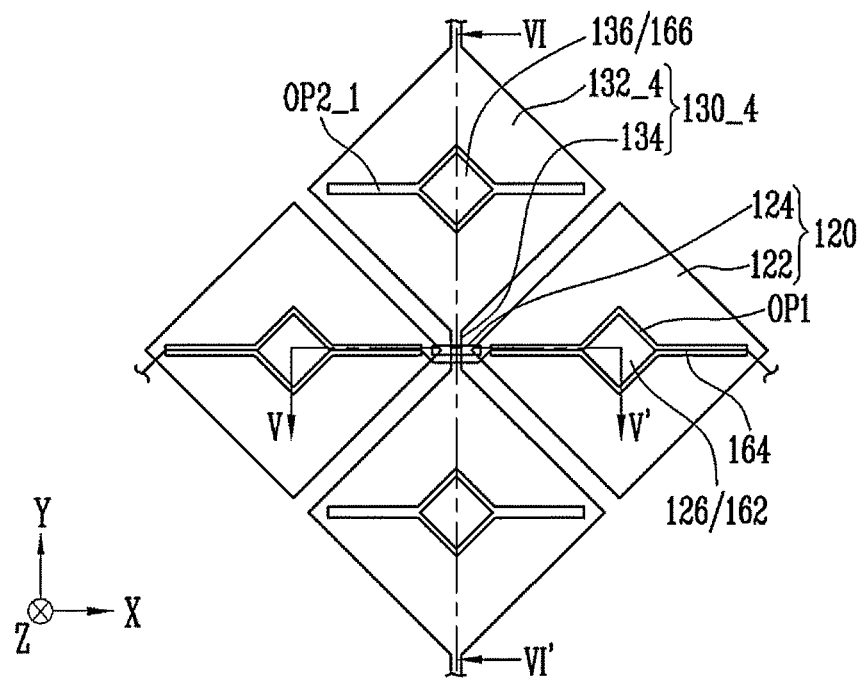
FIG. 15 illustrates an embodiment relating to the sensing unit illustrated in FIG. 4 according to some exemplary embodiments.
Figure 16A:
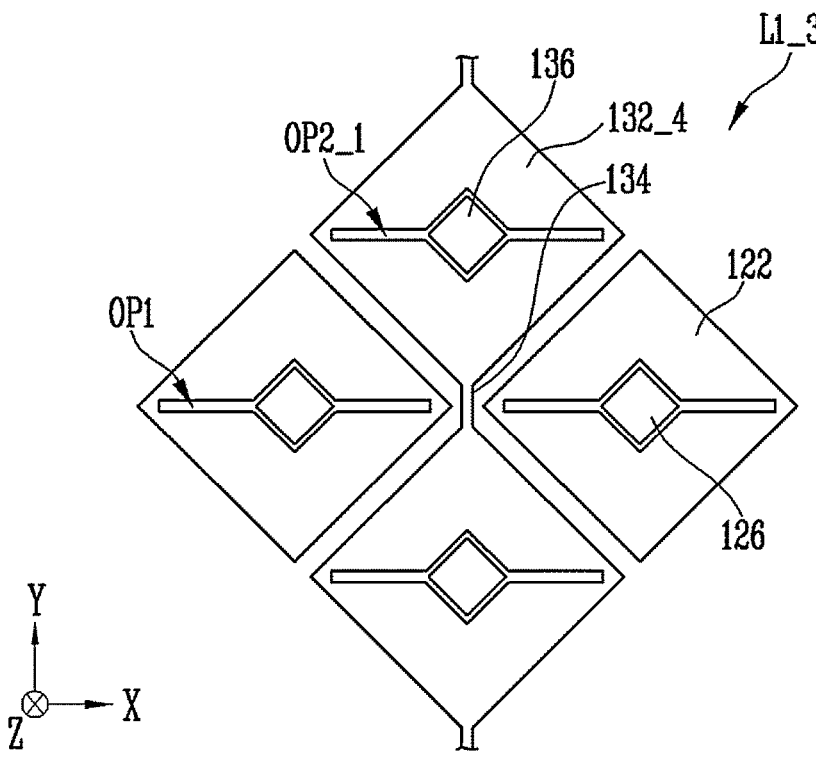
FIG. 16A illustrates a first layer of the sensing unit illustrated in FIG. 15 according to some exemplary embodiments.
Figure 16B:
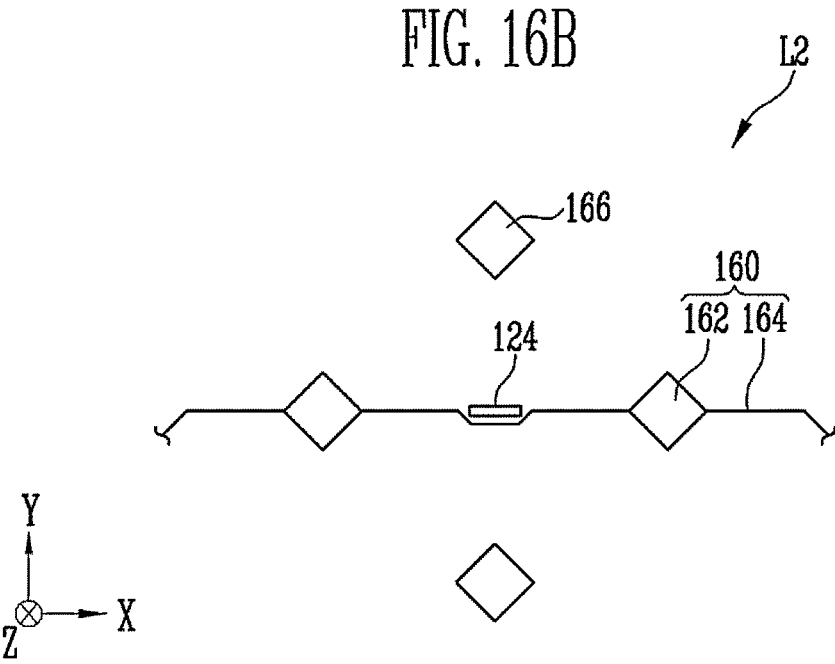
FIG. 16B illustrates a second layer of the sensing unit illustrated in FIG. 15 according to some exemplary embodiments.
Figure 17A:
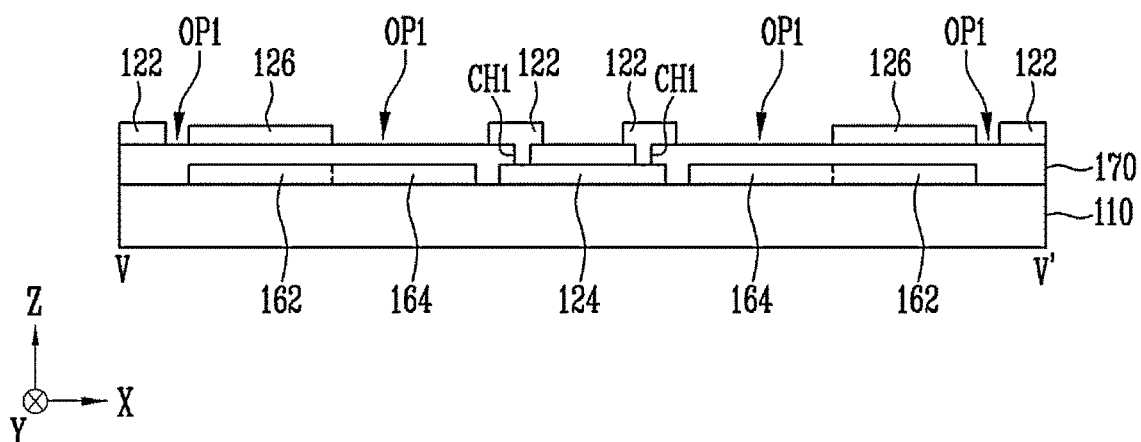
FIG. 17A illustrates an example of a cross-section taken along sectional line V-V' in FIG. 15 according to some exemplary embodiments.
Figure 17B:
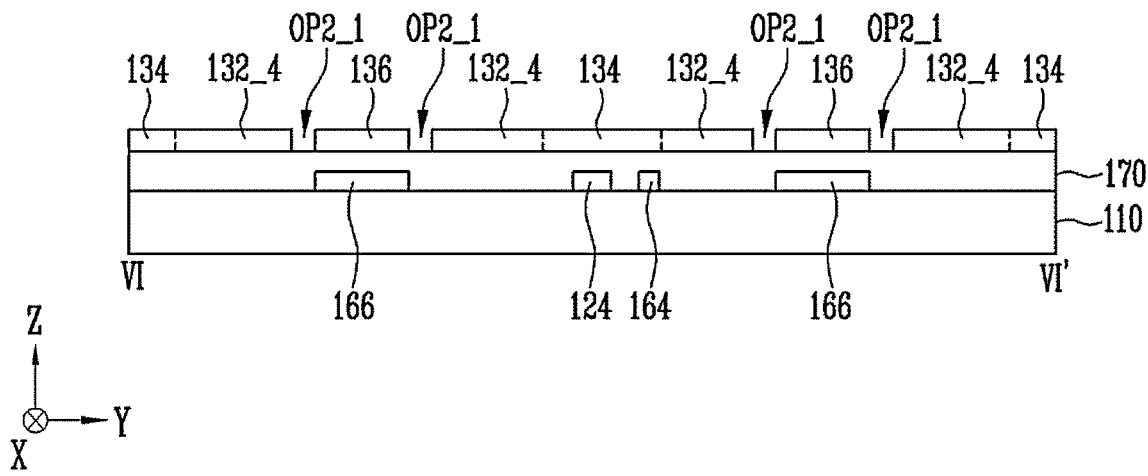
FIG. 17B illustrates an example of a cross-section taken along sectional line VI-VI' in FIG. 15 according to some exemplary embodiments.

FIG. 15 illustrates an embodiment relating to the sensing unit illustrated in FIG. 4 according to some exemplary embodiments. FIG. 16A illustrates the first layer of the sensing unit illustrated in FIG. 15 according to some exemplary embodiments, and FIG. 16B illustrates the second layer of the sensing unit illustrated in FIG. 15 according to some exemplary embodiments. FIG. 17A illustrates an example of a cross-section taken along sectional line V-V' of FIG. 15 according to some exemplary embodiments, and FIG. 17B illustrates an example of a cross-section taken along sectional line VI-VI' of FIG. 15 according to some exemplary embodiments. In FIGS. 15, 16A, 16B, 17A, and 17B, configuration elements similar to or the same as those previously described are denoted by the same or similar reference numerals or symbols, and duplicative detailed descriptions will be omitted.

Referring to FIGS. 15, 16A, 16B, 17A, and 17B, each of the driving electrodes 130_4 may include a second opening OP2_1 corresponding to the first opening OP1 included in the sensing electrode 120. For example, each of the second electrode cells 132_4 may include the second opening OP2_1 having substantially the same size and shape as the first opening OP1. In addition, the sensing unit 100 may further include a plurality of second dummy patterns 126 and a plurality of third dummy patterns 136. For example, each of the second dummy patterns 126 may be disposed in each of the first openings OP1, and each of the third dummy patterns 136 may be disposed in each of the second openings OP2_1.

According to some embodiments, the second dummy patterns 126 may be provided to overlap the electrode portions 162 in the first openings OP1 of each of the first electrode cells 122, and may be provided to be separated from the first electrode cells 122 and the electrodes portions 162. For example, the second dummy patterns 126 may be formed in the same layer (for example, the first layer L1_3) as the first electrode cells 122 as a pattern of a floating island shape in a state of being separated from the first electrode cells 122.

According to some embodiments, the third dummy patterns 136 may be provided to overlap with the first dummy patterns 166 in the second openings OP2_1 of each of the second electrode cells 132_4, and may be provided to be separated from the second electrode cells 132_4 and the first dummy patterns 166. For example, the third dummy patterns 136 may be disposed in the same layer (for example, the first layer L1_3) as the second electrode cells 132_4 in a state of being separated from the second electrode cells 132_4. That is, the third dummy patterns 136 may be disposed in the inside (for example, a region surrounded by the driving electrodes 130_4) of the driving electrodes 130_4, and may be provided in a pattern of a floating island shape in a state of being separated from the driving electrodes 130_4. According to some embodiments, the third dummy patterns 136 may be formed of the same material as the first electrode cells 122 and/or the second electrode cells 132_4, but embodiments are not limited thereto.

Accordingly, more uniform visibility characteristics may be secured throughout the active region 101 by uniformly distributing uniformly shaped patterns in the active region 101. However, the parasitic capacitance that may be formed between the noise detecting electrodes 160, the sensing electrodes 120, and/or the driving electrodes 130_3 may be reduced.

Figure 18:
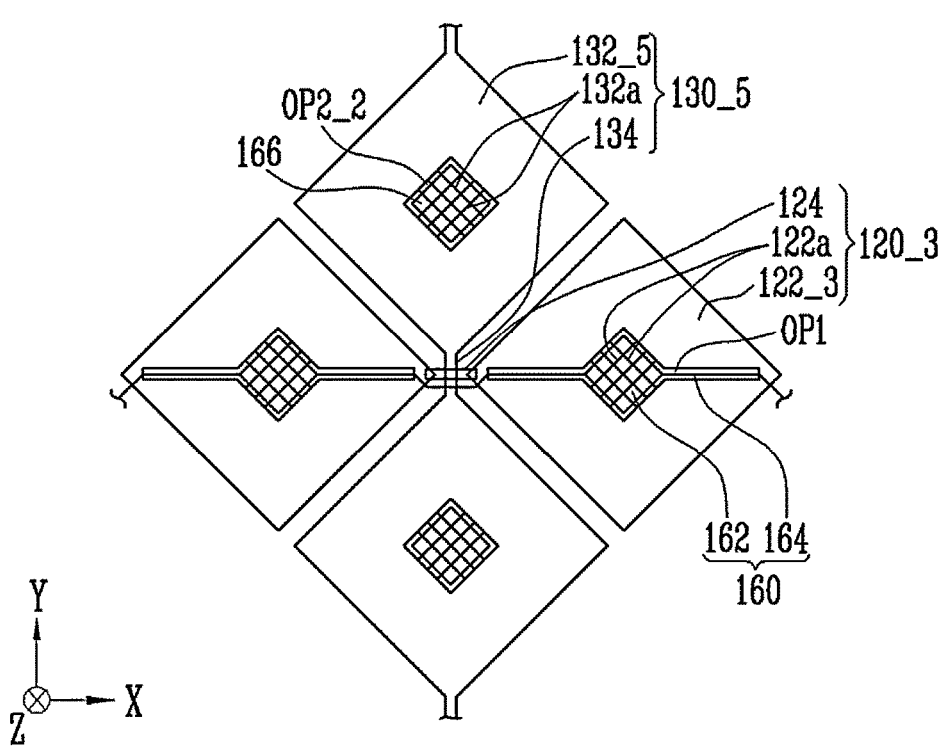
FIG. 18 illustrates an embodiment relating to the sensing unit illustrated in FIG. 4 according to some exemplary embodiments.
Figure 19A:
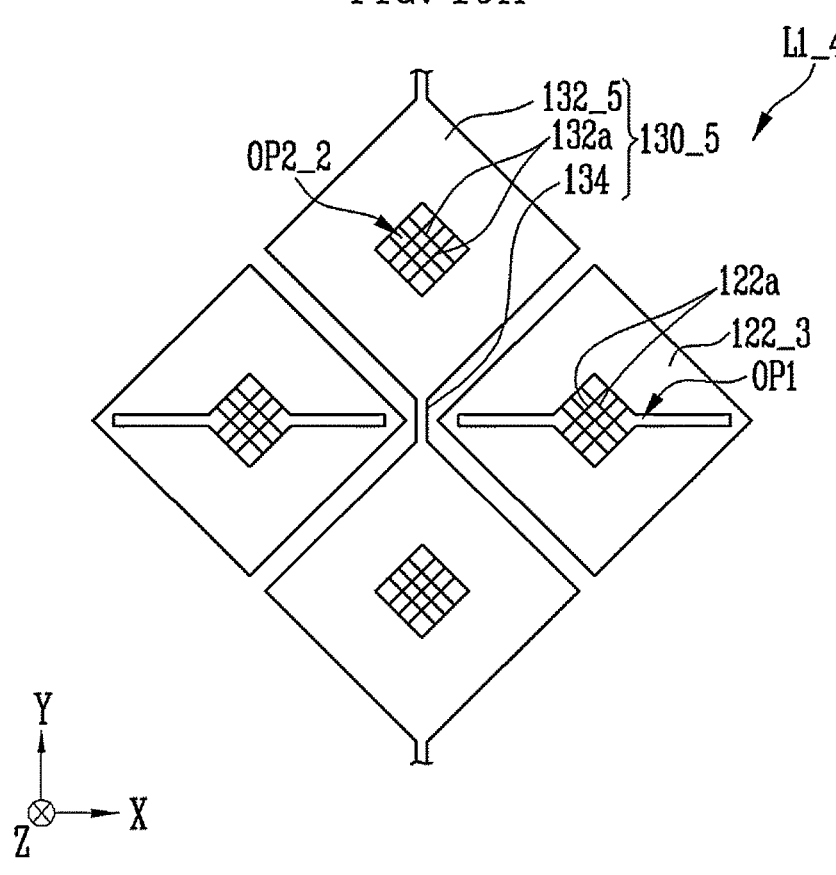
FIG. 19A illustrates a first layer of the sensing unit illustrated in FIG. 18 according to some exemplary embodiments.
Figure 19B:
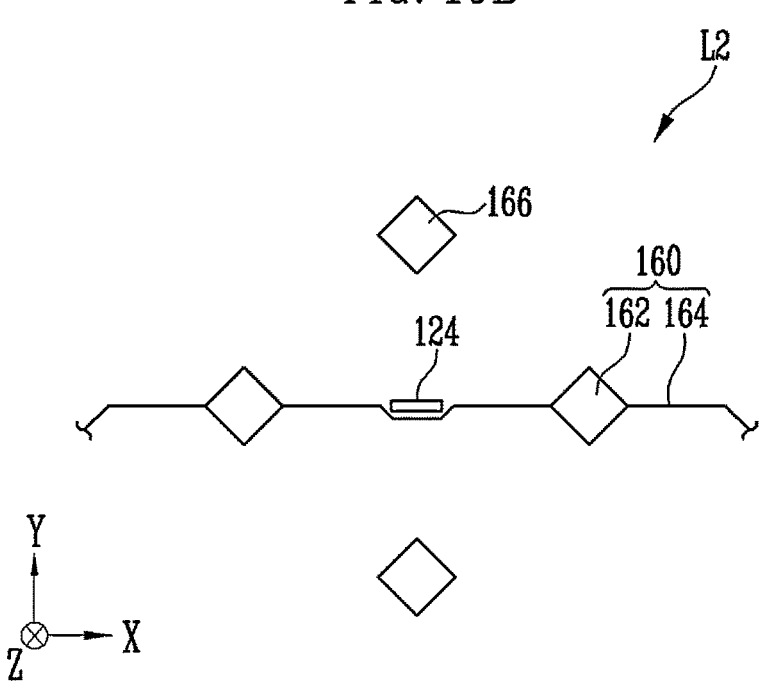
FIG. 19B illustrates a second layer of the sensing unit illustrated in FIG. 18 according to some exemplary embodiments.

FIG. 18 illustrates an embodiment relating to the sensing unit illustrated in FIG. 4 according to some exemplary embodiments. FIG. 19A illustrates the first layer of the sensing unit illustrated in FIG. 18 according to some exemplary embodiments, and FIG. 19B illustrates the second layer of the sensing unit illustrated in FIG. 18 according to some exemplary embodiments. In FIGS. 18, 19A, and 19B, configuration elements similar to or the same as those of the aforementioned embodiments are denoted by the same or similar reference numerals or symbols, and duplicative detailed descriptions will be omitted.

Referring to FIGS. 18, 19A, and 19B, the first layer L1_4 includes each of the first electrode cells 122_3 including the first openings OP1 in a region overlapping each of the electrode portions 162, and each of the second electrode cells 132_5 including the second opening OP2_2 in a region overlapping each of the first dummy patterns 166. In addition, in some embodiments, each of the first electrode cells 122_3 and the second electrode cells 132_5 may have a mesh shaped pattern in a region overlapping the electrode portions 162 and the first dummy patterns 166, and may overlap one region of the electrode portions 162 and the first dummy patterns 166. 1265

For example, each of the first electrode cells 122_3 may overlap one region of the electrode portion 162 provided in the first opening OP1, and may have mesh-shaped fine lines 122a crossing the first opening OP1 in at least two directions. In addition, each of the second electrode cells 132_5 may overlap one region of the first dummy patterns 166 provided in the 1270 second opening OP2_2, and may have mesh-shaped fine lines 132a crossing the second opening OP2_2 in at least two directions.

According to some embodiments, the first opening OP1 is formed in the sensing electrode 120_3 so as to minimize an overlap of the sensing electrode 120_3 and the noise detecting electrode 160, and one region (that is, the fine lines 122a) of the first electrode cells 122_3 is disposed in a part of the region where the electrode portion 162 of the noise detecting electrode 160 is disposed. Accordingly, it is possible to increase sensitivity of the touch sensor by providing a uniform sensitivity throughout the active region 101. In addition, more uniform visibility characteristics can be secured throughout the active region 101 by uniformly distributing uniformly shaped patterns in the active region 101.

Figure 20:
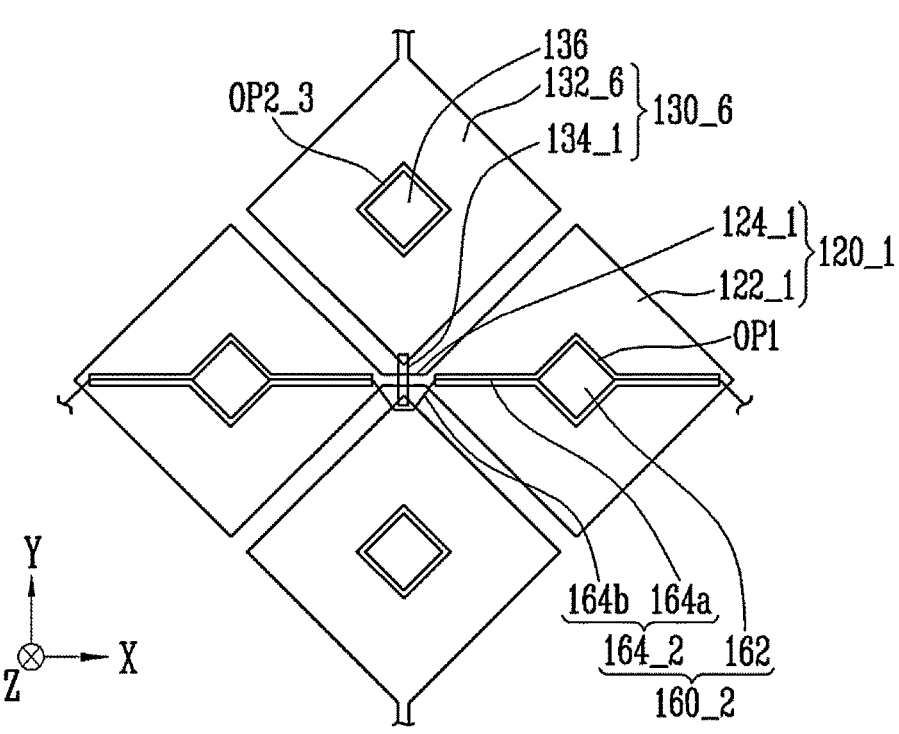
FIG. 20 illustrates an embodiment relating to the sensing unit illustrated in FIG. 4 according to some exemplary embodiments.
Figure 21A:
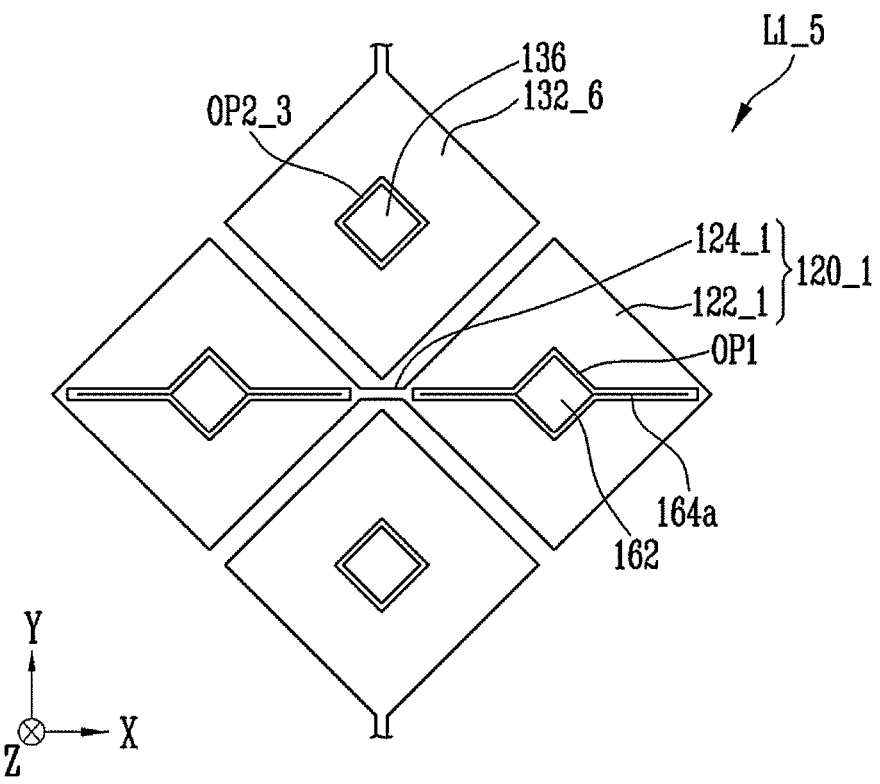
FIG. 21A illustrates a first layer of the sensing unit illustrated in FIG. 20 according to some exemplary embodiments.
Figure 21B:
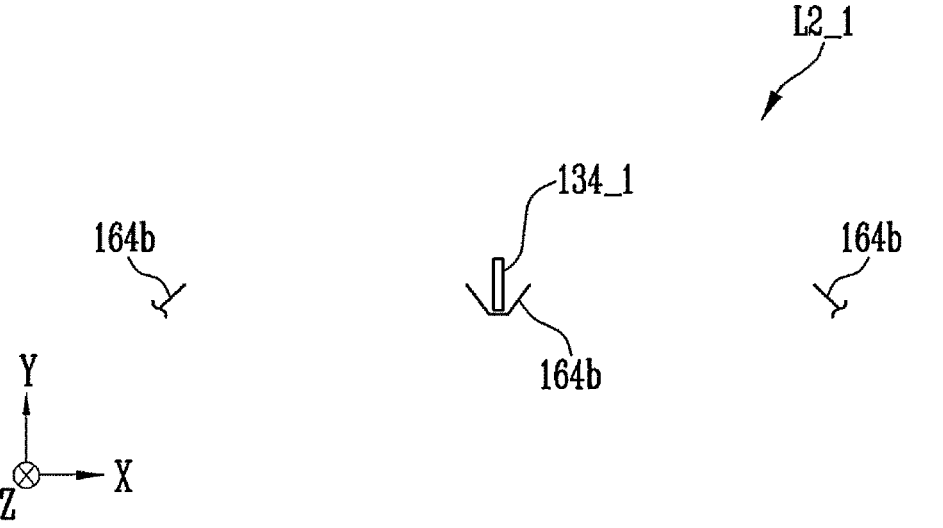
FIG. 21B illustrates a second layer of the sensing unit illustrated in FIG. 20 according to some exemplary embodiments.

FIG. 20 illustrates an embodiment relating to the sensing unit illustrated in FIG. 4 according to some exemplary embodiments. FIG. 21A illustrates the first layer of the sensing unit illustrated in FIG. 20 according to some exemplary embodiments, and FIG. 21B illustrates the second layer of the sensing unit illustrated in FIG. 20 according to some exemplary embodiments. In FIGS. 20, 21A, and 21B, configuration elements similar to or the same as those previously described are denoted by the same or similar reference numerals or symbols, and duplicative detailed descriptions will be omitted.

Referring to FIGS. 20, 21A, and 21B, each of the first electrode cells 122_1 and the second electrode cells 132_6 includes the first opening OP1 and the second opening OP2_3, respectively. According to some embodiments, each of the electrode portions 162 and one region of the connection lines 164_2 connected thereto may be disposed in each of the first openings OP1, and each of the third dummy patterns 136 may be disposed in each of the second openings OP2_3.

According to some embodiments, the electrode portions 162 of the noise detecting electrodes 160_2 may be disposed in the same layer as the first electrode cells 122_1, for example, in the first layer L1_5, but may be disposed to be separated from the first electrode cells 122_1. In addition, according to some embodiments, the connection lines 164_2 may be disposed in a different layer from the first electrode cells 122_1 by interposing at least one insulating layer (for example, the first insulating layer 170 described above) therebetween in a region overlapping at least the first electrode cells 122_1. For example, the connection lines 164_2 may be disposed in the second layer L2_1 separated from the first layer L1_5 by the first insulating layer 170 in a region overlapping at least the first electrode cells 122_1.

Meanwhile, another region of the connection lines 164_2, for example, at least a part of a region overlapping each of the first openings OP1 may be disposed in the same layer as the electrode portions 162 and may be integrally connected to any one of the electrode portions 162. For example, one region of each of the connection lines 164_2 may overlap the first opening OP1 disposed in any one of the first electrode cells 122_1 and may be provided in the same layer as the electrode portion 162 disposed in the first opening OP1 to be integrally connected to the electrode portion 162. In this case, each of the connection lines 164_2 may include a first sub-connection line 164a provided in the first layer L1_5, and a second sub-connection line 164b provided in the second layer L2_1. The first sub-connection line 164a and the second sub-connection line 164b may be connected to each other through at least one contact hole (not illustrated).

Figure 22:
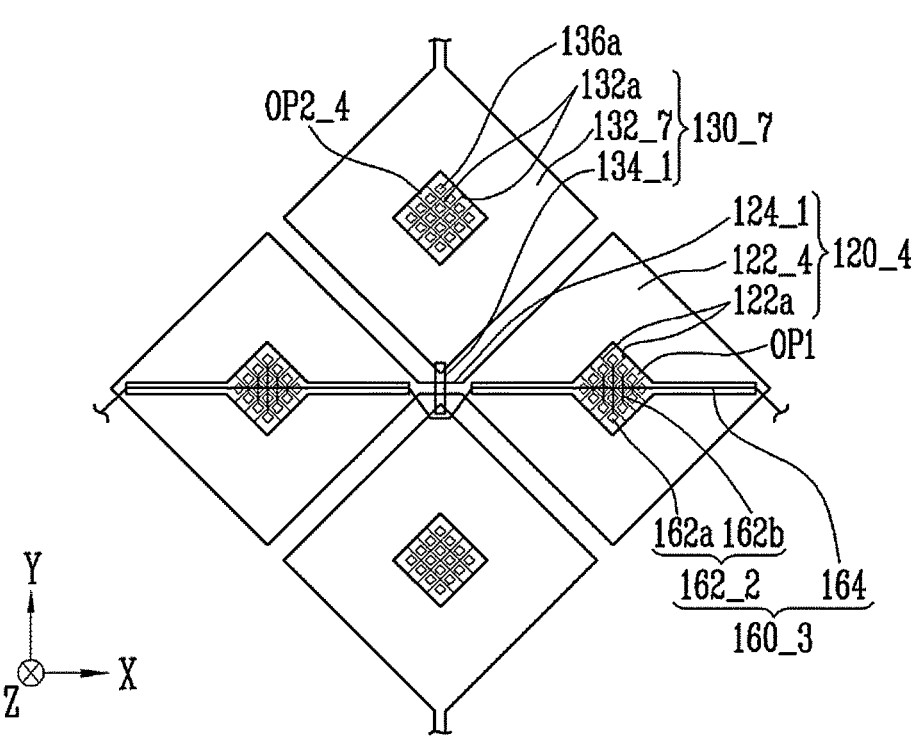
FIG. 22 illustrates an embodiment relating to the sensing unit illustrated in FIG. 4 according to some exemplary embodiments.
Figures 23A, 23B:
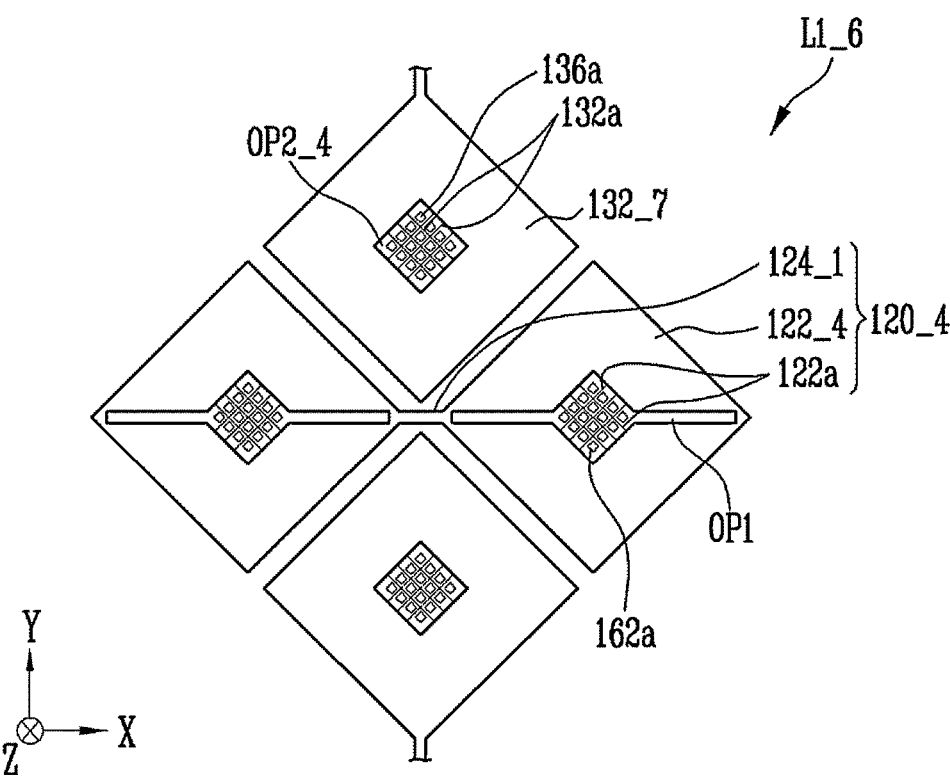
FIG. 23A illustrates a first layer of the sensing unit illustrated in FIG. 22 according to some exemplary embodiments.
FIG. 23B illustrates a second layer of the sensing unit illustrated in FIG. 22 according to some exemplary embodiments.

FIG. 22 illustrates an embodiment relating to the sensing unit illustrated in FIG. 4 according to some exemplary embodiments. FIG. 23A illustrates the first layer of the sensing unit illustrated in FIG. 22 according to some exemplary embodiments, and FIG. 23B illustrates the second layer of the sensing unit illustrated in FIG. 22 according to some exemplary embodiments. In FIGS. 22, 23A, and 23B, configuration elements similar to or the same as those previously described are denoted by the same or similar reference numerals or symbols, and duplicative detailed descriptions will be omitted.

Referring to FIGS. 22, 23A, and 23B, the first electrode cells 122_4 of the sensing electrodes 120_4 and the second electrode cells 132_7 of the driving electrodes 130_7 have the same mesh shaped pattern as in FIGS. 18, 19A, and 19B, and the electrode portions 162_2 and the third dummy patterns 136a may be disposed in the same layer (e.g., the first layer L1_6) as the first electrode cells 122_4 and the second electrode cells 132_7 in the same manner as in FIGS. 20, 21A, and 21B. That is, in FIGS. 22, 23A, and 23B, each of the first electrode cells 122_4 and the second electrode cells 132_7 may have a plurality of fine lines 122a and 132a crossing the first opening OP1 and the second opening OP2_4. In this case, each of the electrode portions 162_2 may be divided into a plurality of sub-electrode portions 162a and may be separated from the first electrode cells 122_4. The sub-electrode portions 162a disposed in the same first opening OP1 may be electrically connected to each other through a plurality of sub-electrode lines 162b disposed in a layer different from the first electrode cells 122_4, such as the second layer L2_2, as illustrated in FIGS. 23A and 23B.

That is, each of the electrode portions 162_2 may include a plurality of sub-electrode portions 162a that are provided so as to be separated from each other in a region between the fine lines 122a of the first electrode cells 122_4 and are provided in the same layer as the first electrode cells 122_4, and a plurality of sub-electrode lines 162b that are separated from the fine lines 122a of the first electrode cells 122_4 by interposing at least one insulating layer (for example, the first insulating layer 170) therebetween and electrically connect the sub-electrode portions 162a. According to some embodiments, the sub-electrode line 162b may be disposed in the same layer (for example, the second layer L2_2) as the connection line 164 configuring the same noise detecting electrode 160_3 and may be integrally connected to the connection line 164.

In the same manner as previously described, the touch sensor according to various embodiments may include the noise detecting electrodes 160_3 provided in the active region 101 of the sensing unit 100 so as to detect the noise signal Sno. In addition, the sensing unit 100 includes the first opening OP1 for reducing the parasitic capacitances between the noise detecting electrodes 160_3, the sensing electrodes 120_4, and/or the driving electrodes 130_7. According to some embodiments, the sensing unit 100 may be realized in various forms so as to secure high touch sensitivity and/or uniform visibility characteristics.

Figure 24:
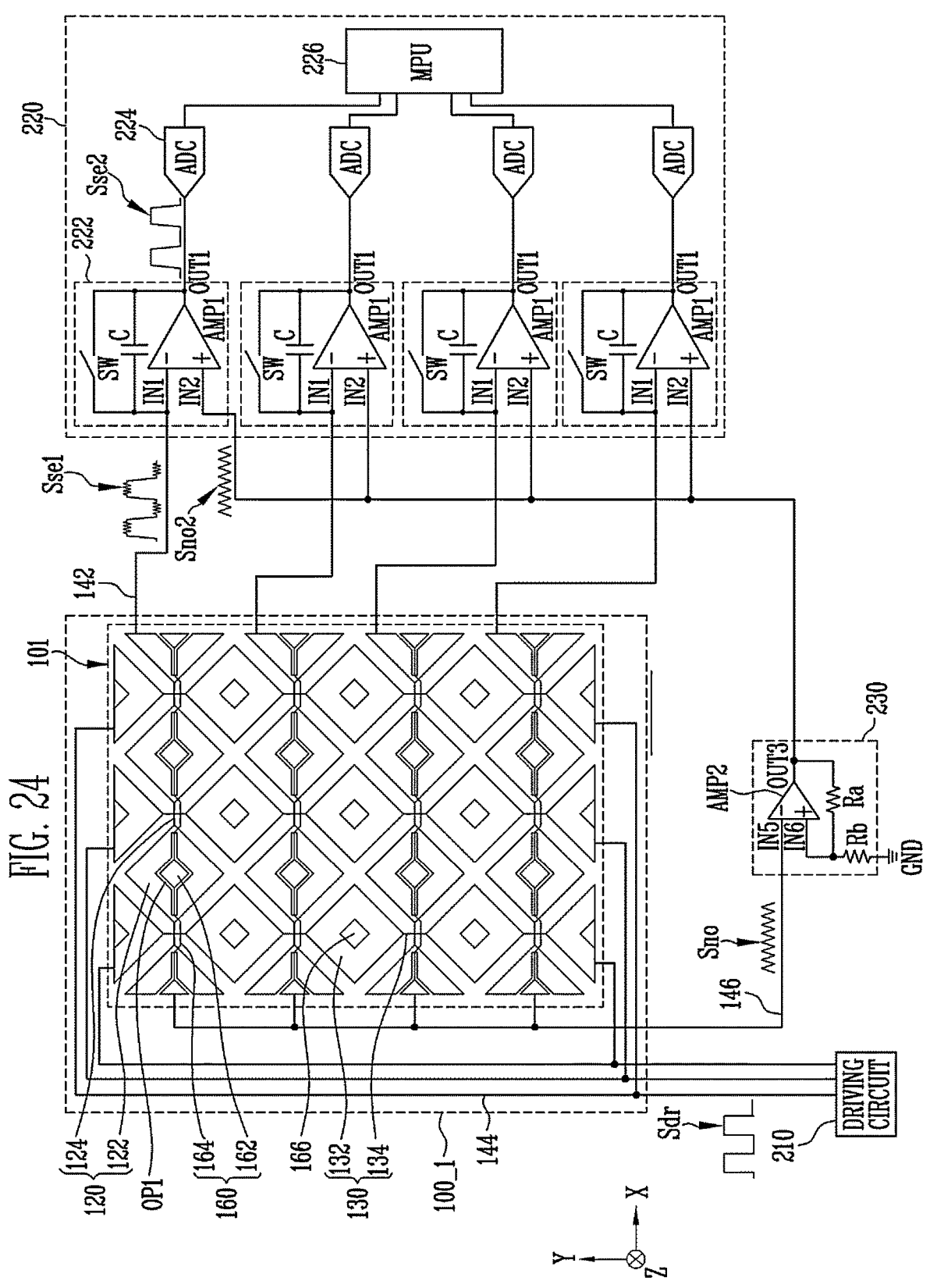
FIG. 24 illustrates a touch sensor according to some exemplary embodiments.

FIG. 24 illustrates a touch sensor according to some exemplary embodiments. In FIG. 24, configuration elements similar to or the same as those in FIG. 4 are denoted by the same or similar reference numerals or symbols, and detailed description thereof will be omitted.

Referring to FIG. 24, in the touch sensor, the plurality of noise detecting electrodes 160 share the third wire 146. For example, the third wire 146 may be connected in common to one end of each of the noise detecting electrodes 160 at one side of the active region 101. According to some embodiments, the noise detecting electrodes 160 may be connected in common to the second input terminals IN2 of the plurality of sensing channels 222 through the third wire 146. In this case, the noise detecting electrodes 160 may be integrated into one electrode, and thus, the noise detecting electrodes 160 may be regarded as an integrated electrode. Although FIG. 24 illustrates that all the noise detecting electrodes 160 provided in the active region 101 share the third wire 146, but embodiments are not limited thereto. For example, a part of the noise detecting electrodes 160 may share the third wire 146.

According to some embodiments, the noise detecting electrodes 160 provided in the active region 101 are connected in common to the same third wire 146 to be electrically connected to each other. Accordingly, the overall noise signals Sno may be detected at one time. According to some embodiments, the number of wires disposed inside the sensing unit 100_1 may be reduced. Therefore, the noise reduction structure of FIG. 24 may be applied to a narrow bezel type touch sensor.

In addition, the touch sensor of FIG. 24 may further include an amplification circuit 230 connected between the second input terminals IN2 of the sensing channels 222 and the noise detecting electrodes 160. According to some embodiments, the amplification circuit 230 may include at least a second amplifier AMP2. According to some embodiments, the second amplifier AMP2 may include a fifth input terminal IN5 connected in common to the noise detecting electrodes 160 through the third wire 146, and a sixth input terminal IN6 connected to an output terminal OUT3 through at least one resistor Ra. According to some embodiments, the fifth input terminal IN5 and the sixth input terminal IN6 may be an inverting input terminal and a non-inverting input terminal, respectively, but embodiments are not limited thereto. According to some embodiments, resistors Ra and Rb in FIG. 24 represent input and output impedances of the second amplifier AMP2, respectively.

The amplification circuit 230 may receive the noise signal Sno from the noise detecting electrodes 160 through the third wire 146, amplify the noise signal Sno to a magnitude corresponding to a gain value of the second amplifier AMP2, and output the amplified noise signal Sno2 to the sensing channels 222. At this time, a magnitude of the amplified noise signal Sno2 input to the sensing channels 222 may be easily adjusted by adjusting the gain value of the amplification circuit 230. Particularly, according to some embodiments, the gain value of the amplification circuit 230 may be adjusted such that noise components contained in the sensing signals Sse1 output from the sensing electrodes 120 can be effectively canceled in the sensing channels 222.

Figure 25:
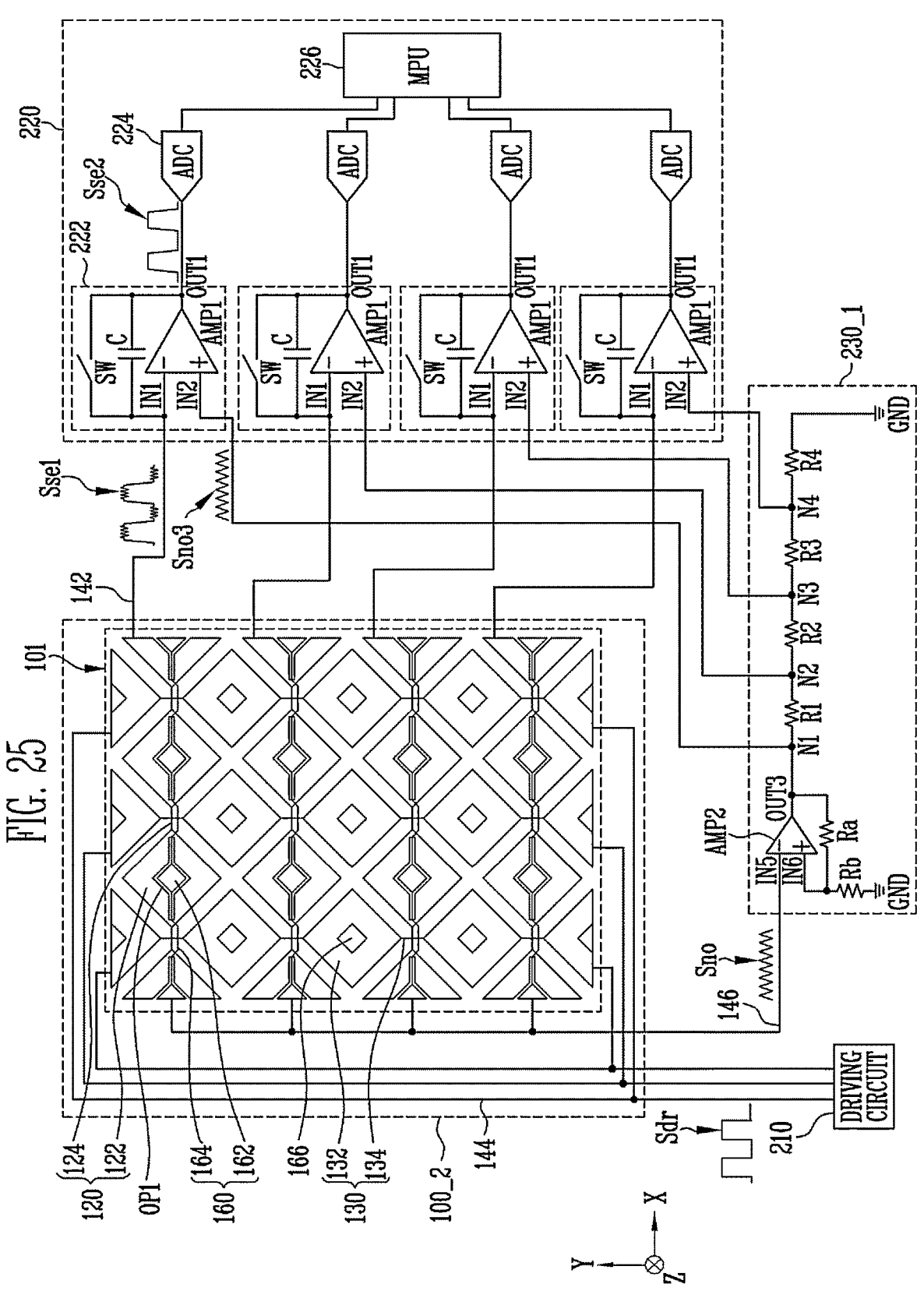
FIG. 25 illustrates a touch sensor according to some exemplary embodiments.

FIG. 25 illustrates a touch sensor according to some exemplary embodiments. In FIG. 25, configuration elements similar to or the same as those previously described, for example, in association with FIGS. 4 and 24, are denoted by the same or similar reference numerals or symbols, and detailed description thereof will be omitted.

Referring to FIG. 25, the amplification circuit 230_1 may further include a plurality of resistors R1, R2, R3, and R4 connected in series to each other between the output terminal OUT3 of the second amplifier AMP2 and a determined reference power supply (for example, GND). For example, the amplification circuit 230_1 may include a number of resistors (e.g., resistors R1, R2, R3, and R4) corresponding to the number of sensing channels 222.

According to some embodiments, the sensing channels 222 may be respectively connected to different nodes among nodes (for example, nodes N1, N2, N3, and N4) between the second amplifier AMP2 and the reference power supply GND. According to some embodiments, the resistors R1, R2, R3, and R4 may be variable resistors whose resistance values can be adjusted, but embodiments are not limited thereto. For example, in at least one other embodiment, each of the resistors R1, R2, R3, and R4 may also have a predetermined fixed resistance value.

According to some embodiments, gain values of the noise signals Sno3 input to the sensing channels 222 receiving the sensing signal Sse1 from each of the sensing electrodes 120 may be applied differently depending on positions of the sensing electrodes 120. For example, if magnitudes of the noise signals Sno input to the sensing unit 100_2 gradually decrease from the first row to the last row of the active region 101, the gain values of the noise signals Sno3 may gradually decrease from the first sensing channel 222 receiving the sensing signal Sse1 from the sensing electrode 120 in the first row to the last sensing channel 222 receiving the sensing signal Sse1 from the sensing electrode 120 in the last row.

According to some embodiments, after the noise signals Sno are measured depending on the position of the sensing unit 100_2, it is possible to individually adjust the gain values (or the amount of attenuation) of the noise signals Sno3 applied to each of the sensing channels 222 in correspondence with the magnitude of the measured noise signal Sno. In some embodiments, the noise signals Sno of the sensing unit 100_2 may be collectively detected by connecting the plurality of noise detecting electrodes 160 to the third wire 146, and the gain values of the noise signals Sno3 may be differentially adjusted for each of the sensing channels 222 using the amplification circuit 230_1. Therefore, it is possible to not only reduce the number of wires disposed in the sensing unit 100_2, but also effectively cancel the noise signals Sno in each of the sensing channels 222.

Figure 26:
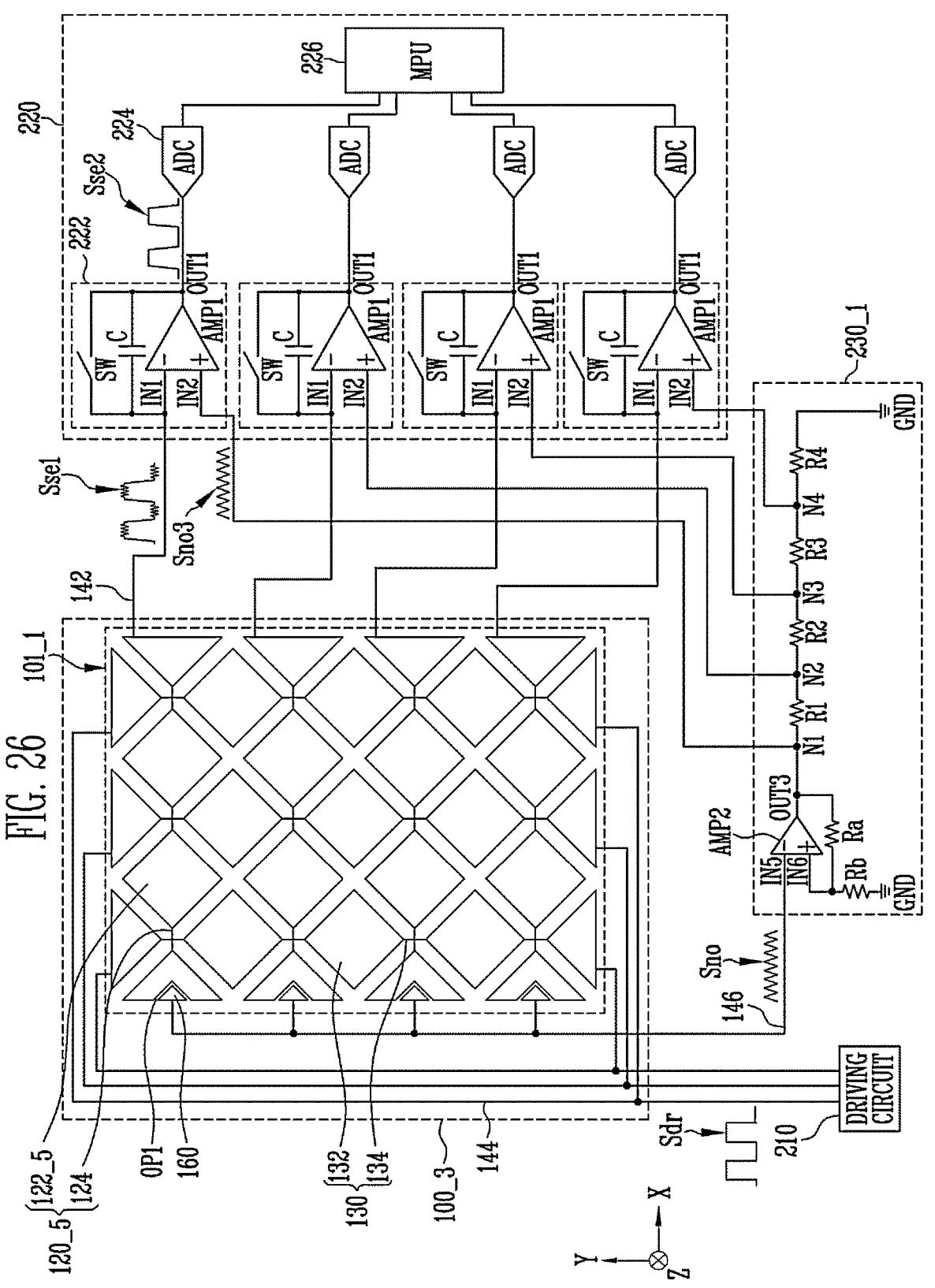
FIG. 26 illustrates a touch sensor according to some exemplary embodiments.

FIG. 26 illustrates a touch sensor according to some exemplary embodiments. In FIG. 26, configuration elements similar to or the same as those previously described, for example, in association with FIGS. 4, 24, and 25, are denoted by the same or similar reference numerals or symbols, and detailed description thereof will be omitted.

Referring to FIG. 26, the touch sensor may have the noise detecting electrodes 160 distributed only in (or on) one side edge region of the active region 101_1 of the sensing unit 100_3. For example, the noise detecting electrodes 160 may be disposed only inside the first electrode cells 122_5 and disposed in the left edges of the first electrode cells 122_5 configuring each of the sensing electrodes 120_5.

For example, only one first electrode cell 122_5 disposed in one end (for example, the left edge) of the first electrode cells 122_5 configuring each of the sensing electrodes 120_5 may include the first opening OP1. Each of the noise detecting electrodes 160 may be configured by one electrode portion disposed inside the first opening OP1 provided in one end of any one of the sensing electrodes 120_5. According to some embodiments, the noise detecting electrodes 160 provided in the sensing unit 100_3 may be formed as an integrated electrode by being connected in common to one third wire 146.

Accordingly, the noise detecting electrodes 160 are disposed only on one side edge region of the sensing unit 100_1, and thereby, it is possible to provide a touch sensor that is stronger against damages, such as cracking, due to bending, compared with a touch sensor in which the noise detecting electrodes 160 are disposed throughout the sensing unit, e.g., sensing unit 100. In addition, according to some embodiments, it is possible to minimize (or at least reduce) generation of parasitic capacitances caused by the noise detecting electrodes 160 and peripheral electrodes (for example, the sensing electrodes 120_5 and the driving electrodes 130), and to minimize (or at least reduce) the noise detecting electrodes 160 viewable to a user.

Figure 27:
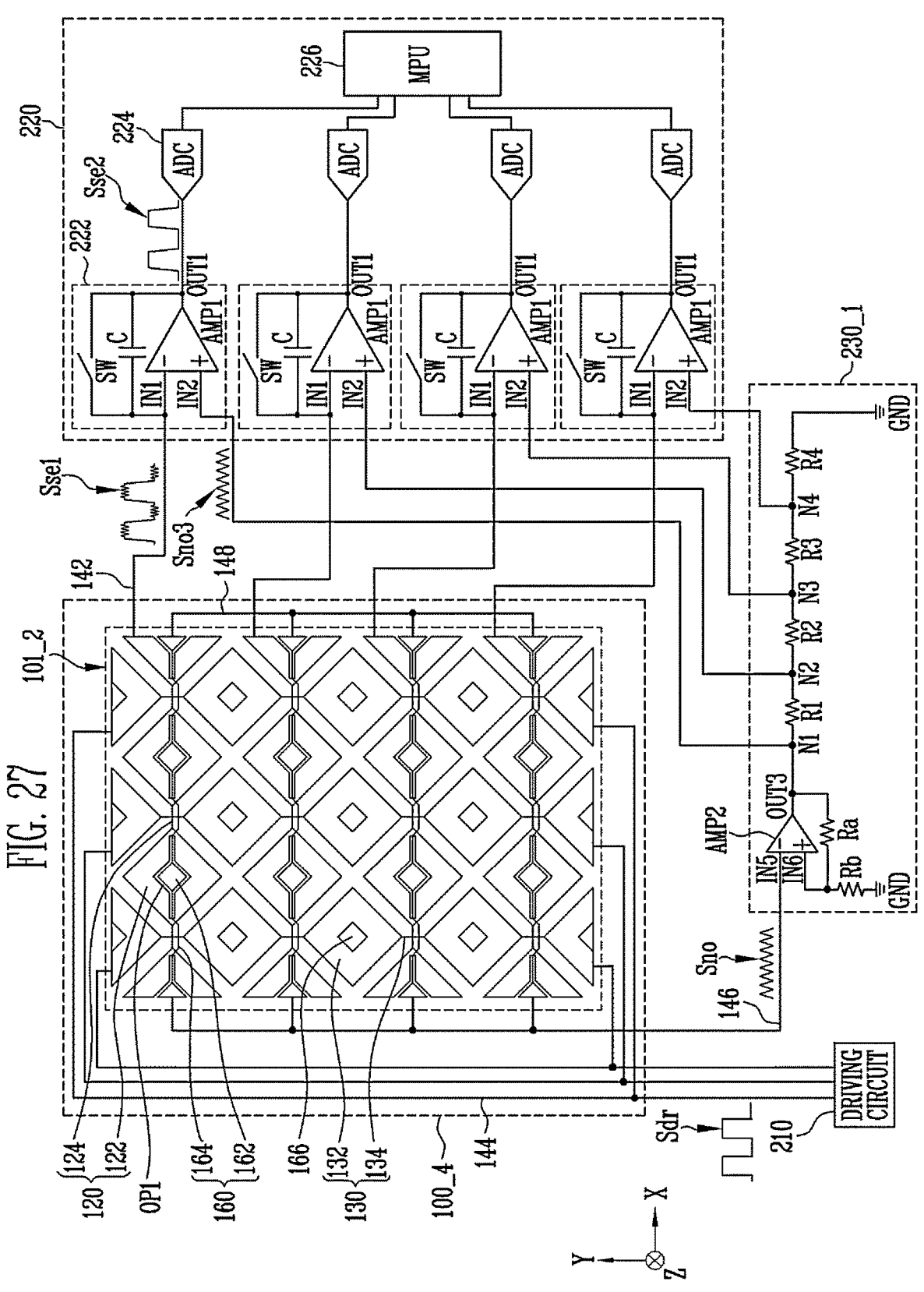
FIG. 27 illustrates a touch sensor according to some exemplary embodiments.

FIG. 27 illustrates a touch sensor according to some exemplary embodiments. In FIG. 27, configuration elements similar to or the same as those previously described, for example, in association with FIGS. 4 and 24 to 26 are denoted by the same or similar reference numerals or symbols, and detailed description thereof will be omitted.

Referring to FIG. 27, the touch sensor may further include the third wire 146 connected in common to one end of each of the noise detecting electrodes 160, and a fourth wire 148 connected in common to another end of each of the noise detecting electrodes 160. For example, the noise detecting electrodes 160 are connected in the first direction (for example, the X direction) through the connection lines 164 inside the active region 101_2 of the sensing unit 100_4, and are connected in the second direction (for example, the Y direction) through the third wire 146 and the fourth wire 148 outside the active region 101_2, thereby, being formed as an integrated electrode. Meanwhile, a wiring structure of the noise detecting electrodes 160 is not limited in particular, and may be variously modified.

Figure 28:
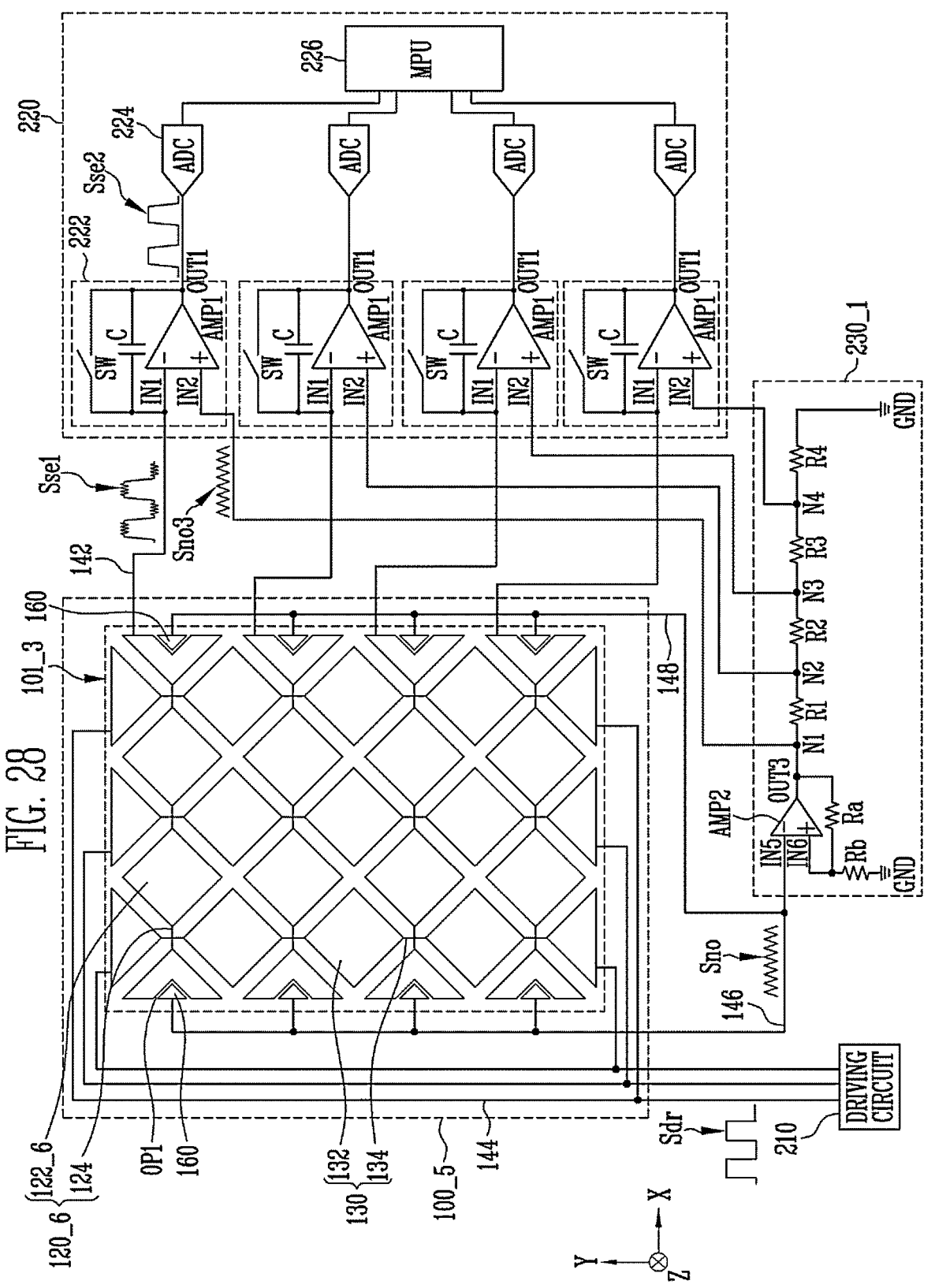
FIG. 28 illustrates a touch sensor according to some exemplary embodiments.

FIG. 28 illustrates a touch sensor according to some exemplary embodiments. In FIG. 28, configuration elements similar to or the same as those previously described, for example, in association with FIGS. 4 and 24 to 27, are denoted by the same or similar reference numerals or symbols, and detailed description thereof will be omitted.

Referring to FIG. 28, the touch sensor may have the noise detecting electrodes 160 distributed only in both side edge regions of the active region 101_3 of the sensing unit 100_5. For example, the noise detecting electrodes 160 may be disposed only in the insides of two first electrode cells 122_6, such as disposed in different ends of the first electrode cells 122_6 configuring each of the sensing electrodes 120_6.

For example, either or both of the first electrode cell 122_6 disposed in the left edge or the first electrode cell 122_6 disposed in the right edge, among the first electrode cells 122_6 configuring each of the sensing electrodes 120_6 may include the first opening OP1, and the other first electrode cells 122_6 may not be provided with the first openings OP1. Each of the noise detecting electrodes 160 may be configured by one electrode portion disposed inside the first opening OP1 provided in one end of any one of the sensing electrodes 120_6. In some embodiments, the noise detecting electrodes 160 provided in the sensing unit 100_5 may be electrically connected to each other through the third wire 146 and the fourth wire 148 to form an integrated electrode. In this case, the integrated electrode may be configured as a plurality of electrode portions disposed inside each of the first openings OP1 provided in both ends of each of the sensing electrodes 120_6. According to some embodiments, the third wire 146 and the fourth wire 148 may be connected in common to the fifth input terminal IN5 of the amplification circuit 230_1.

Accordingly, the noise detecting electrodes 160 are disposed only in a partial region of the active region 101_3, particularly, a partial edge region of the sensing unit 100_5, and thereby, it is possible to provide a touch sensor that is stronger against damages, such as cracking due to bending, compared with a touch sensor in which the noise detecting electrodes 160 are dispersedly disposed throughout the sensing unit, such as the sensing unit 100. In addition, by disposing the noise detecting electrodes 160 on both sides of the sensing unit 100_5, the noise signal Sno may be detected more effectively, compared with a touch sensor in which the noise detecting electrodes 160 are disposed in only one side of the sensing unit, such as the sensing unit 100_3. Additionally, it is possible to minimize (or at least reduce) generation of parasitic capacitances caused by the noise detecting electrodes 160 and peripheral electrodes (for example, the sensing electrodes 120_6 and the driving electrodes 130), and to minimize (or at least reduce) the noise detecting electrodes 160 viewable to a user.

Figure 29:
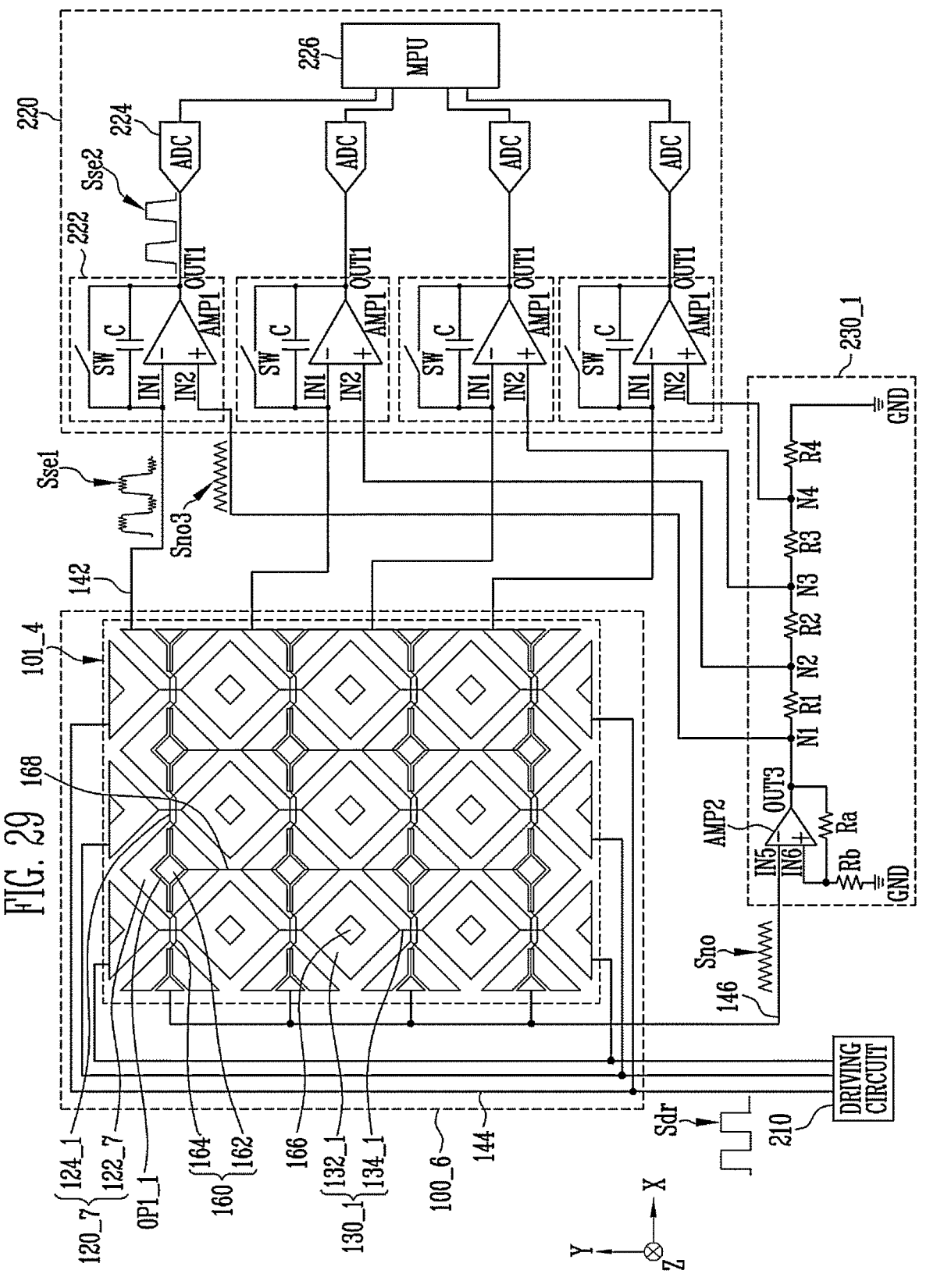
FIG. 29 illustrates a touch sensor according to some exemplary embodiments.

FIG. 29 illustrates a touch sensor according to some exemplary embodiments. In FIG. 29, configuration elements similar to or the same as those previously described, for example, in association with FIGS. 4 and 24 to 28, are denoted by the same or similar reference numerals or symbols, and detailed description thereof will be omitted.

Referring to FIG. 29, the touch sensor further includes cross-connection wires 168 connecting the noise detecting electrodes 160 to each other in the second direction (for example, the Y direction) inside the active region 101_4 of the sensing unit 100_6. For example, in the touch sensor, the noise detecting electrodes 160 are connected in the first direction (for example, the X direction) through the connection lines 164 inside the active region 101_4, and are connected in the second direction intersecting the first direction through at least one cross-connection wire 168. For example, the noise detecting electrodes 160 may be connected in a mesh shape inside the active region 101_4 to form an integrated single electrode. That is, a wiring structure of the noise detecting electrodes 160 is not limited in particular, and may be variously modified.

Figure 30:
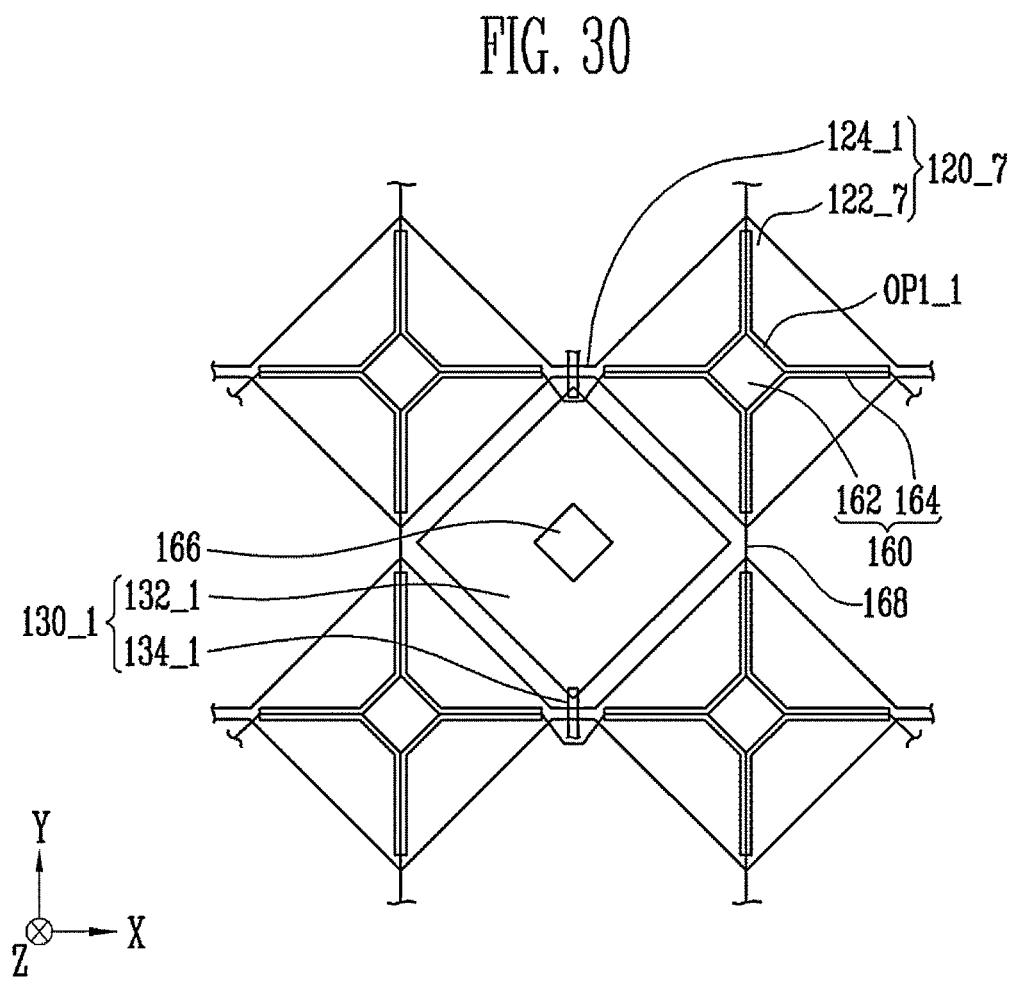

FIG. 30 illustrates an embodiment relating to the sensing unit illustrated in FIG. 29 according to some exemplary embodiments. In FIG. 30, configuration elements similar to or the same as those previously described are denoted by the same or similar reference numerals or symbols, and detailed description thereof will be omitted.

Referring to FIG. 30, each of the first openings OP1_1 may overlap any one of the electrode portions 162 configuring the noise detecting electrodes 160, and may further overlap one region of the connection line 164 and one region of the cross-connection wire 168 that are connected any one of the electrode portions 162. That is, in some embodiments, a partial region of the first electrode cell 122_7 of the sensing electrodes 120_7 may be additionally opened in correspondence with a region where the cross-connection wire 168 is disposed. For example, one region of each of the first electrode cells 122_7 may be opened in the first direction and the second direction around the electrode portion 162 corresponding thereto. In this case, each of the first openings OP1_1 may have a cross shape around the electrode portion 162.

Accordingly, it is possible to reduce or minimize overlapped regions between the sensing electrodes 120_7, the noise detecting electrodes 160 and/or the cross-connection wires 168. Accordingly, it is possible to reduce or minimize parasitic capacitances that can be generated in the sensing unit 100_6.

Figure 31:
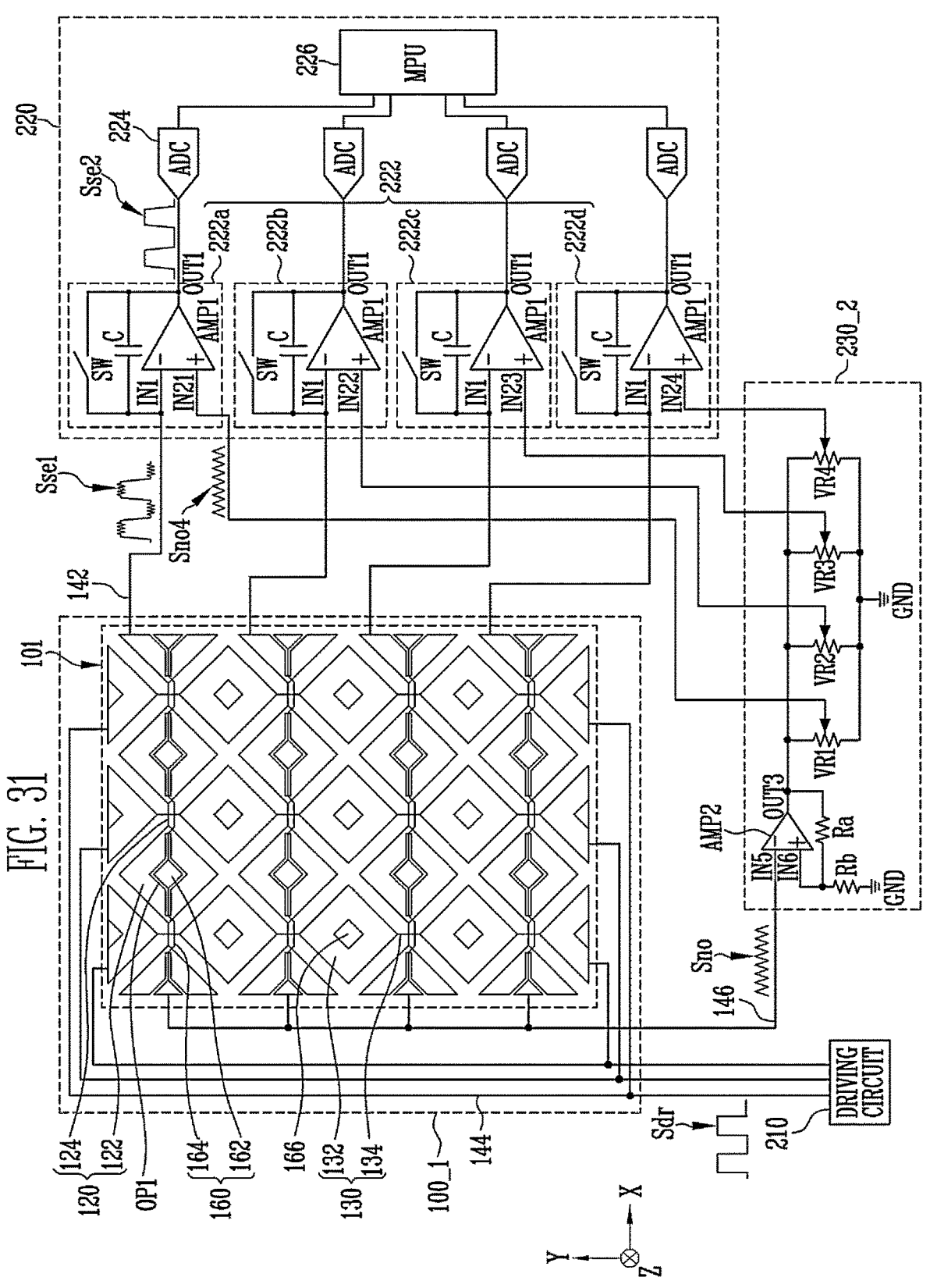
FIG. 31 illustrates a touch sensor according to some exemplary embodiments.

FIG. 31 illustrates a touch sensor according to some exemplary embodiments. In FIG. 31, configuration elements similar to or the same as those previously described, for example, in association with FIG. 24, are denoted by the same or similar reference numerals or symbols, and detailed description thereof will be omitted.

Referring to FIG. 31, the sensing unit 100_1 may have a structure in which at least one of the previously described embodiments is applied, such as the structure described in association with FIG. 24. However, embodiments of the structure of the sensing unit 100_1 of FIG. 31 are not limited thereto. For example, the structure of the sensing unit 100_1 may variously change within a range in which the sensing unit 100_1 includes the sensing electrodes 120 and at least one noise detecting electrode 160 corresponding thereto. For example, in at least one other embodiment, the sensing electrode 120 may overlap the electrode portion 162 of the noise detecting electrode 160, and may not include the first opening OP1 corresponding to the noise detecting electrode 160.

In some embodiments, the amplification circuit 230_2 may further include a plurality of variable resistors VR1, VR2, VR3, and VR4 connected in parallel between the output 1540 terminal OUT3 of the second amplifier AMP2 and a predetermined reference power supply (for example, GND). For example, the amplification circuit 230_2 may include a number of variable resistors VR1, VR2, VR3, and VR4 corresponding to the number of sensing channels 222.

According to some embodiments, the sensing channels 222 may be connected to different variable resistors of the variable resistors VR1, VR2, VR3, and VR4 provided in the amplification circuit 230_2. For example, a second input terminal IN21 of a first sensing channel 222a may be connected to the first variable resistor VR1, and a second input terminal IN22 of a second sensing channel 222b may be connected to the second variable resistor VR2. In addition, a second input terminal IN23 of a third sensing channel 222c may be connected to the third variable resistor VR3, and a second input terminal IN24 of a fourth sensing channel 222d may be connected to the fourth variable resistor VR4.

Accordingly, it is possible to independently adjust a gain value of the noise signal Sno4 input to the second input terminal (e.g., one of the second input terminals IN21 to IN24) of one corresponding sensing channel (e.g., one of sensing channels 222a to 222d) depending on a magnitude of the noise components contained in the sensing signals Sse1 input to each of the sensing channels (e.g., one of the sensing channels 222a to 222d). For example, it is possible to differentially apply the gain values of the noise signals Sno4 input to the sensing channels 222a through 222d connected to each of the sensing electrodes 120 depending on positions of the sensing electrodes 120. For example, if magnitudes of the noise signals Sno detected via the sensing unit 100_1 gradually decreases from the first row to the last row of the active region 101, the gain values of the noise signals Sno4 may be gradually reduced from the first sensing channel 222a connected to the sensing electrode 120 of the first row to the last sensing channel 222d connected to the sensing electrode 120 of the last row. Accordingly, it is possible to independently adjust the gain values so as to more effectively cancel the noise components contained in the sensing signals Sse1 depending on a vertical position (for example, Y coordinate) of the sensing electrodes 120 in the sensing unit 100_1.

In addition, according to some embodiments, during a period in which the driving electrodes 130 are sequentially driven, resistance values of the variable resistors VR1, VR2, VR3, and VR4 may be adjusted by unit of a sub-period in which each driving electrode 130 is driven, and thereby, the gain values of the noise signal Sno4 may be independently adjusted by unit of a sub-period. Accordingly, it is also possible to compensate for magnitude deviation of noise that may occur by a lateral position (for example, X coordinate) of the sensing unit 100_1. For example, it is also possible to compensate for the magnitude deviation of noise due to a lateral deviation of impedance of a common electrode or a cathode electrode of the display panel 300. Therefore, according to some embodiments, it is possible to cancel more accurately and effectively the noise components contained in the sensing signals Sse1.

Figure 32:
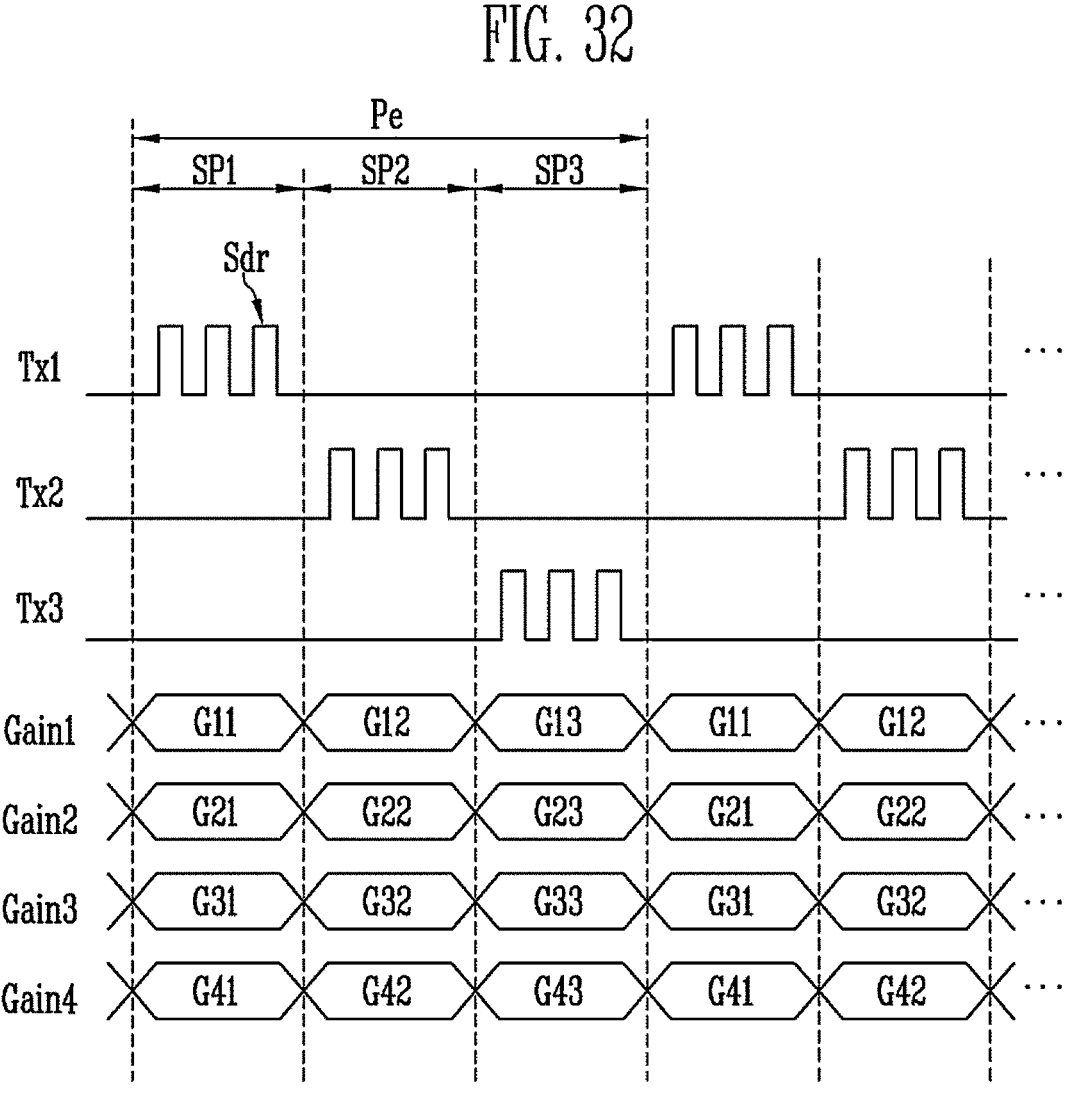
FIG. 32 illustrates an embodiment relating to a method of adjusting a gain value of a noise signal using the touch sensor illustrated in FIG. 31 according to some exemplary embodiments.

FIG. 32 illustrates an embodiment relating to a method of adjusting the gain value of the noise signal using the touch sensor illustrated in FIG. 31 according to some exemplary embodiments.

Referring to FIG. 32, resistance values of the variable resistors VR1, VR2, VR3, and VR4 may be adjusted by a unit of the sub-periods SP1, SP2, and SP3 in which each of the driving electrodes 130 is driven during a period Pe in which the driving electrodes 130 are sequentially driven. In this manner, the gain values of the noise signals Sno4 input to the second input terminals IN21 to IN24 of the sensing channels 222a to 222d may be independently adjusted for each of the sub-periods SP1, SP2, and SP3. For the sake of convenience, a method of adjusting the gain value of the noise signal Sno4, according some embodiments, will be hereinafter described on the assumption that three driving electrodes 130 are provided in the sensing unit 100_1 of FIG. 31.

First, the driving signal Sdr may be supplied to the first driving electrode 130 (hereinafter, referred to as a "Tx1 electrode") disposed in the first column of the sensing unit 100_1 during the first sub-period SP1. During the first sub-period SP1, a first gain value Gain1 according to the first variable resistor VR1 may be set to an 11th gain G11, a second gain value Gain2 according to the second variable resistor VR2 may be set to an 21st gain G21, a third gain value Gain3 according to the third variable resistor VR3 may be set to 31st gain G31, and a fourth gain value Gain4 according to the fourth variable resistor VR4 may be set to the 41st gain G41. Then, during the first sub-period SP1, the noise signal Sno4 amplified to an extent corresponding to the 11th gain G11 is input to the second input terminal IN21 of the first sensing channel 222a, and the noise signal Sno4 amplified to an extent corresponding to the 21st gain G21 is input to the second input terminal IN22 of the second sensing channel 222b. In addition, during the first sub-period SP1, the noise signal Sno4 amplified to an extent corresponding to the 31st gain G31 is input to the second input terminal IN23 of the third sensing channel 222c, and the noise signal Sno4 amplified to an extent corresponding to the 41st gain G41 is input to the second input terminal IN24 of the fourth sensing channel 222d. As such, the 11th to 41st gains G11 to G41 are set to values by which noise components contained in the sensing signals Sse1 can be effectively cancelled in the respective sensing channels 222a to 222d during the first sub-period SP1.

Next, during the second sub-period SP2 subsequent to the first sub-period SP1, the driving signal Sdr may be supplied to the second driving electrode 130 (hereinafter, referred to as a "Tx2 electrode") disposed in a second column of the sensing unit 100_1. During the second sub-period SP2, the first gain value Gain1 according to the first variable resistor VR1 may be set to a 12th gain G12, the second gain value Gain2 according to the second variable resistor VR2 may be set to a 22nd gain G22, the third gain value Gain3 according to the third variable resistor VR3 may be set to a 32nd gain G32, and the fourth gain value Gain4 according to the fourth variable resistor VR4 may be set to a 42nd gain G42. Then, during the second sub-period SP2, the noise signal Sno4 amplified to an extent corresponding to the 12th gain G12 is input to the second input terminal IN21 of the first sensing channel 222a, and the noise signal Sno4 amplified to an extent corresponding to the 22nd gain G22 is input to the second input terminal IN22 of the second sensing channel 222b. In addition, during the second sub-period SP2, the noise signal Sno4 amplified to an extent corresponding to the 32nd gain G32 is input to the second input terminal IN23 of the third sensing channel 222c, and the noise signal Sno4 amplified to an extent corresponding to the 42nd gain G42 is input to the second input terminal IN24 of the fourth sensing channel 222d. As such, the 12th to 42nd gains G12 to G42 may be set to values by which noise components contained in the sensing signals Sse1 can be effectively canceled in the respective sensing channels 222a to 222d during the second sub-period SP2.

Next, during the third sub-period SP3 subsequent to the second sub-period SP2, the driving signal Sdr may be supplied to the third driving electrode 130 (hereinafter, referred to as a "Tx3 electrode") disposed in a third column of the sensing unit 100_1. During the third sub-period SP3, the first gain value Gain1 according to the first variable resistor VR1 may be set to a 13th gain G13, the second gain value Gain2 according to the second variable resistor VR2 may be set to a 23rd gain G23, the third gain value Gain3 according to the third variable resistor VR3 may be set to a 33rd gain G33, and the fourth gain value Gain4 according to the fourth variable resistor VR4 may be set to a 43rd gain G43. Then, during the third sub-period SP3, the noise signal Sno4 amplified to an extent corresponding to the 13th gain G13 is input to the second input terminal IN21 of the first sensing channel 222a, and the noise signal Sno4 amplified to an extent corresponding to the 23rd gain G23 is input to the second input terminal IN22 of the second sensing channel 222b. In addition, during the third sub-period SP3, the noise signal Sno4 amplified to an extent corresponding to the 33rd gain G33 is input to the second input terminal IN23 of the third sensing channel 222c, and the noise signal Sno4 amplified to an extent corresponding to the 43rd gain G43 is input to the second input terminal IN24 of the fourth sensing channel 222d. As such, the 13th to the 43rd gains G13 to G43 may be set to values by which noise components contained in the sensing signals Sse1 can be effectively canceled in the respective sensing channels 222a to 222d during the third sub-period SP3.

According to some embodiments, it is possible to drive Tx1 to Tx3 electrodes repeatedly and sequentially in the aforementioned manner. According to some embodiments, the gain values of the noise signals Sno4 may be differentially applied depending on each position (for example, two-dimensional XY coordinates) of the sensing unit 100_1. Accordingly, noise components contained in the sensing signals Sse1 may be more effectively canceled.

Figure 33:
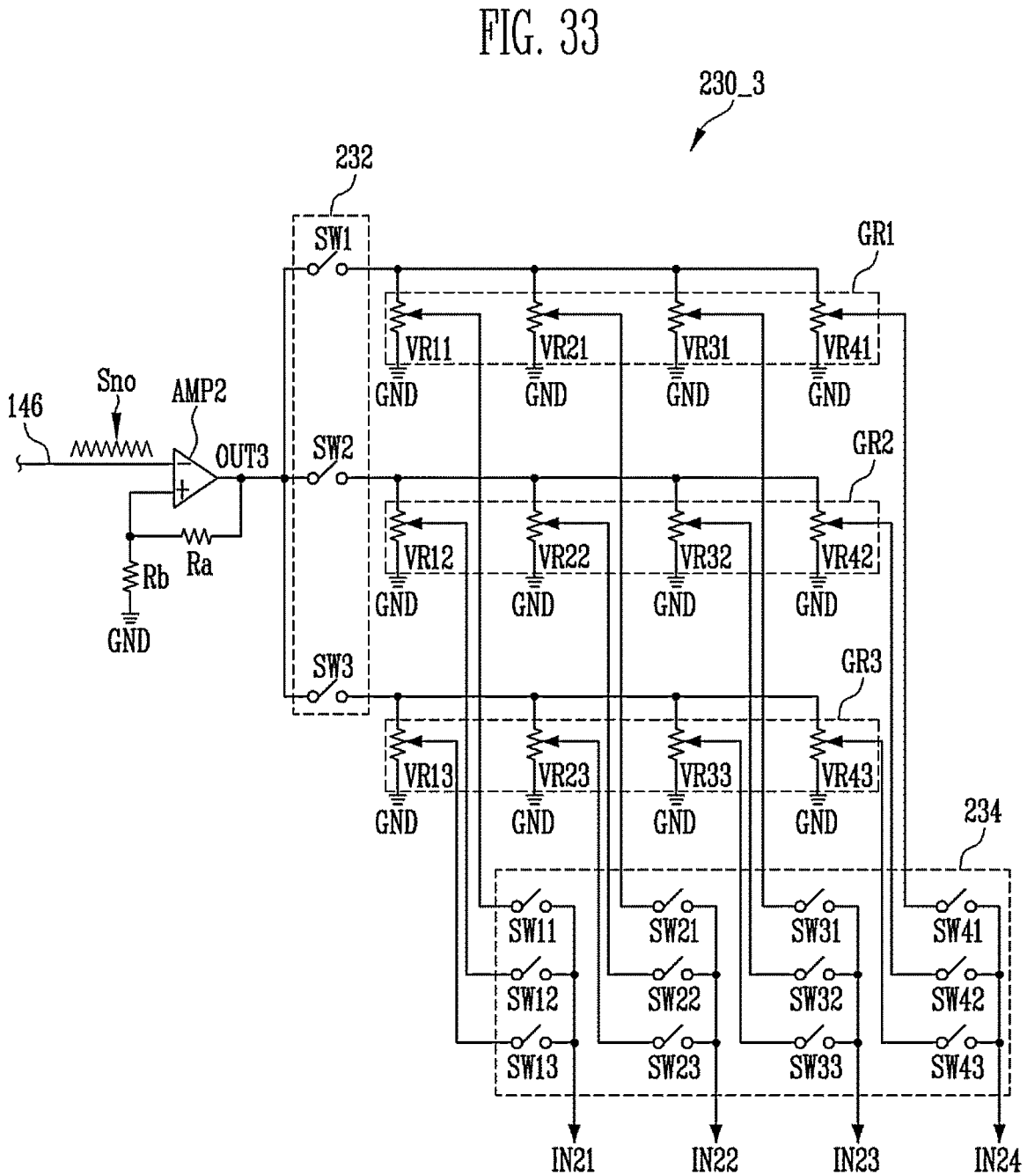
FIG. 33 illustrates an embodiment of the amplification circuit illustrated in FIG. 31 according to some exemplary embodiments.

FIG. 33 illustrates an embodiment of the amplification circuit illustrated in FIG. 31 according to some exemplary embodiments. In FIG. 33, configuration elements similar to or the same as those of the amplification circuit of FIG. 31 are denoted by the same or similar reference numerals or symbols, and detailed description thereof will be omitted.

Referring to FIG. 33, the amplification circuit 230_3 includes the second amplifier AMP2 connected to the noise detecting electrodes 160 through the third wire 146, a plurality of resistor groups GR1, GR2, and GR3 connected in parallel to the output terminal OUT3 of the second amplifier AMP2, and a first switching unit 232 connected between the second amplifier AMP2 and the resistor groups GR1, GR2, and GR3.

According to some embodiments, the first switching unit 232 includes a plurality of switches SW1, SW2, and SW3 connected between the output terminal OUT3 of the second amplifier AMP2 and the respective resistor groups GR1, GR2, and GR3. For example, the first switching unit 232 may include the first switch SW1 connected between the output terminal OUT3 of the second amplifier AMP2 and the first resistor group GR1, a second switch SW2 connected between the output terminal OUT3 of the second amplifier AMP2 and the second resistor group GR2, and the third switch SW3 connected between the output terminal OUT3 of the second amplifier AMP2 and the third resistor group GR3.

According to some embodiments, each of the resistor groups GR1, GR2, and GR3 may include a plurality of resistors VR11, VR21, VR31, VR41, VR12, VR22, VR32, VR42, VR13, VR23, VR33, and VR43 (hereinafter, collectively referred to as "VR11 to VR43") connected to different sensing channels among the sensing channels 222a to 222d and connected in parallel with each other. For example, the first resistor group GR1 may include the 11th resistor VR11 connected to the second input terminal IN21 of the first sensing channel 222a, the 21st resistor VR21 connected to the second input terminal IN22 of the second sensing channel 222b, the 31st resistor VR31 connected to the second input terminal IN23 of the third sensing channel 222c, and the 41st resistor VR41 connected to the second input terminal IN24 of the fourth sensing channel 222d. The second resistor group GR2 may include the 12th resistor VR12 connected to the second input terminal IN21 of the first sensing channel 222a, the 22nd resistor VR22 connected to the second input terminal IN22 of the second sensing channel 222b, the 32ndt resistor VR32 connected to the second input terminal IN23 of the third sensing channel 222c, and the 42nd resistor VR42 connected to the second input terminal IN24 of the fourth sensing channel 222d. The third resistor group GR3 may include the 13th resistor VR13 connected to the second input terminal IN21 of the first sensing channel 222a, the 23rd resistor VR23 connected to the second input terminal IN22 of the second sensing channel 222b, the 33rd resistor VR33 connected to the second input terminal IN23 of the third sensing channel 222c, and the 43rd resistor VR43 connected to the second input terminal IN24 of the fourth sensing channel 222d.

According to some embodiments, each of the resistors VR11 to VR43 included in the resistor groups GR1, GR2, and GR3 may be configured as variable resistors, but embodiments are not limited thereto. For example, in at least one other embodiment, the resistors VR11 to VR43 may have fixed resistance values.

In addition, according to some embodiments, the amplification circuit 230_3 further includes a second switching unit 234 connected between each of the sensing channels 222a to 222d and the resistor groups GR1, GR2, and GR3. According to some embodiments, the second switching unit 234 includes an 11th switch SW11 connected between the second input terminal IN21 of the first sensing channel 222a and the 11th resistor VR11, a 12th switch SW12 connected between the second input terminal IN21 of the first sensing channel 222a and the 12th resistor VR12, a 13th switch SW13 connected between the second input terminal IN21 of the first sensing channel 222a and the 13th resistor VR13, a 21st switch SW21 connected between the second input terminal IN22 of the second sensing channel 222b and the 21st resistor VR21, a 22nd switch SW22 connected between the second input terminal IN22 of the second sensing channel 222b and the 22nd resistor VR22, and a 23rd switch SW23 connected between the second input terminal IN22 of the second sensing channel 222b and the 23rd resistor VR23. In addition, the second switch unit 234 includes a 31st switch SW31 connected between the second input terminal IN23 of the third sensing channel 222c and the 31st resistor VR31, a 32nd switch SW32 connected between the second input terminal IN23 of the third sensing channel 222c and the 32nd resistor VR32, a 33rd switch SW33 connected between the second input terminal IN23 of the third sensing channel 222c and the 33rd resistor VR33, a 41st switch SW41 connected between the second input terminal IN24 of the fourth sensing channel 222d and the 41st resistor VR41, a 42nd switch SW42 connected between the second input terminal IN24 of the fourth sensing channel 222d and the 42nd resistor VR42, and a 43rd switch SW43 connected between the second input terminal IN24 of the fourth sensing channel 222d and the 43rd resistor VR43.

Accordingly, the gain value of the noise signal Sno may be independently set depending on each position (for example, two-dimensional XY coordinates) of the sensing unit 100_1. In this manner, noise components contained in the sensing signals Sse1 may be more effectively canceled.

Figure 34:
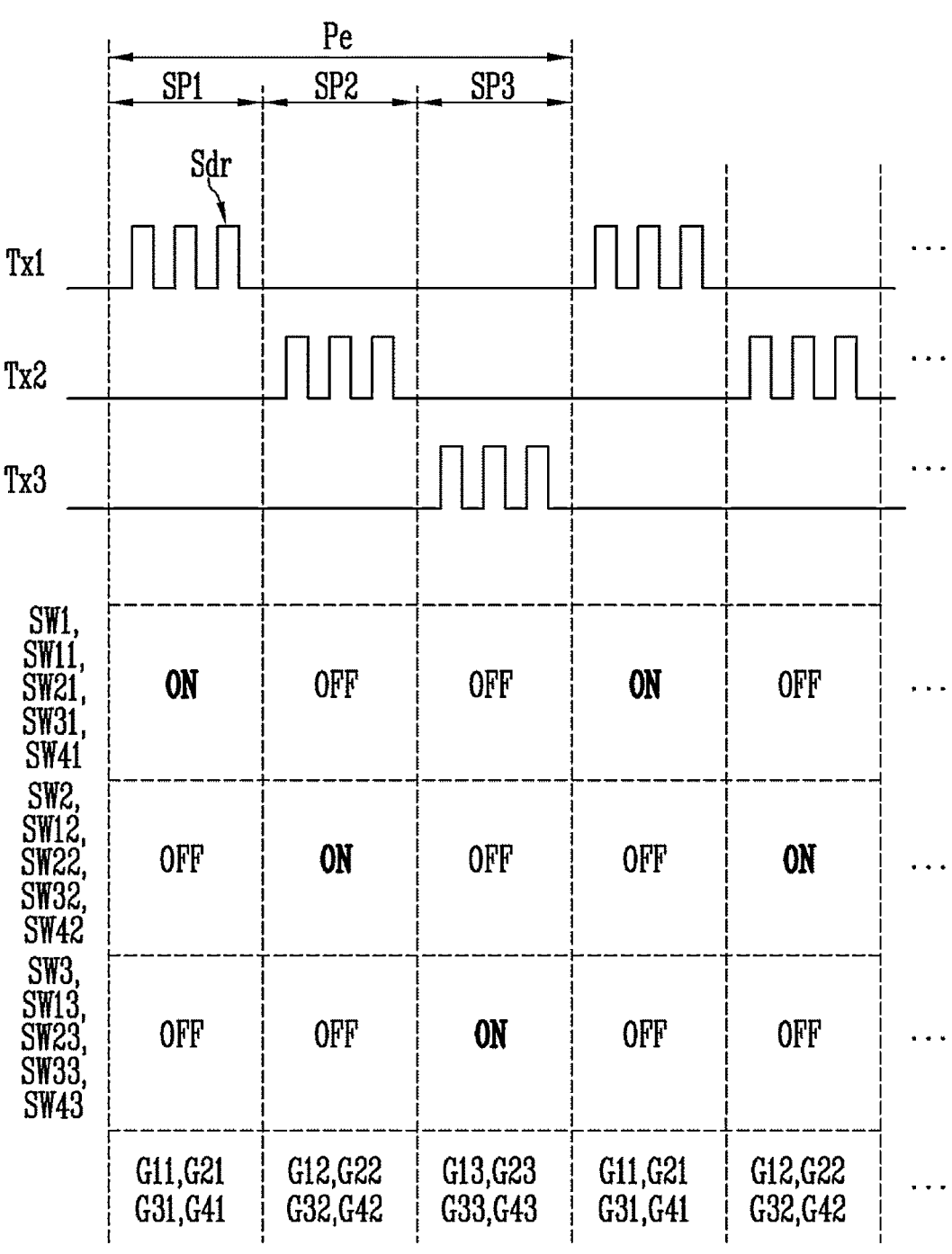
FIG. 34 illustrates an embodiment relating to a method of adjusting the gain value of the noise signal using an amplification circuit illustrated in FIG. 33 according to some exemplary embodiments.

FIG. 34 illustrates an embodiment relating to a method of adjusting the gain values of the noise signals using the amplification circuit illustrated in FIG. 33 according to some exemplary embodiments. For illustrative and descriptive convenience, the method will be described in association with the configuration of the sensing unit 100_1 of FIG. 31.

Referring to FIG. 34, the driving signal Sdr may be supplied to the Tx1 electrode disposed in the first column of the sensing unit 100_1 during the first sub-period SP1. During the first sub-period SP1, the first switch SW1 connected to the first resistor group GR1 among the switches SW1 to SW3 provided in the first switching unit 232 is turned on. In addition, during the first sub-period SP1, the 11th switch SW11, the 21st switch SW21, the 31st switch SW31, and the 41st switch SW41 that are connected to the first resistor group GR1 among the switches SW11 to SW43 provided in the second switching unit 234 are turned on.

Accordingly, the sensing channels 222a to 222d receive the noise signals Sno4 through the first resistor group GR1.

During the first sub-period SP1, the second input terminal IN21 of the first sensing channel 222a receives the noise signal Sno4 amplified to an extent corresponding to the 11th gain G11 according to the 11th resistor VR11, and the second input terminal IN22 of the second sensing channel 222b receives the noise signal Sno4 amplified to an extent corresponding to the 21st gain G21 according to the 21st resistor VR21. In addition, during the first sub-period SP1, the second input terminal IN23 of the third sensing channel 222c receives the noise signal Sno4 amplified to an extent corresponding to the 31st gain G31 according to the 31st resistor VR31, and the second input terminal IN24 of the fourth sensing channel 222d receives the noise signal Sno4 amplified to an extent corresponding to the 41st gain G41 according to the 41st resistor VR41. At this time, the 11th to 41st gains G11 to G41 may be set to values by which noise components contained in the sensing signals Sse1 can be effectively canceled in the respective sensing channels 222a to 222d during the first sub-period SP1.

Next, during the second sub-period SP2 subsequent to the first sub-period SP1, the driving signal Sdr may be supplied to the Tx2 electrode disposed in the second column of the sensing unit 100_1. During the second sub-period SP2, the second switch SW2 connected to the second resistor group GR2 among the switches SW1 to SW3 provided in the first switching unit 232 is turned on. In addition, during the second sub-period SP2, the 12th switch SW12, the 22nd switch SW22, the 32nd switch SW32, and the 42nd switch SW42 that are connected to the second resistor group GR2 among the switches SW11 to SW43 provided in the second switching unit 234 are turned on. Accordingly, the sensing channels 222a to 222d receive the noise signals Sno4 through the second resistor group GR2.

During the second sub-period SP2, the noise signal Sno4 amplified to an extent corresponding to the 12th gain G12 according to the 12th resistor VR12 is input to the second input terminal IN21 of the first sensing channel 222a, and the noise signal Sno4 amplified to an extent corresponding to the 22nd gain G22 according to the 22nd resistor VR22 is input to the second input terminal IN22 of the second sensing channel 222b. In addition, during the second sub-period SP2, the noise signal Sno4 amplified to an extent corresponding to the 32nd gain G32 according to the 32nd resistor VR32 is input to the second input terminal IN23 of the third sensing channel 222c, and the noise signal Sno4 amplified to an extent corresponding to the 42nd gain G42 according to the 42nd resistor VR42 is input to the second input terminal IN24 of the fourth sensing channel 222d. As such, the 12th to 42nd gains G12 to G42 may be set to values by which noise components contained in the sensing signals Sse1 can be effectively canceled in the respective sensing channels 222a to 222d during the second sub-period SP2.

Next, the driving signal Sdr may be supplied to the Tx3 electrode disposed in the third column of the sensing unit 100 during the third sub-period SP3 subsequent to the second sub-period SP2. During the third sub-period SP3, the third switch SW3 connected to the third resistor group GR3 among the switches SW1 to SW3 provided in the first switching unit 232 is turned on. In addition, during the third sub-period SP3, the 13th switch SW13, the 23rd switch SW23, the 33rd switch SW33, and the 43rd switch SW43 that are connected to the third resistor group GR3 among the switches SW11 through SW43 provided in the second switching unit 234 are turned on. Accordingly, the sensing channels 222a to 222d receive the noise signals Sno4 through the third resistor group GR3.

During the third sub-period SP3, the noise signal Sno4 amplified to an extent corresponding to the 13th gain G13 according to the 13th resistor VR13 is input to the second input terminal IN21 of the first sensing channel 222a, and the noise signal Sno4 amplified to an extent corresponding to the 23rd gain G23 according to the 23rd resistor VR23 is input to the second input terminal IN22 of the second sensing channel 222b. In addition, during the third sub-period SP3, the noise signal Sno4 amplified to an extent corresponding to the 33rd gain G33 according to the 33rd resistor VR33 is input to the second input terminal IN23 of the third sensing channel 222c, and the noise signal Sno4 amplified to an extent corresponding to the 43rd gain G43 according to the 43rd resistor VR43 is input to the second input terminal IN24 of the fourth sensing channel 222d. As such, the 13th to 43rd gains G13 to G43 may be set to values by which noise components contained in the sensing signals Sse1 can be effectively canceled in the respective sensing channels 222a to 222d during the third sub period SP3.

The noise signals Sno4 may be supplied to each of the sensing channels 222a to 222d while the Tx1 to Tx3 electrodes are driven repeatedly and sequentially in the manner described above. According to some embodiments, the gain values of the noise signals Sno4 are independently set depending on each position (for example, two-dimensional XY coordinates) of the sensing unit 100_1, and thereby, noise components contained in the sensing signals SSe1 may be more effectively canceled.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A touch sensor comprising:
   a first electrode comprising first electrode portions arranged in a first direction, each of the first electrode portions having a mesh shape including first openings;
   a second electrode comprising second electrode portions arranged in the first direction, each of the second electrode portions having a mesh shape including second openings; and
   a third electrode comprising third electrode portions arranged in a second direction crossing the first direction, each of the third electrode portions having a mesh shape including third openings,
   wherein adjacent ones of the second electrode portions are connected to each other through the first openings, and
   wherein ones of the first electrode portions surround corresponding ones of the second electrode portions in a closed-loop shape in a plan view.

2. The touch sensor of claim 1,
   wherein the first electrode portions and the third electrode portions are disposed in a first layer,
   wherein the second electrode further comprises bridge portions in the first openings of the first layer, and
   wherein each of the bridge portions connects the adjacent ones of the second electrode portions.

3. The touch sensor of claim 2,
   wherein each of the bridge portions has a shape extended in the first direction, and
   wherein each of the first openings in a first group has a corresponding shape extended in the first direction.

4. The touch sensor of claim 3, wherein each of the first openings in the first group has an area larger than an area of each of other first openings of the mesh shape of the first electrode portions.

5. The touch sensor according to claim 1, further comprising:

a driving circuit configured to supply a driving signal to the third electrode.

6. The touch sensor according to claim 1, further comprising:

fourth electrode portions disposed in the third openings and separated from the third electrode.

7. The touch sensor according to claim 1, further comprising:

a plurality of first electrodes comprising the first electrode;

a plurality of second electrodes comprising the second electrode;

a plurality of sensing channels; and a processor:

configured to receive output signals of the plurality of sensing channels; and configured to detect a touch input on a basis of the output signals, wherein:

a first terminal of each of the plurality of sensing channels is connected to a different first electrode from among the plurality of first electrodes;

a second terminal of each of the plurality of sensing channels is connected to at least one second electrode from among the plurality of second electrodes; and each of the plurality of sensing channels is configured to generate an output signal corresponding to a voltage difference between the first terminal and the second terminal.

8. The touch sensor according to claim 7, wherein the plurality of second electrodes are electrically connected to each other.

9. The touch sensor according to claim 8, further comprising:

at least one wire commonly connected to one end of each of the plurality of second electrodes.

10. The touch sensor according to claim 9, further comprising:

at least one another wire commonly connected to another end of each of the plurality of second electrodes.

11. The touch sensor according to claim 7, further comprising:

at least one cross-connection wire extending in the second direction, the cross-connection wire crossing the plurality of second electrodes and connecting the plurality of second electrodes to each other.

12. The touch sensor according to claim 7, further comprising:

an amplification circuit connected between the plurality of second electrodes and second terminals of the plurality of sensing channels, wherein the amplification circuit comprises an amplifier commonly connected to the plurality of second electrodes.

13. The touch sensor according to claim 12, wherein:

the amplification circuit further comprises a plurality of resistors connected in series to each other between an output terminal of the amplifier and a reference power supply; and the plurality of sensing channels are connected to different nodes from among nodes between the output terminal of the amplifier and the reference power supply.

14. The touch sensor according to claim 12, wherein:

the amplification circuit further comprises a plurality of variable resistors connected in parallel to an output terminal of the amplifier; and the plurality of sensing channels are connected to different variable resistors from among the plurality of variable resistors.

15. The touch sensor according to claim 12, wherein the amplification circuit further comprises:

a plurality of resistor groups connected in parallel to an output terminal of the amplifier; and a first switching unit comprising a plurality of switches connected between the output terminal of the amplifier and each of the plurality of resistor groups.

16. The touch sensor according to claim 15, wherein:

each of the plurality of resistor groups comprises a plurality of resistors connected to different sensing channels from among the plurality of sensing channels; and the plurality of resistors are connected in parallel with each other.

17. The touch sensor according to claim 16, wherein the amplification circuit further comprises a second switching unit, the second switching unit comprising a plurality of switches connected between each of the plurality of sensing channels and the plurality of resistor groups.

\*    \*    \*    \*    \*